(12) United States Patent
 Miyairi et al.

(10) Patent No.: US 8,703,560 B2
(45) Date of Patent: Apr. 22, 2014

(54) METHODS FOR MANUFACTURING THIN FILM TRANSISTOR

(71) Applicant: Semiconductor Energy Laboratory Co., Ltd., Atsugi (JP)

(72) Inventors: Hidekazu Miyairi, Isehara (JP); Shinya Sasagawa, Chigasaki (JP); Akihiro Ishizuka, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/924,741

(22) Filed: Jun. 24, 2013

(65) Prior Publication Data

US 2013/0280867 A1    Oct. 24, 2013

Related U.S. Application Data

(60) Division of application No. 13/692,310, filed on Dec. 3, 2012, now Pat. No. 8,501,554, which is a continuation of application No. 12/230,048, filed on Aug. 22, 2008, now Pat. No. 8,349,671.

(30) Foreign Application Priority Data

Sep. 3, 2007  (JP) .................................. 2007-228325

(51) Int. Cl.
  *H01L 21/84*  (2006.01)
(52) U.S. Cl.
  USPC ........... 438/158; 438/159; 438/160; 438/166; 438/E21.414

(58) Field of Classification Search
  USPC ................... 438/158–159, 160, 166, E21.414
  See application file for complete search history.

(56) References Cited

U.S. PATENT DOCUMENTS 4,409,134 A    10/1983  Yamazaki
5,453,858 A     9/1995  Yamazaki
(Continued)

FOREIGN PATENT DOCUMENTS

EP    0 473 988       3/1992
JP    60-098680       6/1985
(Continued)

OTHER PUBLICATIONS

Arai et al., "41.2: Micro Silicon Technology for Active Matrix OLED Display," SID Digest '07: SID International Symposium Digest of Technical Papers, 2007, vol. 38, pp. 1370-1373.

(Continued)

*Primary Examiner* — Dung A. Le
(74) *Attorney, Agent, or Firm* — Eric J. Robinson; Robinson Intellectual Property Law Office, P.C.

(57) ABSTRACT

The present invention provides a method for manufacturing a highly reliable semiconductor device with a small amount of leakage current. In a method for manufacturing a thin film transistor, etching is conducted using a resist mask to form a back channel portion in the thin film transistor, the resist mask is removed, a part of the back channel is etched to remove etching residue and the like left over the back channel portion, whereby leakage current caused by the residue and the like can be reduced. The etching step of the back channel portion can be conducted by dry etching using non-bias.

20 Claims, 40 Drawing Sheets

(56) References Cited

U.S. PATENT DOCUMENTS

| | | | |
|---|---|---|---|
| 5,591,987 | A | 1/1997 | Yamazaki et al. |
| 5,648,662 | A | 7/1997 | Zhang et al. |
| 5,701,167 | A | 12/1997 | Yamazaki |
| 5,811,328 | A | 9/1998 | Zhang et al. |
| 5,849,601 | A | 12/1998 | Yamazaki |
| 5,888,839 | A | 3/1999 | Ino et al. |
| 5,998,229 | A | 12/1999 | Lyu et al. |
| 6,023,075 | A | 2/2000 | Yamazaki |
| 6,124,155 | A | 9/2000 | Zhang et al. |
| 6,166,399 | A | 12/2000 | Zhang et al. |
| 6,252,249 | B1 | 6/2001 | Yamazaki |
| 6,285,041 | B1 | 9/2001 | Noguchi |
| 6,306,213 | B1 | 10/2001 | Yamazaki |
| 6,335,213 | B1 | 1/2002 | Zhang et al. |
| 6,372,535 | B1 | 4/2002 | Lyu |
| 6,495,383 | B2 | 12/2002 | Lyu |
| 6,756,258 | B2 | 6/2004 | Zhang et al. |
| 6,797,548 | B2 | 9/2004 | Zhang et al. |
| 6,847,064 | B2 | 1/2005 | Zhang et al. |
| 6,894,311 | B2 * | 5/2005 | Maeda et al. .............. 257/66 |
| 7,067,844 | B2 | 6/2006 | Yamazaki |
| 7,098,479 | B1 | 8/2006 | Yamazaki |
| 7,115,902 | B1 | 10/2006 | Yamazaki |
| 7,517,464 | B2 | 4/2009 | Matsushita et al. |
| 2004/0134878 | A1 | 7/2004 | Matsushita et al. |
| 2004/0188685 | A1 | 9/2004 | Lin et al. |
| 2004/0195574 | A1 | 10/2004 | Ahn et al. |
| 2004/0232421 | A1 | 11/2004 | Ono et al. |
| 2005/0017243 | A1 | 1/2005 | Zhang et al. |
| 2005/0077517 | A1 | 4/2005 | Chang et al. |
| 2005/0130353 | A1 | 6/2005 | Yoo et al. |
| 2005/0133792 | A1 | 6/2005 | Lai |
| 2005/0176187 | A1 | 8/2005 | Luo et al. |
| 2007/0018165 | A1 | 1/2007 | Yamazaki |
| 2008/0044962 | A1 | 2/2008 | Zhang et al. |

FOREIGN PATENT DOCUMENTS

| | | |
|---|---|---|
| JP | 61-087371 | 5/1986 |
| JP | 04-242724 | 8/1992 |
| JP | 06-077483 | 3/1994 |
| JP | 08-088397 A | 4/1996 |
| JP | 11-121761 | 4/1999 |
| JP | 11-274504 A | 10/1999 |
| JP | 2001-127296 A | 5/2001 |
| JP | 2001-274411 A | 10/2001 |
| JP | 2002-246605 | 8/2002 |
| JP | 2002-299627 A | 10/2002 |
| JP | 2004-119597 A | 4/2004 |
| JP | 2004-177946 A | 6/2004 |
| JP | 2005-049832 | 2/2005 |
| JP | 2005-167051 | 6/2005 |
| JP | 2007-005508 | 1/2007 |
| JP | 2007-035964 | 2/2007 |
| JP | 2008-021722 A | 1/2008 |
| TW | 420876 | 2/2001 |
| TW | 200729504 | 8/2007 |

OTHER PUBLICATIONS

Lee al., "High-Mobility Nanocrystalline Silicon Thin-Film Transistors Fabricated by Plasma-Enhanced Chemical Vapor Deposition," Appl. Phys. Lett. (Applied Physics Letters), May 24, 2005, vol. 86, pp. 222106-1-222106-3.

Lee et al., "High-Mobility N-Channel and P-Channel Nanocrystalline Silicon Thin-Film Transistors," IEDM 05: Technical Digest of International Electron Devices Meeting, 2005, pp. 937-940.

Lee et al., "Directly Deposited Nanocrystalline Silicon Thin-Film Transistors With Ultra High Mobilities," Appl. Phys. Lett. (Applied Physics Letters), Dec. 18, 2006, vol. 89, No. 25, pp. 252101-1-252101-3.

Lee et al., "How to Achieve High Mobility Thin Film Transistors by Direct Deposition of Silicon Using 13.56 Mhz RF PECVD?" IEDM 06: Technical Digest of International Electron Devices Meeting, Dec. 11, 2006, pp. 295-298.

Esmaeili-Rad et al., "High Stability, Low Leakage Nanocrystalline Silicon Bottom Gate Thin Film Transistors for Amoled Displays," IEDM 06: Technical Digest of International Electron Devices Meeting, 2006, pp. 303-306.

Lee et al., "Leakage Current Mechanisms in Top-Gate Nanocrystalline Silicon Thin-Film Transistors," Appl. Phys. Lett. (Applied Physics Letters), Feb. 28, 2008, vol. 92, pp. 0835091-083509-3.

Esmaeili-Rad et al., "Absence of Defect State Creation in Nanocrystalline Silicon Thin-Film Transistors Deduced From Constant Current Stress Measurements," Appl. Phys. Lett. (Applied Physics Letters), Sep. 12, 2007, vol. 91, No. 11, pp. 113511-1-113511-3.

Lee et al., "Stability of NC-Si:H TFTS With Silicon Nitride Gate Dielectric," IEEE Transactions on Electron Devices, Jan. 2007, vol. 54, No. 1, pp. 45-51.

Sazonov et al., "Low-Temperature Materials and Thin Film Transistors for Flexible Electronics," Proceedings of the IEEE, Aug. 1, 2005, vol. 93, No. 8, pp. 1420-1428.

Esmaeili-Rad.M et al., "Stability of Nanocrystalline Silicon Bottom-Gate Thin-Film Transistors With Silicon Nitride Gate Dielectric," J. Appl. Phys. (Journal of Applied Physics), Sep. 28, 2007, vol. 102, pp. 064512-1-064512-7.

Lee et al., "Top-Gate TFTS Using 13.56MHZ PECVD Microcrystalline Silicon," IEEE Electron Device Letters, Sep. 5, 2005, vol. 26, No. 9, pp. 637-639.

Lee et al., "Postdeposition Thermal Annealing and Material Stability of 75° C. Hydrogenated Nanocrystalline Silicon Plasma-Enhanced Chemical Vapor Deposition Films," J. Appl. Phys. (Journal of Applied Physics), Aug. 4, 2005, vol. 98, No. 3, pp. 034305-1-034305-7.

Chinese Office Action (Application No. 200810215715.3) dated Aug. 5, 2011.

Taiwanese Office Action (Application No. 97132216) Dated Dec. 27, 2013.

* cited by examiner

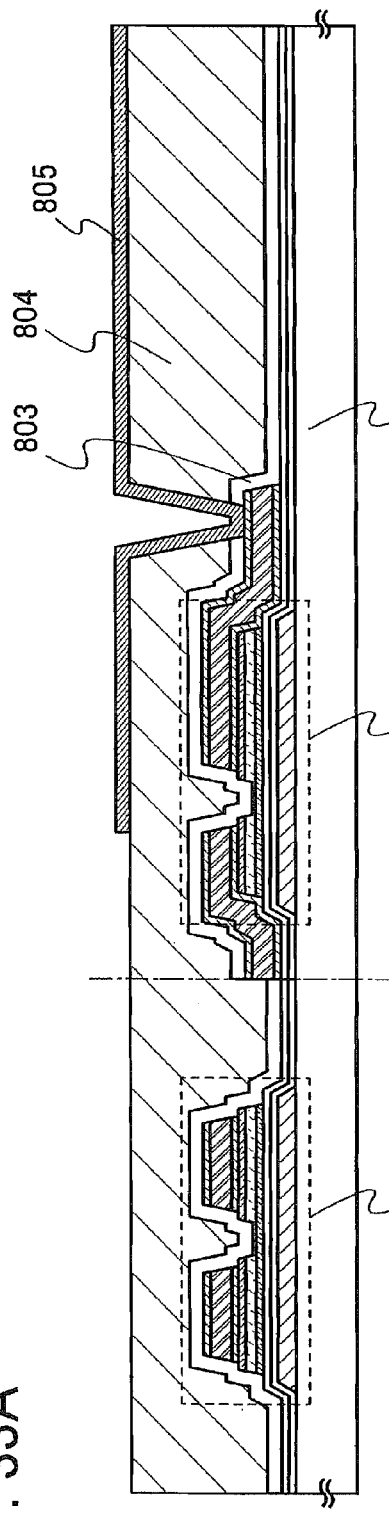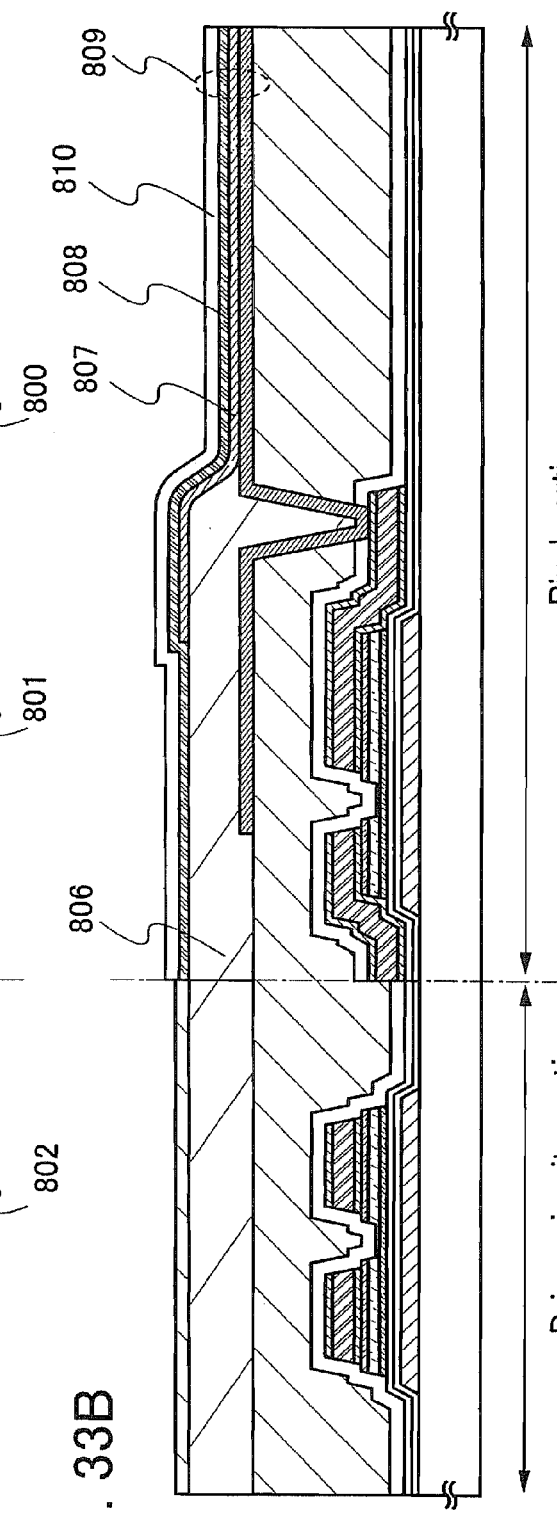

US 8,703,560 B2

METHODS FOR MANUFACTURING THIN FILM TRANSISTOR

CROSS REFERENCE TO RELATED APPLICATIONS

This application is a DIV of Ser. No. 13/692,310 filed Dec. 3, 2012, now U.S. Pat. No. 8,501,554 which is a CON of Ser. No. 12/230,048 filed Aug. 22, 2008, now U.S. Pat. No. 8,349,671.

BACKGROUND OF THE INVENTION

1. Field of the Invention

The present invention relates a method for manufacturing a thin film transistor. Further, the present invention relates to a method for manufacturing a semiconductor device having the thin film transistor. As an example of the semiconductor device, a display device is given, in particular. As an example of the display device, a liquid crystal display device and an EL display device are given.

2. Description of the Related Art

In recent years, thin film transistors formed using a semiconductor thin film (having a thickness of several nanometers to several hundreds of nanometers) formed over a substrate having an insulating surface (e.g., a glass substrate) have been attracting attentions. Thin film transistors are widely used for ICs (integrated circuits) and electronic devices such as electrooptical devices. In particular, thin film transistors are urgently developed as switching elements of image display devices typified by liquid crystal display devices and the like.

In an image display device such as a liquid crystal display device, a thin film transistor using an amorphous semiconductor film or a thin film transistor using a polycrystalline semiconductor film is used as a switching element.

The thin film transistor using an amorphous semiconductor film has low mobility, i.e., low current-driving capability. Thus, when a protection circuit is formed using a thin film transistor formed using an amorphous semiconductor film, a large-size thin film transistor is forced to be formed as countermeasure against electrostatic breakdown, which leads to hindrance to narrower frame parts, unfortunately. In addition, if a large-size transistor is formed, parasitic capacitance between a scan line electrically connected to a gate electrode and a signal line electrically connected to a source electrode or a drain electrode may increase, and thus power consumption may increase, which is problematic.

A thin film transistor using a polycrystalline semiconductor film has advantages in that its mobility is greater than that of a thin film transistor using an amorphous semiconductor film by two or more digits, and a pixel portion of a liquid crystal display device and peripheral driver circuits thereof can be formed over the same substrate. A process of the thin film transistor using a polycrystalline semiconductor film, however, is more complicated than that of the thin film transistor using an amorphous semiconductor film, because of crystallization of a semiconductor film and addition of an impurity element (doping). Therefore, there is a problem of low yield and high cost.

As a method for forming a polycrystalline semiconductor film, there is known a technique in which a pulsed excimer laser beam is shaped into a linear beam by an optical system and an amorphous semiconductor film is scanned to be irradiated with the linear beam so that the amorphous semiconductor film can be crystallized.

In addition, as a switching element of an image display device, a thin film transistor using a microcrystalline semiconductor film is known, as well as such a thin film transistor using an amorphous semiconductor film or such a thin film transistor using a polycrystalline semiconductor film (for example, Reference 1: Japanese Published Patent Application No. H04-242724, Reference 2: Japanese Published Patent Application No. 2005-49832, Reference 3: U.S. Pat. No. 4,409,134, and Reference 4: U.S. Pat. No. 5,591,987).

As a method for manufacturing a thin film transistor using a microcrystalline semiconductor film, a technique is known in which an amorphous silicon film is formed over a gate insulating film, a metal film is formed over the amorphous silicon film, and the metal film is irradiated with a diode laser to modify the amorphous silicon film into a microcrystalline silicon film. With this manufacturing method, the metal film formed over the amorphous silicon film only converts light energy of the diode laser into thermal energy and is removed in a later step. That is, in this method, the amorphous silicon film is heated only by conduction heating from the metal film and the microcrystalline silicon film is formed by this heat (for example, see Reference 5: Toshiaki ARAI and others, SID '07 DIGEST, 2007, pp. 1370-1373).

SUMMARY OF THE INVENTION

It is an object of the present invention to provide a method for manufacturing a thin film transistor with small off current and excellent electric characteristics.

The present invention relates to a method for manufacturing a thin film transistor having a back channel portion, and in the method, after formation of the back channel portion, an etching process is conducted to remove residue of a resist mask removed or the like.

An aspect of the present invention is a method for manufacturing a thin film transistor, wherein etching is conducted using a resist mask to form a back channel portion in the thin film transistor; the resist mask is removed; and a part of the back channel portion is removed.

The present invention may be applied especially to inversely-staggered thin film transistors. This is because residue of a resist mask tends to be left in a back channel portion in an inversely-staggered thin film transistor. Accordingly, an aspect of the present invention is a method for manufacturing a thin film transistor, wherein an impurity semiconductor layer in a portion serving as a channel-forming region or a portion overlapping with the channel-forming region is etched, and then dry etching is conducted with the semiconductor layer exposed in the etched portion. In other words, after a back channel is formed, a resist mask is removed and further, etching is conducted, which is a feature of the present invention.

In the above-described structure of the present invention, for example, an amorphous semiconductor layer may be used as the semiconductor layer. Preferably, a microcrystalline semiconductor film is used. This is because a thin film transistor formed using a microcrystalline semiconductor layer can increase on current. However, there is a problem in that the surface of a crystal grain of a microcrystalline semiconductor film is easily oxidized. Therefore, in many cases, an oxide layer is formed in the surface of a crystal grain of a channel-forming region. There is a problem in that the oxide film inhibits movement of carries and electric characteristics of the thin film transistor are decreased (for example, mobility is decreased).

For the above reason, in a case where a microcrystalline semiconductor layer is used as a semiconductor layer, a buffer layer is preferably provided covering the microcrystalline semiconductor layer. The buffer layer is formed using amorphous semiconductor. The microcrystalline semiconductor layer and the amorphous semiconductor layer serving as the buffer layer are preferably formed using the same material. In other words, a method for manufacturing a thin film transistor using a microcrystalline semiconductor layer as a semiconductor layer is as follows.

An aspect of the present invention is a method for manufacturing a thin film transistor. The method includes the steps of: etching, using a resist mask, to form a back channel portion in the thin film transistor; removing the resist mask; and etching a part of the back channel portion.

Another aspect of the present invention is a method for manufacturing a thin film transistor. The method includes the steps of: forming a gate insulating layer, a semiconductor layer and an impurity semiconductor layer over a gate electrode layer; selectively forming a first resist mask over the impurity semiconductor layer; etching the semiconductor layer and the impurity semiconductor layer to form an island-shaped semiconductor layer overlapping at least a part of the gate electrode layer; removing the first resist mask; forming a conductive layer over the gate insulating layer and the island-shaped semiconductor layer; selectively forming a second resist mask over the conductive layer; etching the conductive layer to form source and drain electrode layers; etching the impurity semiconductor layer of the island-shaped semiconductor layer with the second resist mask left, to expose a part of the semiconductor layer so that a back channel portion is formed; removing the second resist mask; and etching a superficial part of the back channel portion, using the source and drain electrode layers as a mask. This method is referred to as a first method.

Another aspect of the present invention is a method for manufacturing a thin film transistor. The method includes the steps of: forming a gate insulating layer, a semiconductor layer and an impurity semiconductor layer over a gate electrode layer; selectively forming a first resist mask over the impurity semiconductor layer; etching the semiconductor layer and the impurity semiconductor layer to form an island-shaped semiconductor layer overlapping at least a part of the gate electrode layer; removing the first resist mask; forming a conductive layer over the gate insulating layer and the island-shaped semiconductor layer; selectively forming a second resist mask over the conductive layer; etching the conductive layer to form source and drain electrode layers; removing the second resist mask; etching the impurity semiconductor layer of the island-shaped semiconductor layer using the source and drain electrode layers as a mask, to expose a part of the semiconductor layer so that a back channel portion is formed; and etching a superficial part of the back channel portion.

Still another aspect of the present invention is a method for manufacturing a thin film transistor. The method includes the steps of: forming a gate insulating layer, a semiconductor layer, an impurity semiconductor layer and a conductive layer over a gate electrode layer; selectively forming a first resist mask having a depression portion, over the conductive layer; etching the semiconductor layer, the impurity semiconductor layer and the conductive layer to form an island-shaped semiconductor layer and a conductive layer thereover, and thereby forming a second resist mask such that the depression portion can reach the conductive layer; etching the conductive layer to form source and drain electrode layers; etching the impurity semiconductor layer of the island-shaped semiconductor layer, to expose a part of the semiconductor layer so that a back channel portion is formed; removing the second resist mask; and etching a superficial part of the back channel portion, using the source and drain electrode layers as a mask.

Further, another aspect of the present invention is a method for manufacturing a thin film transistor. The method includes the steps of: forming a gate insulating layer, a semiconductor layer, an impurity semiconductor layer and a conductive layer over a gate electrode layer; selectively forming a first resist mask having a depression portion, over the conductive layer; etching the semiconductor layer, the impurity semiconductor layer and the conductive layer to form an island-shaped semiconductor layer and a conductive layer thereover, and thereby forming a second resist mask such that the depression portion can reach the conductive layer; etching the conductive layer to form source and drain electrode layers; removing the second resist mask; etching the impurity semiconductor layer of the island-shaped semiconductor layer to expose a part of the semiconductor layer so that a back channel portion is formed; and etching a superficial part of the back channel portion, using the source and drain electrode layers as a mask.

In the above structures of the present invention, the step of etching a part of the back channel portion is preferably conducted with non-bias applied. This is because damages to the back channel portion can be reduced.

In the above structures of the present invention, the step of etching a part of the back channel portion is preferably using the same kinds of gas as that used in formation of the back channel portion. By etching the superficial part (slight etching) using the same kinds of gas as that used in formation of the back channel portion, throughput can be increased. As an example of a gas used here, a chlorine gas can be given.

In the above structures of the present invention, the step of etching the back channel portion is preferably conducted using pulsed discharge. This is because damages to the back channel portion can be more reduced.

In the above structures of the present invention, it is preferable that the semiconductor layer includes a stacked layer of a microcrystalline semiconductor layer and an amorphous semiconductor layer, and the amorphous semiconductor layer is provided on a side of the semiconductor layer where the impurity semiconductor layer is in contact with. By applying the present invention to the thin film transistor having such a structure, the amount of off current can be more reduced.

The source and drain electrode layers included in the thin film transistor manufactured according to the above methods of the present invention form a pixel electrode layer that is connected to the source and drain electrode layers, and the pixel electrode layer is formed using a conductive material having a light-transmitting property.

In the thin film transistor manufactured by the first method, the semiconductor layer is formed of a microcrystalline semiconductor layer and an amorphous semiconductor layer. The thin film transistor includes the gate electrode layer, the gate insulating layer formed covering the gate electrode layer, the semiconductor layer formed over the gate insulating layer, the source and drain regions including a first portion provided in contact with above a part of the semiconductor layer and a second portion provided in contact with the first portion, and the source and drain electrodes provided in contact with above the source and drain regions. A portion of the amorphous semiconductor layer overlapping with the source and drain regions is thicker than a portion of the amorphous semiconductor layer overlapping with a channel-forming region. A side face of the first portion included in the source and drain regions exists in the same as or substantially the same plane as a side face of the source and drain electrodes, and a side face of the second portion of the source and drain regions exists in the same as or substantially the same plane as a side face of the amorphous semiconductor layer.

In the above structure, i.e., an inversely-staggered structure in which the buffer layer is formed over the microcrystalline semiconductor layer, on current mainly flows in the vicinity of the interface between the channel-forming region and the gate insulating layer (a region which is within several tens of nanometers from the interface), whereas off current mainly flows in a superficial layer of the channel-forming region which is far side from the gate insulating layer (hereinafter, the superficial layer is also referred to as a back channel portion). Since the microcrystalline semiconductor has high mobility, on current can be increased, and since the amorphous semiconductor layer containing hydrogen serving as the buffer layer corresponds to a back channel portion of the thin film transistor and has high resistance, off current can be decreased. Accordingly, the microcrystalline semiconductor layer is formed in contact with the gate insulating layer, the amorphous semiconductor layer is formed in the back channel portion, the back channel portion is etched after removal of the resist mask, whereby a thin film transistor with a large amount of on current and a small amount of off current can be formed.

Between the microcrystalline semiconductor layer and the source and drain regions, the buffer layer may be formed. The buffer layer functions as a high-resistant region as well as preventing the microcrystalline semiconductor layer from being oxidized. Since the buffer layer having a depression portion is provided between the microcrystalline semiconductor layer and the source and drain regions, a thin film transistor which has high mobility, small leakage current, and high withstand voltage can be formed. By decreasing leakage current between the source and drain regions of a thin film transistor, off current can be made small.

In the present invention, when the buffer layer is provided, dry etching is conducted in a state that the buffer layer overlapping with the channel-forming region is exposed, after resist removal and cleaning after etching an impurity region. By provision of the buffer layer, the microcrystalline semiconductor layer is prevented from being oxidized, and thus deterioration in electric characteristics of the thin film transistor can be prevented.

By provision of the buffer layer as described above, a process for a channel-etched transistor, which gives high productivity, can be employed.

Note that in this specification, as for each layer of stacked films, a "film" and a "layer" are used in an indistinguishable manner in some cases.

Further, in this specification, a deposited microcrystalline semiconductor layer is irradiated with laser light so that crystals are grown, and the microcrystalline semiconductor layer having the grown crystals is referred to as an LPSAS layer.

In accordance with the present invention, a thin film transistor having small off current can be manufactured. By decreasing off current, a thin film transistor having excellent switching characteristics can be manufactured.

In other words, a thin film transistor having excellent electric characteristics and high reliability can be manufactured with high yield at low cost. In addition, by using thin film transistors manufactured in accordance with the present invention, variation in electric characteristics between elements over the same substrate can be reduced.

In addition, a thin film transistor whose drain current is not influenced so much by change in drain voltage can be manufactured.

Further, even in a case where a channel length of a thin film transistor is small, off current in rising of a $V_g$–$I_d$ curve can be made small.

A thin film transistor formed in accordance with the present invention has a small subthreshold swing and excellent switching characteristics. Thus, if the thin film transistor is applied to a display device, the contrast ratio of the display device is improved and the power consumption can be reduced. Moreover, since variation in electric characteristics between elements is small, a display device with less display unevenness (mura) can be provided.

Here, the term "subthreshold swing" is a gate voltage necessary for increasing a current (subthreshold current) between a source electrode and a drain electrode by one digit, and the smaller a subthreshold swing is, the steeper the slope of the subthreshold current with respect to the gate voltage is and the more excellent the switching characteristics are.

Accordingly, by applying a thin film transistor formed according to the present invention to a display device, the image quality of the display device can be improved.

BRIEF DESCRIPTION OF THE DRAWINGS

In the accompanying drawings:

FIG. 19 illustrates a liquid crystal display device which the present invention can be applied to;

FIG. 20 illustrates a liquid crystal display device which the present invention can be applied to;

FIG. 21 illustrates a liquid crystal display device which the present invention can be applied to;

FIG. 22 illustrates a liquid crystal display device which the present invention can be applied to;

FIG. 23 illustrates a liquid crystal display device which the present invention can be applied to;

FIG. 24 illustrates a liquid crystal display device which the present invention can be applied to;

FIG. 25 illustrates a liquid crystal display device which the present invention can be applied to;

FIG. 26 illustrates a liquid crystal display device which the present invention can be applied to;

FIG. 27 illustrates a liquid crystal display device which the present invention can be applied to;

FIG. 28 illustrates a liquid crystal display device which the present invention can be applied to;

FIG. 29 illustrates a liquid crystal display device which the present invention can be applied to;

FIG. 30 illustrates a liquid crystal display device which the present invention can be applied to;

FIG. 31 illustrates a liquid crystal display device which the present invention can be applied to;

FIG. 32 illustrates a liquid crystal display device which the present invention can be applied to;

FIGS. 33A and 33B illustrate a light-emitting device which the present invention can be applied to;

FIGS. 34A to 34C illustrate light-emitting devices which the present invention can be applied to;

FIG. 35 is a block diagram illustrating a structure of a display device which the present invention can be applied to;

DETAILED DESCRIPTION OF THE INVENTION

Figure 1:
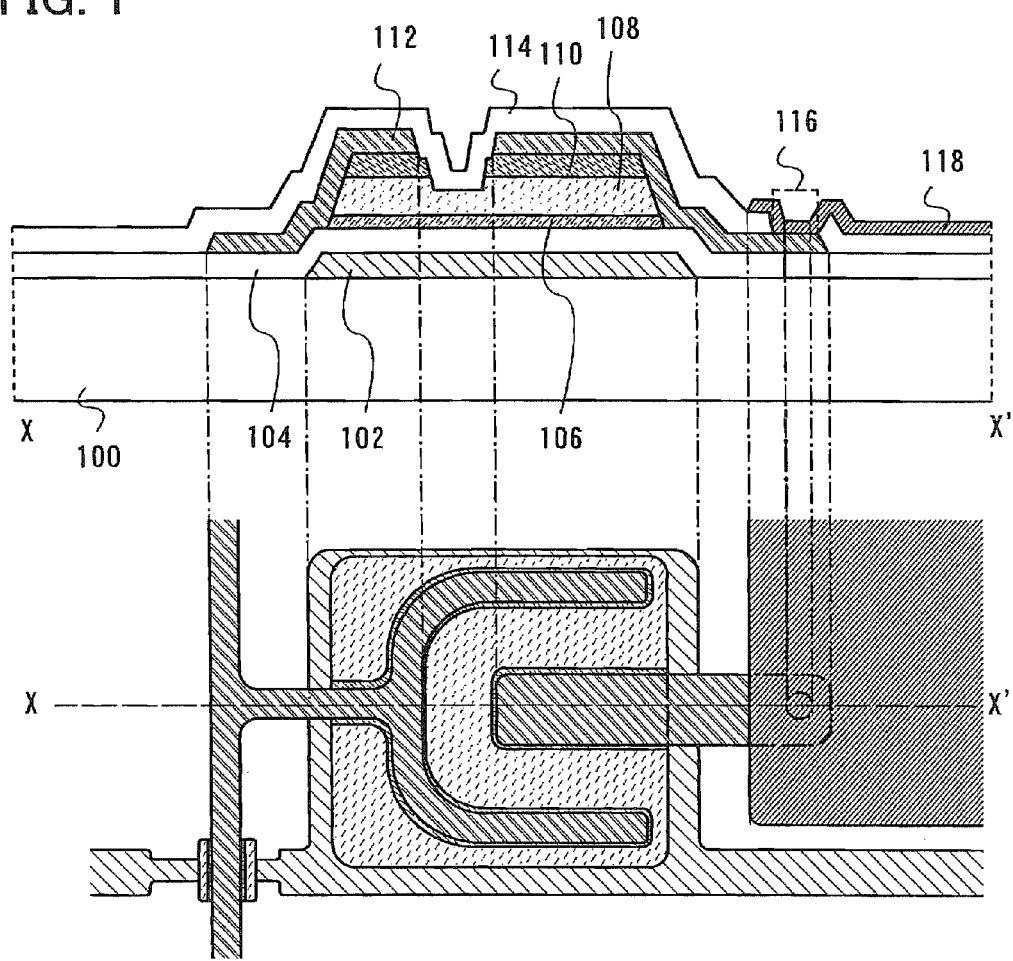
FIG. 1 illustrates an example of a structure of a thin film transistor according to an aspect of the present invention.

Embodiment modes of the present invention will be described below with reference to the accompanying drawings. Note that the present invention is not limited to the following description. It is easily understood by those skilled in the art that a mode and/or a detail of the present invention can be variously changed unless departing from the scope and spirit of the present invention. Accordingly, the present invention should not be interpreted as being limited to the description of the embodiment modes to be given below. In the description of the present invention with reference to the drawings, a reference numeral indicating the same part is used in common throughout the drawings. The same hatching pattern is applied to similar parts, and the similar parts are not especially denoted by reference numerals in some cases.

(Embodiment Mode 1)

In Embodiment Mode 1, a method for manufacturing a thin film transistor according to the present invention and the thin film transistor manufactured by the method will now be described with reference to drawings.

FIG. 1 is a top view and a cross-sectional view of a thin film transistor according to the present invention as an example. The thin film transistor illustrated in FIG. 1 includes a gate electrode layer 102 over a substrate 100, a gate insulating layer 104 over the gate electrode layer 102, a semiconductor layer 106 over the gate insulating layer 104, a buffer layer 108 over the semiconductor layer 106, source and drain regions 110 over a part of the buffer layer 108, source and drain electrode layers 112 over the source and drain regions 110, and an insulating layer 114 over the source and drain electrode layers 112. Each of the layers is patterned into a desired shape. The insulating layer 114 serves as a protective layer.

In addition, specifically, the semiconductor layer 106 in this embodiment mode can be a microcrystalline semiconductor layer, or a crystalline semiconductor layer obtained by subjecting a deposited microcrystalline semiconductor layer to laser processing (also referred to as LP), but the layers are not limiting examples, and the semiconductor layer 106 may have no crystallinity. Alternatively, a crystalline semiconductor layer typified by a polycrystalline semiconductor layer may be used.

In the thin film transistor illustrated in FIG. 1, the source and drain regions 110 provided in contact with a part over the buffer layer 108 include a first portion in contact with the source and drain electrode layers 112 and a second portion in contact with the buffer layer 108. A portion of the buffer layer 108 overlapping with the source and drain regions is thicker than a portion of the buffer layer 108 overlapping with a channel-forming region. Further, as illustrated in FIG. 1, a side face (an inner side face) of the first portion included in the source and drain regions 110 exists in the same as or substantially the same plane as a side face of the source and drain electrode layers 112, and a side face (an inner side face) of the second portion exists in the same as or substantially the same plane as a side face of the buffer layer 108. The side face of the first portion and the side face of the second portion may exist on different planes.

The thin film transistor illustrated in FIG. 1 is a pixel transistor which is provided for a liquid crystal display device (a liquid crystal display panel) in matrix. The source electrode of the thin film transistor is connected to a source wiring and the drain electrode is connected to a pixel electrode layer 118 through an opening portion 116 formed in the insulating layer 114.

Note that one of a source electrode and a drain electrode is provided so as to have a shape of surrounding at least the other of the source electrode and the drain electrode (a U shape or a horseshoe shape). By providing a U-shaped (or a horseshoe shape) thin film transistor, the channel width of the thin film transistor can be increased and sufficient on current can flow. In addition, variation in electric characteristics can be reduced. Further, reliability of the thin film transistor can be increased. However, the present invention is not limited to the U shape or the horseshoe shape, and the thin film transistor is not necessarily U-shaped or the horseshoe shape.

Next, a method for manufacturing the thin film transistor illustrated in FIG. 1 is described with reference to drawings. Note that an n-channel thin film transistor having a microcrystalline semiconductor layer has a higher mobility of carriers than a p-channel thin film transistor having a microcrystalline semiconductor layer. It is preferable that all thin film transistors formed over the same substrate have the same polarity because the number of manufacturing steps can be reduced. Therefore, here, a method for manufacturing an n-channel thin film transistor is described.

First, the gate electrode layer 102 is formed over the substrate 100. As the substrate 100, any of the following substrates can be used: an alkali-free glass substrate formed of barium borosilicate glass, aluminoborosilicate glass, aluminosilicate glass, or the like by a fusion method or a float method; a ceramic substrate; a plastic substrate having heat resistance enough to withstand a process temperature of this manufacturing process; and the like. Alternatively, a metal substrate of a stainless alloy or the like with its surface provided with an insulating layer may be used. That is, a substrate having an insulating surface is used as the substrate 100. When the substrate 100 is a mother glass, the substrate may have any size of from the first generation (e.g., 320 mm×400 mm) to the tenth generation (e.g., 2950 mm×3400 mm).

The gate electrode layer 102 is formed using a metal material such as titanium, molybdenum, chromium, tantalum, tungsten, aluminum, copper, neodymium, or scandium or an alloy material which includes any of these materials as a main component. In the case of using aluminum, an Al—Ta alloy in which aluminum is alloyed with tantalum added thereto is preferably used because hillocks are suppressed. Alternatively, an Al—Nd alloy in which aluminum is alloyed with neodymium added thereto is more preferably used because a wiring with low resistance can be formed and hillocks are suppressed. Alternatively, a semiconductor layer typified by polycrystalline silicon doped with an impurity element such as phosphorus, or an AgPdCu alloy may be used. The gate electrode layer 102 may have either a single-layer structure or a stacked-layer structure. For example, a two-layer structure in which a molybdenum layer is stacked over an aluminum layer, a two-layer structure in which a molybdenum layer is stacked over a copper layer, or a two-layer structure in which a titanium nitride layer or a tantalum nitride is stacked over a copper layer is preferable. When a metal layer functioning as a barrier layer is stacked over a layer with low electric resistance, electric resistance can be reduced and a metal element from the metal layer can be prevented from diffusing into the semiconductor layer. Alternatively, a two-layer structure including a titanium nitride layer and a molybdenum layer, or a three-layer structure in which a tungsten layer having a thickness of 50 nm, an alloy layer of aluminum and silicon having a thickness of 500 nm, and a titanium nitride layer having a thickness of 30 nm may be used. When the three-layer structure is used, tungsten nitride may be used instead of tungsten of the first conductive layer, an alloy layer of aluminum and titanium may be used instead of the alloy layer of aluminum and silicon of the second conductive layer, or a titanium layer may be used instead of the titanium nitride layer of the third conductive layer. For example, when a molybdenum layer is stacked over an Al—Nd alloy layer, a conductive layer which has excellent heat resistance and low resistance can be formed.

The gate electrode layer 102 can be formed in such a manner that a conductive layer is formed over the substrate 100 by a sputtering method or a vacuum evaporation method, a mask is formed over the conductive layer by a photolithography method or an inkjet method, and the conductive layer is etched using the mask. Alternatively, the gate electrode layer 102 can be formed by discharging a conductive nanopaste of silver, gold, copper, or the like over the substrate by an inkjet method and baking the conductive nanopaste. Note that as a barrier metal for increasing adhesion between the gate electrode layer 102 and the substrate 100 and preventing diffusion of a material used for the gate electrode layer 102 to a base, a nitride layer of any of the above-described metal materials may be provided between the substrate 100 and the gate electrode layer 102. Here, the gate electrode layer 102 is formed by forming the conductive layer over the substrate 100 and etching the conductive layer by using a resist mask formed using a photomask.

Note that since a semiconductor layer and a source wiring (a signal line) are formed over the gate electrode layer 102 in later steps, the gate electrode layer 102 is preferably processed so that a side face thereof is tapered in order to prevent disconnection at a step portion. In addition, in this step, a gate wiring (a scan line) can be formed at the same time. Further, a capacitor line included in a pixel portion can also be formed. Note that a "scan line" refers to a wiring to select a pixel.

Next, the gate insulating layer is formed to cover the gate electrode layer 102, the microcrystalline semiconductor layer, the amorphous semiconductor layer, and the impurity semiconductor layer are sequentially formed over the gate insulating layer. Note that at least the gate insulating layer, the microcrystalline semiconductor layer and the amorphous semiconductor layer are preferably formed successively. More preferably, the impurity semiconductor layer is also formed successively following the above layers. At least the gate insulating layer, the microcrystalline semiconductor layer and the amorphous semiconductor layer are formed successively without being exposed to air, and thus each interface of stacked layers can be formed without being contaminated by an atmospheric constituent or a contaminant impurity element floating in the atmosphere. Thus, variations in electric characteristics of thin film transistors can be reduced, and a thin film transistor having high reliability can be manufactured with high yield.

The gate insulating layer 104 can be formed using silicon oxide, silicon nitride, silicon oxynitride, or silicon nitride oxide by a CVD method, a sputtering method, or the like. The gate insulating layer 104 may have either a single-layer structure or a stacked-layer structure of the above-described materials. As the gate insulating layer 104, a silicon nitride layer or a silicon nitride oxide layer, and a silicon oxide layer or a silicon oxynitride layer is preferably stacked from the substrate side in this order. This is because the silicon nitride layer and the silicon nitride oxide layer have a high effect of preventing an impurity element contained in the substrate 100 from entering the semiconductor layer 106 if the impurity element is contained in the substrate 100, and when the semiconductor layer 106 is a microcrystalline semiconductor layer, the silicon oxide and the silicon oxynitride layer have excellent interface properties with the microcrystalline semiconductor layer. Alternatively, as the gate insulating layer 104, a silicon oxide layer or a silicon oxynitride layer, a silicon nitride layer or a silicon nitride oxide layer, and a silicon oxide layer or a silicon oxynitride layer may be formed from the substrate side in this order. Alternatively, the gate insulating layer 104 may be formed of a single layer of a silicon oxide layer, a silicon nitride layer, a silicon oxynitride layer, or a silicon nitride oxide layer. Further, the gate insulating layer 104 is preferably formed by using a microwave plasma CVD method with a frequency of 1 GHz or higher. A silicon oxynitride layer or a silicon nitride oxide layer formed by a microwave plasma CVD method has high withstand voltage because of its dense film quality, and reliability of a thin film transistor can be improved.

The gate insulating layer 104 preferably has a two-layer structure in which a silicon oxynitride layer is stacked over a silicon nitride oxide layer. This gate insulating layer 104 is formed to a thickness of 50 nm or more, preferably from 50 nm to 400 nm, inclusive, more preferably 150 nm to 300 nm inclusive. The use of a silicon nitride oxide layer can prevent alkali metal or the like contained in the substrate 100 from mixing into the semiconductor layer 106. Further, a silicon oxynitride layer can prevent hillocks which can be generated in the case of using aluminum for the gate electrode layer 102 and also prevents the gate electrode layer 102 from being oxidized.

Note that "silicon oxynitride" refers to a substance which contains more oxygen than nitrogen and contains oxygen, nitrogen, silicon, and hydrogen at concentrations ranging from 55 to 65 at. %, 1 to 20 at. %, 25 to 35 at. %, and 0.1 to 10 at. %, respectively. Further, silicon nitride oxide refers to a material that contains more nitrogen than oxygen and contains oxygen, nitrogen, silicon, and hydrogen at concentrations ranging from 15 to 30 at. %, 20 to 35 at. %, 25 to 35 at. %, and 15 to 25 at. %, respectively.

In a case the semiconductor layer 106 is a layer obtained by conducting LP to a microcrystalline semiconductor layer, after the gate insulating layer 104 and before the microcrystalline semiconductor layer is formed, a layer for increasing adhesion of the microcrystalline semiconductor layer and preventing the microcrystalline semiconductor layer from being oxidized by LP is preferably formed over the gate insulating layer 104. As such a layer for preventing oxidation, for example, a stacked layer in which an oxynitride layer is interposed between silicon nitride layers can be given. In a case where the semiconductor layer 106 is formed by conducting the LP to a microcrystalline semiconductor layer, by this layer, adhesion of the semiconductor layer 106 formed over the stacked layer can be increased and the semiconductor layer 106 can be prevented from being oxidized at the time of LP.

The semiconductor layer 106 serves as the channel-forming region of the thin film transistor. In a case where the semiconductor layer 106 is a microcrystalline semiconductor layer, a microcrystalline semiconductor layer including a semiconductor material having an intermediate structure between amorphous and crystalline structures (including a single crystal and a polycrystal) is formed. Further, the microcrystalline semiconductor layer is subjected to LP so that its electric characteristics can be improved.

A microcrystalline semiconductor is a semiconductor which has a third state which is stable in free energy, may be a crystalline semiconductor which has a short-range order and lattice distortion, and has crystal grains with a diameter of several nm to 20 nm in an amorphous semiconductor layer. Microcrystalline silicon, which is a typical example of a microcrystalline semiconductor, has a Raman spectrum which is shifted to a wave number side lower than 520.6 $cm^{-1}$ that features single-crystal silicon. That is, the peak of a Raman spectrum of microcrystalline silicon is within the range from 481 $cm^{-1}$ to 520.6 $cm^{-1}$. In addition, microcrystalline silicon preferably contains hydrogen or halogen of at least 1 at. % or more in order to terminate a dangling bond. Such a microcrystalline semiconductor layer is disclosed in, for example, Reference 3.

Note that when the full width at half maximum (FWHM) of the peak of a Raman spectrum is used, the grain size of a crystal grain contained in a microcrystalline semiconductor layer can be calculated. However, it can be considered that the shape of a crystal grain which is actually contained in a microcrystalline semiconductor layer is not a round shape.

As a preferred mode of the microcrystalline semiconductor layer used in the present invention, an LPSAS layer can be given, which is obtained by a process in which a microcrystalline silicon (also referred to as semi-amorphous silicon, SAS) layer is deposited over the gate insulating layer, and a surface side of this layer is irradiated with laser light. The LPSAS layer is described below.

The laser beam can act on the interface between the amorphous silicon layer and the gate insulating layer. Accordingly, using the crystals on the surface side of the amorphous silicon layer as nuclei, crystal growth advances from the surface toward the interface with the gate insulating layer, and roughly columnar-like crystals grow. The crystal growth by the LP is not to increase the size of crystal grains but rather to improve crystallinity in the thickness direction of the layer.

In the LP, for example, an amorphous silicon layer formed over a glass substrate of 730 mm×920 mm can be processed by one scanning of a laser beam when a laser beam is condensed in a long rectangular shape (a linear laser beam). In such a case, an overlap rate of the linear laser beams overlapped may be 0% to 98%, preferably 85% to 95%. Accordingly, the length of processing time for each substrate can be shortened, and productivity can be increased. Note that the shape of the laser beam is not limited to a linear shape, and may be planar. In addition, the LP can be applied to a substrate having a wide variety of sizes, without any particular limitations on the size of the substrate used. By the LP, the crystallinity in the vicinity of the interface between the microcrystalline semiconductor layer and the gate insulating layer is improved, whereby an effect of improving electric characteristics of a thin film transistor having a bottom-gate structure can be given.

By the above-described growth, unevenness (referred to as a ridge, and is a convex portion) of a surface generated in a conventional low-temperature polysilicon is not produced and thus excellent smoothness of silicon surface which has been subjected to LP can be kept. Note that in a case of low temperature polysilicon, if a gate electrode exists directly under the semiconductor layer, ridges are not produced in the semiconductor layer in many cases.

As in this embodiment mode, a crystalline silicon layer obtained by directly irradiating on a deposited amorphous silicon film with a laser beam is distinctly different in growth mechanism and film quality from a conventional microcrystalline silicon film as deposited and a microcrystalline silicon layer which is modified by conduction heating (one disclosed in Reference 5). However, the present invention is not limited to this. In other words, the present invention can be applied to a thin film transistor including microcrystalline silicon in Reference 5 or the like.

In addition, the carrier mobility of a microcrystalline semiconductor layer is about 1 $cm^2/V \cdot sec$ to 20 $cm^2/V \cdot sec$, and the carrier mobility is about two to twenty times the carrier mobility of a thin film transistor formed using an amorphous semiconductor layer. Thus, a thin film transistor formed using a microcrystalline semiconductor layer has steeper rising in a current-voltage curve where a horizontal axis represents a gate voltage and a vertical axis represents a drain current, than a thin film transistor formed using amorphous semiconductor layer. In this case, a "gate voltage" indicates a potential difference between a source electrode and a gate electrode, and a "drain current" indicates a current flowing between the source electrode and a drain electrode. Therefore, a thin film transistor using a microcrystalline semiconductor layer for a channel-forming region has a large amount of on current, is superior in response as a switching element and can operate at high speed. Thus, with use of a thin film transistor whose a channel-forming region is formed of the microcrystalline semiconductor layer for a switching element of a display device, the area of the channel-forming region, that is, the area of the thin film transistor can be decreased. Further, some or all of driver circuits are formed over the same substrate as the pixel portion, and thereby system-on-panel can also be achieved.

The microcrystalline semiconductor layer can be formed directly over the substrate by a high-frequency plasma CVD method with a frequency of several tens to several hundreds of megahertz or a microwave plasma CVD method with a frequency of 1 GHz or more. Typically, the microcrystalline semiconductor layer can be formed using a dilution of silicon hydride such as $SiH_4$ or $Si_2H_6$ with hydrogen. With dilution of silicon hydride and hydrogen with one or plural kinds of rare gas elements selected from helium, argon, krypton, or neon, the microcrystalline semiconductor layer can be formed. In that case, the flow rate of hydrogen to silicon hydride is 5:1 to 200:1, preferably, 50:1 to 150:1, more preferably, about 100:1. Note that instead of silicon hydride, $SiH_2Cl_2$, $SiHCl_3$, $SiCl_4$, $SiF_4$, or the like can be used. In addition, a layer formed by a microwave plasma CVD method with a frequency of 1 GHz or more has high electron density, and hydrogenated silicon as a source gas can be easily dissociated. Thus, as compared with a high frequency plasma CVD method with a frequency of several tens of megahertz to several hundreds of megahertz, a microcrystalline semiconductor layer can be easily formed, a deposition rate can be increased, and productivity can be increased by such a microwave plasma CVD method.

A microcrystalline semiconductor layer exhibits weak n-type conductivity when an impurity element for valence control is not added. Thus, the threshold voltage $V_{th}$ can be controlled by adding an impurity element imparting p-type conductivity to a microcrystalline semiconductor layer which functions as a channel-forming region of a thin film transistor at the same time as or after the film formation of the microcrystalline semiconductor layer. A typical example of an impurity element imparting p-type conductivity is boron, and an impurity gas such as $B_2H_6$ or $BF_3$ may be mixed into silicon hydride at a proportion of 1 ppm to 1000 ppm, preferably, 1 ppm to 100 ppm. The concentration of boron in the microcrystalline semiconductor layer may be, for example, $1\times10^{14}$ atoms/cm$^3$ to $6\times10^{16}$ atoms/cm$^3$.

In addition, the oxygen concentration of the microcrystalline semiconductor layer is preferably $1\times10^{19}$ atoms/cm$^3$ or less, more preferably $5\times10^{18}$ atoms/cm$^3$ or less and the nitrogen concentration and the carbon concentration are preferably $5\times10^{18}$ atoms/cm$^3$ or less, more preferably $1\times10^{18}$ atoms/cm$^3$ or less. When concentrations of oxygen, nitrogen, and carbon to be mixed into the microcrystalline semiconductor layer are decreased, a channel-forming region of the microcrystalline semiconductor layer can be prevented from being changed into an n-type semiconductor, Further, when the concentrations of these elements are varied among elements, variations in the threshold voltage $V_{th}$ may occur. Thus, when these concentrations are decreased as much as possible, variations in the threshold voltage $V_{th}$ between elements formed over the substrate can be reduced.

In the case the semiconductor layer 106 is a microcrystalline semiconductor layer, it is formed to a thickness of from 2 nm to 60 nm inclusive, preferably from 10 nm to 30 nm inclusive. When the thickness of the microcrystalline semiconductor layer is in the range of from 2 nm to 60 nm inclusive, a thin film transistor can be made a fully depleted type. In addition, since the formation rate of the microcrystalline semiconductor layer is low, i.e., a tenth to a hundredth of the formation rate of an amorphous semiconductor layer, the semiconductor layer 106 is preferably formed thinly so that throughput can be improved.

Formation of an amorphous semiconductor layer or an amorphous semiconductor layer containing hydrogen, nitrogen or halogen is formed over a surface of the semiconductor layer 106, and thus the surfaces of crystal grains included in the semiconductor layer 106 can be prevented from being natively oxidized.

However, the microcrystalline semiconductor layer and the LPSAS layer have a problem of high off current.

For the reason, the buffer layer 108 is preferably formed to cover the semiconductor layer 106. When the buffer layer 108 is provided, oxidation of the surfaces of crystal grains can be prevented without providing a layer for preventing the native oxidation of crystal grains for the surface of the semiconductor layer 106.

The buffer layer 108 can be formed by forming an amorphous semiconductor layer using the same material as that of the semiconductor layer 106, and etching the amorphous semiconductor layer to be patterned. In the case of using silicon for the amorphous semiconductor layer, the amorphous semiconductor layer can be formed using silicon hydride such as $SiH_4$ or $Si_2H_6$ by a plasma CVD method. Alternatively, with a dilution of silicon hydride described above with one or plural kinds of rare gas elements selected from helium, argon, krypton, or neon, the amorphous semiconductor layer can be formed. When hydrogen at a flow rate which is 1 to 20 times, preferably 1 to 10 times, more preferably 1 to 5 times as high as that of silicon hydride is used, a hydrogen-containing amorphous semiconductor layer can be formed. When a mixed gas of silicon hydride described above and nitrogen or ammonia is used, a nitrogen-containing amorphous semiconductor layer can be formed. When silicon hydride described above and a gas including fluorine, chlorine, bromine or iodine ($F_2$, $Cl_2$, $Br_2$, $I_2$, HF, HCl, HBr, HI or the like) are used, an amorphous semiconductor layer including fluorine, chlorine, bromine or iodine can be formed. Note that instead of silicon hydride, $SiH_2Cl_2$, $SiHCl_3$, $SiCl_4$, $SiF_4$, or the like can be used. Note that the thickness of the amorphous semiconductor layer is from 100 nm to 500 nm inclusive, preferably from 150 nm to 400 nm inclusive, more preferably from 200 nm to 300 nm inclusive.

Alternatively, the buffer layer 108 may be formed using an amorphous semiconductor layer formed by sputtering with hydrogen or a rare gas using an amorphous semiconductor as a target. In this case, when ammonia, nitrogen, or dinitrogen monoxide is contained in the atmosphere, a nitrogen-containing amorphous semiconductor layer can be formed. Alternatively, when a gas including fluorine, chlorine, bromine or iodine ($F_2$, $Cl_2$, $Br_2$, $I_2$, HF, HCl, HBr, HI or the like) is contained in the atmosphere, an amorphous semiconductor layer including fluorine, chlorine, bromine or iodine can be formed.

Alternatively, the buffer layer 108 may be formed by forming an amorphous semiconductor layer on the surface of the semiconductor layer 106 by a plasma CVD method or a sputtering method and then by performing hydrogenation, nitridation, or halogenation of the surface of the amorphous semiconductor layer through processing of the surface of the amorphous semiconductor layer with hydrogen plasma, nitrogen plasma, or halogen plasma. Alternatively, the surface of the amorphous semiconductor layer may be processed with helium plasma, neon plasma, argon plasma, krypton plasma, or the like.

Although the buffer layer 108 is formed using an amorphous semiconductor, preferably, the amorphous semiconductor layer does not contain crystal grains. Therefore, in the case where the buffer layer 108 is formed by a high-frequency plasma CVD method with a frequency of several tens to several hundreds of megahertz or a microwave plasma CVD method, the formation is done so that the amorphous semiconductor layer does not contain crystal grains.

Note that the buffer layer 108 should be formed in such way that an impurity imparting one conductivity type, such as phosphorus or boron cannot be added to the buffer layer 108. In particular, preferably, boron added to the semiconductor layer 106 for controlling the threshold voltage or phosphorus contained in the source and drain regions 110 is not mixed into the buffer layer 108. For example, if the semiconductor layer 106 contains boron and the buffer layer 108 contains phosphorus, a PN junction may be formed between the semiconductor layer 106 and the buffer layer 108. In addition, if the buffer layer 108 contains boron and the source and drain regions 110 contains phosphorus, a PN junction may be formed between the buffer layer 108 and the source and drain regions 110. Alternatively, if the buffer layer 108 contains both boron and phosphorus, a recombination center is generated, which causes leakage current. When the buffer layer 108 does not contain such an impurity imparting one conductivity type, leakage current can be reduced. When the buffer layer 108 which does not contain an impurity element such as phosphorus or boron is provided between the source and drain regions 110 and the semiconductor layer 106, diffusion of the impurity element to the semiconductor layer 106 serving as a channel-forming region and the source and drain regions 110 can be prevented.

The buffer layer 108 may be formed using an amorphous semiconductor containing hydrogen, nitrogen, or halogen. An amorphous semiconductor has a larger energy gap than a microcrystalline semiconductor (the energy gap of an amorphous semiconductor is from 1.6 eV to 1.8 eV inclusive and the energy gap of a microcrystalline semiconductor is from 1.1 eV to 1.5 eV inclusive), has higher electric resistance, and has lower mobility (a fifth to a tenth of that of a microcrystalline semiconductor). Therefore, in a thin film transistor to be formed, preferably, the buffer layer 108 formed between the source and drain regions 110 and the semiconductor layer 106 functions as a high-resistant region, and the semiconductor layer 106 functions as a channel-forming region. Therefore, off current of the thin film transistor can be reduced. When such a thin film transistor is used as a switching element of a liquid crystal display device, the contrast of the liquid crystal display device can be improved.

If the semiconductor layer 106 is oxidized, the mobility of the thin film transistor is decreased, the subthreshold swing thereof is increased, and thus electric characteristics of the thin film transistor become worse. The buffer layer 108 is formed to cover the surface of the semiconductor layer 106, and thus crystal grains (especially, the surface thereof) of the microcrystalline semiconductor layer can be prevented from being oxidized, which leads to suppressing of the deterioration of electric characteristics of the thin film transistor. Either hydrogen or fluorine, or both is contained in a depression portion of the buffer layer 108 (a portion overlapping the channel-forming region of the semiconductor layer 106), and thus oxygen can be effectively prevented from penetrating the buffer layer 108. Thus, oxidation of the semiconductor layer 106 can be prevented more effectively.

The source and drain regions 110 can be formed as follows: an impurity semiconductor layer is formed and then etched. If an n-channel thin film transistor is formed, typically phosphorus may be used as an impurity element, and when a gas including an impurity element imparting an n-type conductivity such as $PH_3$ is added to hydrogenated silicon, the n-channel thin film transistor can be formed. If a p-channel thin film transistor is formed, typically boron may be added as an impurity element, and when a gas including an impurity element imparting a p-type conductivity such as $B_2H_6$ is added to hydrogenated silicon, the p-channel thin film transistor can be formed. The source and drain regions 110 can be formed using microcrystalline semiconductor or amorphous semiconductor. The source and drain regions 110 are formed with a thickness of from 2 nm to 60 nm, inclusive. In other words, the thickness may be in the same degree as that of the semiconductor layer 106. When the source and drain regions 110 are thinned, throughput can be increased.

Figure 5:
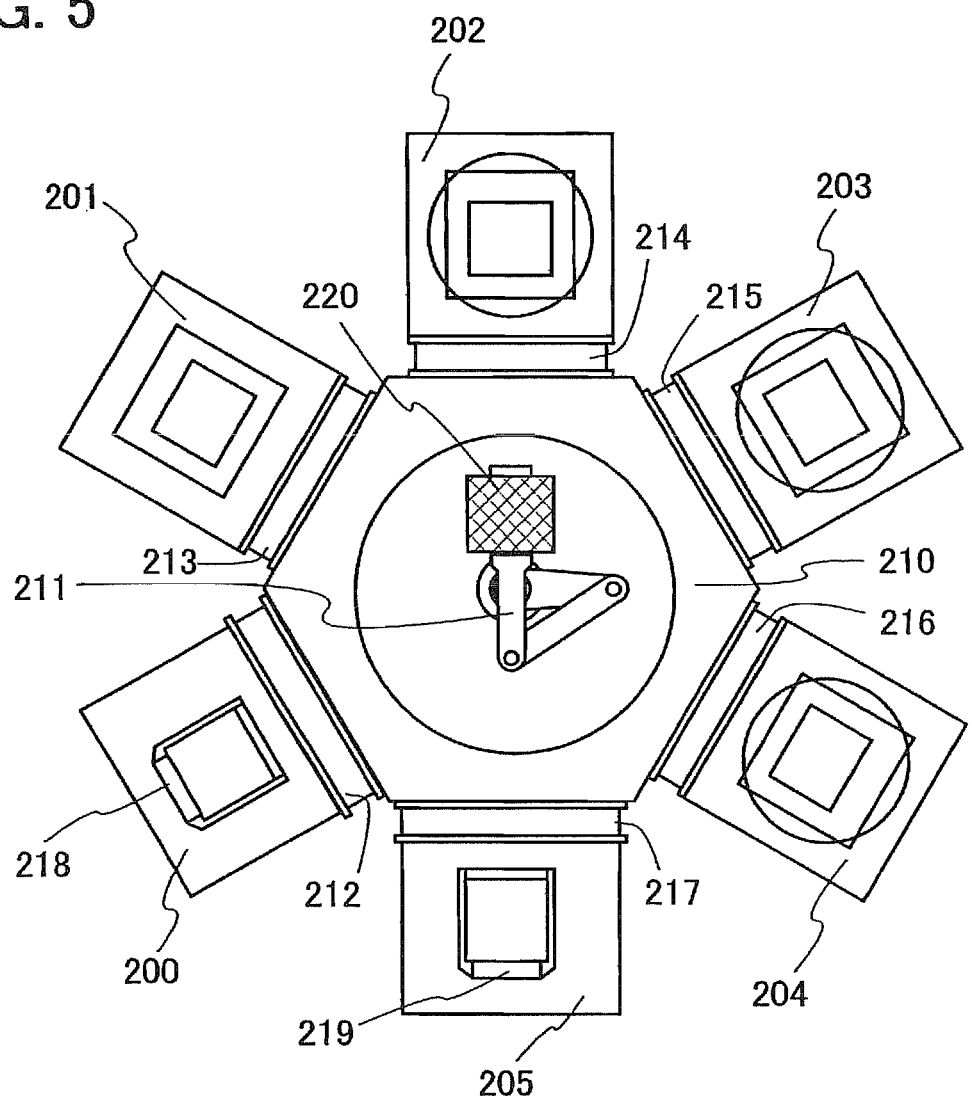
FIG. 5 is a top view of a plasma CVD apparatus used for manufacturing a thin film transistor according to an aspect of the present invention.

In the present invention, as described above, all layers of from the gate insulating layer to the impurity semiconductor layer are preferably formed successively. Here, a microwave plasma CVD apparatus, with which from the gate insulating layer to the impurity semiconductor layer can be formed successively, is described with reference to FIG. 5, for example. FIG. 5 is a schematic diagram showing a top cross section of a microwave plasma CVD apparatus, which includes a loading chamber 200, an unloading chamber 205, and first to fourth reaction chambers 201 to 204 around a common chamber 210 illustrated in the center. Between the common chamber 210 and the other chambers, gate valves 212 to 217 are provided so that processes performed in the chambers do not interfere with each other. Substrates are loaded into a cassette 218 in the loading chamber 200 and a cassette 219 in the unloading chamber 205 and carried to the first to fourth reaction chambers 201 to 204 with a transport means 211 of the common chamber 210. In this apparatus, a reaction chamber can be allocated for each different kind of deposition films, and a plurality of different films can be formed successively without being exposed to air.

In each of the first to fourth reaction chambers 201 to 204, all layers of from the gate insulating layer to the impurity semiconductor layer are stacked. In this case, a plurality of layers of different kinds can be stacked successively by changing of source gases. In this case, after the gate insulating layer is formed, silicon hydride such as silane is introduced into the reaction chambers, residual oxygen and silicon hydride are reacted with each other, and the reactant is exhausted from the reaction chamber, so that the concentration of residual oxygen in the reaction chamber can be decreased. Accordingly, the concentration of oxygen contained in the semiconductor layer 106 can be decreased. In addition, crystal grains contained in the semiconductor layer 106 can be prevented from being oxidized.

Alternatively, the insulating layer, the microcrystalline semiconductor layer, and the amorphous semiconductor layer are formed in each of the first reaction chamber 201 and the third reaction chamber 203, and the source and drain regions 110 are formed in each of the second reaction chamber 202 and the fourth reaction chamber 204. By forming the source and drain regions 110 alone, an impurity element imparting one conductivity type which remains in the chamber can be prevented from being mixed into another layer.

When a microwave plasma CVD apparatus to which a plurality of chambers are connected as shown in FIG. 5 is used, from the gate insulating layer to the impurity semiconductor layer can be formed successively. Thus, mass productivity (yield) can be improved. In addition, even when maintenance or cleaning is performed on any of reaction chambers, a film formation process can be performed in other reaction chambers, so that take time for film formation can be shortened. Further, each interface between stacked layers can be formed without being contaminated by an atmospheric constituent or a contaminant impurity element floating in the atmosphere. Thus, variations in electric characteristics of thin film transistors can be reduced.

Alternatively, the insulating layer can be formed in the first reaction chamber 201, the microcrystalline semiconductor layer and the amorphous semiconductor layer can be formed in the second reaction chamber 202, and the source and drain regions 110 can be formed in the third reaction chamber 203. Alternatively, since the formation rate of a microcrystalline semiconductor layer is low, microcrystalline semiconductor layers may be formed in a plurality of reaction chambers. For example, the gate insulating layer may be formed in the first reaction chamber 201, the microcrystalline semiconductor layers may be formed in the second reaction chamber 202 and the third reaction chamber 203, the amorphous semiconductor layer may be formed in the fourth reaction chamber 204, and the impurity semiconductor layer may be formed in a fifth reaction chamber (not shown). In this manner, when the microcrystalline semiconductor layers are formed at the same time in a plurality of reaction chambers, throughput on forming thin film transistors can be improved. In this case, the inner wall of each reaction chamber is preferably coated with a film of the same kind as a film to be formed therein.

When a microwave plasma CVD apparatus having the structure shown in FIG. 5 is used, layers with similar kinds of compositions or a layer with one kind of composition can be formed in each reaction chamber and can be formed successively without being exposed to air. Therefore, stacked layers can be formed without contamination of each interface thereof by a residue of formed layers or an impurity element floating in the atmosphere.

Note that the microwave plasma CVD apparatus shown in FIG. 5 is provided with the loading chamber and the unloading chamber separately, which may be a single loading/unloading chamber. In addition, the microwave plasma CVD apparatus may be provided with a spare chamber. When a substrate is preheated in the spare chamber, heating time needed before film formation in each reaction chamber can be shortened. Thus, throughput can be improved.

Next, a film formation process is described specifically. In the film formation process, a gas to be supplied from a gas supply portion may be selected depending on the purpose.

Here, a case where the first insulating layer 104 is formed with a two-layer structure is described. A method in which a silicon oxynitirde layer is formed and a silicon nitride oxide layer is formed thereover, as the gate insulating layer 104, is described as an example.

First, the inside of a processing container in a reaction chamber of the microwave plasma CVD apparatus is cleaned with fluorine radicals. Note that the inside of the reaction chamber can be cleaned by introducing, into the reaction chamber, fluorine radicals, which are generated by introducing a gas of carbon fluoride, nitrogen fluoride, or fluorine into a plasma generator provided outside the reaction chamber and dissociating the gas.

When a large amount of hydrogen is introduced into the reaction chamber after the inside of the reaction chamber is cleaned with fluorine radicals, residual fluorine inside the reaction chamber can be reacted with hydrogen, so that the concentration of residual fluorine can be decreased. Thus, the amount of fluorine to be mixed into a protective layer which is to be formed later on the inner wall of the reaction chamber can be decreased, and the thickness of the protective layer can be decreased.

Next, on the surface of the inner wall of the processing container in the reaction chamber, or the like, a silicon oxynitride layer is deposited as the protective layer. Here, the pressure in the processing container is 1 Pa to 200 Pa, preferably 1 Pa to 100 Pa, and one or more kinds of rare gases such as helium, argon, xenon, and krypton is/are introduced as a plasma ignition gas. Further, hydrogen is introduced in addition to any one kind of rare gases. In particular, helium is preferable as a plasma ignition gas, more preferably, a mixed gas of helium and hydrogen is used as a plasma ignition gas.

Although helium has a high ionization energy of 24.5 eV, it has a metastable state at about 20 eV. Thus, helium can be ionized at about 4 eV during discharge. Therefore, a threshold voltage of discharge inception is low and discharge can be maintained easily. Accordingly, generated plasma can be maintained uniformly, and power can be saved.

Alternatively, as the plasma ignition gas, an oxygen gas may be further introduced. When an oxygen gas as well as a rare gas is introduced into the processing container, plasma ignition can be facilitated.

Next, a microwave generating apparatus is turned on and the output of the microwave generating apparatus is from 500 W to 6000 W inclusive, preferably from 4000 W to 6000 W inclusive to generate plasma. Then, a source gas is introduced into the processing container through a gas pipe. Specifically, when silane, dinitrogen monoxide, and ammonia are introduced as source gases, a silicon nitride oxide layer is formed as the protective layer on the inner wall of the processing container and on the surfaces of the gas pipe, a dielectric plate, and a support base. Note that nitrogen may be introduced as a source gas instead of ammonia. The protective layer is formed to have a thickness of from 500 nm to 2000 nm inclusive.

Next, supply of the source gas is stopped, the pressure in the processing container is decreased, and the microwave generating apparatus is turned off. After that, a substrate is set on the support base in the processing container.

Next, through a process which is similar to that of the protective layer, a silicon oxynitride layer is deposited over the substrate as the gate insulating layer 104.

After the silicon oxynitride layer is deposited to a predetermined thickness, supply of the source gas is stopped, the pressure in the processing container is decreased, and the microwave generating apparatus is turned off.

Next, the pressure in the processing container is from 1 Pa to 200 Pa inclusive, preferably from 1 Pa to 100 Pa inclusive, and one or more kinds of rare gases such as helium, argon, xenon, and krypton as a plasma ignition gas, and dinitrogen monoxide, a rare gas, and silane as source gases are introduced. Then, the microwave generating apparatus is turned on, and the output of the microwave generating apparatus is from 500 W to 6000 W inclusive, preferably from 4000 W to 6000 W inclusive to generate plasma. Next, the source gas is introduced into the processing container through the gas pipe, and a silicon oxynitride layer is formed over the silicon nitride oxide layer over the substrate. Then, supply of the source gas is stopped, the pressure in the processing container is decreased, the microwave generating apparatus is turned off, and the film formation process is finished.

Through the above-described process, the silicon nitride oxide layer is formed as the protective layer on the inner wall of the reaction chamber, and the silicon nitride oxide layer and the silicon oxynitride layer are successively formed over the substrate, so that mixture of an impurity element into the silicon oxynitride layer on the upper layer side can be suppressed. When the above-mentioned layers are formed by a microwave plasma CVD method using a power supply apparatus capable of generating a microwave, plasma density can be made higher and dense layers are formed. Therefore, films having high withstand voltage can be formed. When the films are used as gate insulating layers of thin film transistors, variations in the threshold voltage of the thin film transistors can be suppressed. In addition, the number of defects measured by BT (bias temperature) test can be reduced so that yield can be improved. Further, resistance to static electricity is increased, and a thin film transistor which is not easily damaged even when high voltage is applied thereto can be manufactured. Furthermore, a thin film transistor which is not easily damaged over time can be manufactured. Moreover, a thin film transistor with few hot carrier damages can be manufactured.

In a case where the gate insulating layer 104 is formed with a single layer of the silicon oxynitride layer formed by using the microwave plasma CVD method, the above-described formation method of the protective layer and the formation method of the silicon oxynitride layer are used. In particular, when the flow ratio of dinitrogen monoxide to silane is 100:1 to 300:1, preferably 150:1 to 250:1, a silicon oxynitride layer having high withstand voltage can be formed.

Next, a film formation process is described in which a microcrystalline semiconductor layer formed by a microwave plasma CVD method and an amorphous semiconductor layer functioning as a buffer layer are successively formed. First, in a manner similar to the formation of the insulating layer, the inside of the reaction chamber is cleaned. Next, a silicon layer is deposited as a protective layer inside the processing container. As the silicon layer, an amorphous silicon layer is formed to a thickness of from 0.2 μm to 0.4 μm inclusive. Here, the pressure in the processing container is 1 Pa to 200 Pa, preferably 1 Pa to 100 Pa, and one or more kinds of rare gases such as helium, argon, xenon, and krypton is introduced as a plasma ignition gas. Note that hydrogen may be introduced together with the rare gas.

Then, the microwave generating apparatus is turned on, and the output of the microwave generating apparatus is from 500 W to 6000 W inclusive, preferably from 4000 W to 6000 W inclusive to generate plasma. Next, a source gas is introduced into the processing container through the gas pipe. Specifically, when a silicon hydride gas and a hydrogen gas are introduced as source gases, a microcrystalline silicon layer is formed as a protective layer on the inner wall of the processing container and on the surfaces of the gas pipe, the dielectric plate, and the support base. Alternatively, a microcrystalline semiconductor layer can be formed from a dilution of a silicon hydride gas and a hydrogen gas with one or more kinds of rare gas elements selected from helium, argon, krypton, and neon. Here, the flow ratio of hydrogen to silicon hydride is 5:1 to 200:1, preferably 50:1 to 150:1, more preferably about 100:1. In addition, the thickness of the protective layer at this time is from 500 nm to 2000 nm inclusive. Note that before the microwave generating apparatus is turned on, a silicon hydride gas and a hydrogen gas may be introduced into the processing container in addition to the above-mentioned rare gas.

Alternatively, an amorphous semiconductor layer as the protective layer can be formed with a dilution of a silicon hydride gas with one or more kinds of rare gas elements selected from helium, argon, krypton, and neon.

Then, supply of the source gas is stopped, the pressure in the processing container is decreased, and the microwave generating apparatus is turned off. After that, the substrate is introduced onto the support base in the processing container.

Next, hydrogen plasma treatment is performed on the surface of the gate insulating layer 104 which is formed over the substrate as described above. When hydrogen plasma treatment is performed before the microcrystalline semiconductor layer is formed, lattice distortion at the interface between the gate insulating layer 104 and the semiconductor layer 106 can be reduced, and interface characteristics between the gate insulating layer 104 and the semiconductor layer 106 can be improved. Thus, electric characteristics of a thin film transistor which is to be formed can be improved.

In the above hydrogen plasma treatment, hydrogen plasma treatment is also performed on the amorphous silicon layer which is formed as the protective layer inside the processing container, so that the protective layer is etched and a slight amount of silicon is deposited on the surface of the gate insulating layer 104. The slight amount of silicon serves as nuclei of crystal growth, and with the nuclei, the microcrystalline semiconductor layer is deposited. Accordingly, lattice distortion at the interface between the gate insulating layer 104 and the semiconductor layer 106 can be decreased, and interface characteristics between the gate insulating layer 104 and the semiconductor layer 106 can be improved. Therefore, electric characteristics of a thin film transistor which is to be formed can be improved.

Next, in a manner similar to that of the protective layer, a microcrystalline semiconductor material is deposited over the substrate. The thickness of the microcrystalline semiconductor layer is from 2 nm to 50 nm inclusive, preferably from 10 nm to 30 nm inclusive. Note that microcrystalline silicon is used as the microcrystalline semiconductor.

Note that crystals of the microcrystalline silicon layer grow from a bottom portion of the layer toward an upper portion of the layer and needle-like crystals are formed. This is because crystals grow to increase a crystal surface. However, even when crystal growth occurs in this manner, the formation rate of the microcrystalline silicon layer is from about 1% to 10% of the formation rate of an amorphous silicon layer. Therefore, the microcrystalline silicon layer is preferably formed thinly to increase throughput.

After the microcrystalline silicon layer is deposited to a predetermined thickness, supply of the source gases is stopped, the pressure in the processing container is decreased, the microwave generating apparatus is turned off, and the film formation process for the microcrystalline silicon layer is finished.

Next, laser light is delivered to the microcrystalline silicon layer from the surface side thereof.

As for the formation of a microcrystalline silicon layer in the present invention, after the microcrystalline silicon layer is deposited over the gate insulating layer, laser light may be delivered to the microcrystalline silicon layer from the surface side thereof.

The laser light can be act on an interface between the microcrystalline silicon layer and the gate insulating layer. Thus, crystallization growth proceeds from the surface toward the interface between the microcrystalline silicon layer and the gate insulating layer with crystals formed on the surface side of the microcrystalline silicon layer used as nuclei, and a columnar-like crystal is formed. The crystallization growth by the LP does not increase a crystal grain size but improves crystallinity in the thickness direction of the layer.

In the LP, when a laser beam is condensed in a long rectangular shape (is shaped into a linear laser beam), a microcrystalline silicon layer formed over a glass substrate having a size of 730 mm×920 mm can be processed by one scanning of a laser beam. In this case, the LP is performed with a ratio of overlapping linear laser beams (an overlapping ratio) of 0 to 98%, preferably 85 to 95%. By scanning in this manner, treatment time for one substrate is shortened, so that productivity can be improved. Note that the shape of a laser beam is not limited to a linear shape, and similar treatment can be performed when the shape of a laser beam is a plane shape. Further, the LP is not limited by the size of the glass substrate, and the LP treatment can be used for substrates with various sizes. When the LP is performed, crystallinity of a region in the vicinity of the interface between the microcrystalline semiconductor layer and the gate insulating layer is improved, so that electric characteristics of a transistor having a bottom-gate structure is improved.

By the above-described growth, unevenness (referred to as a ridge, and is a convex portion) of a surface generated in a conventional low-temperature polysilicon is not produced and thus excellent smoothness of silicon surface which has been subjected to LP can be kept.

Therefore, an LPSAS layer which is obtained by directly delivering laser light to a deposited amorphous silicon layer has growth mechanism and film quality which are greatly different from those of a microcrystalline silicon layer as deposited in a conventional technique or a microcrystalline silicon layer modified by conduction heating (see Reference 5). Note that this is just one of the present invention, and as described above, a microcrystalline semiconductor layer formed without being subjecting to the LP may be used.

After the LPSAS layer is formed, an amorphous semiconductor layer is formed at a temperature of from 280° C. to 400° C. inclusive by a plasma CVD method. By depositing an amorphous semiconductor layer containing hydrogen over the LPSAS layer, hydrogen is diffused into the LPSAS layer so that a dangling bond can be terminated.

Next, the pressure in the processing container is reduced so as to adjust the flow rate of a source gas. Specifically, the flow rate of a hydrogen gas is much more decreased than that of the film formation condition of the microcrystalline semiconductor layer. Typically, a hydrogen gas at a flow rate which is 1 to 200 times, preferably 1 to 100 times, more preferably 1 to 50 times as high as that of silicon hydride is introduced. Alternatively, a silicon hydride gas may be introduced into the processing container without introducing a hydrogen gas into the processing chamber. When the flow rate of hydrogen to silicon hydride is decreased in this manner, the formation rate of the amorphous semiconductor layer which is formed as a buffer layer can be increased. Alternatively, a silicon hydride gas is diluted with one or more kinds of rare gas elements selected from helium, argon, krypton, and neon. Then, the microwave generating apparatus is turned on, and the output of the microwave generating apparatus is 500 W to 6000 W inclusive, preferably 4000 W to 6000 W inclusive to generate plasma. Thus, an amorphous semiconductor layer can be formed. Since the formation rate of an amorphous semiconductor layer is higher than that of a microcrystalline semiconductor layer, the pressure in the processing container can be set low. The thickness of the amorphous semiconductor layer at this time may be from 100 nm to 400 nm inclusive.

After the amorphous semiconductor layer is deposited to a predetermined thickness, supply of the source gas is stopped, the pressure in the processing container is decreased, the microwave generating apparatus is turned off, and the film formation process of the amorphous semiconductor layer is finished.

Note that the semiconductor layer 106 and the amorphous semiconductor layer serving as the buffer layer 108 may be formed while plasma is ignited. Specifically, the semiconductor layer 106 and the amorphous semiconductor layer serving as the buffer layer 108 may be stacked with the flow rate of hydrogen to silicon hydride gradually decreased. With such a method, an impurity is not deposited at an interface between the semiconductor layer 106 and the buffer layer 108 and thus an interface with little distortion can be formed. Thus, electric characteristics of a thin film transistor to be formed later can be improved.

Plasma which is generated by a microwave plasma CVD apparatus with a frequency of 1 GHz or more has high electron density and many radicals are generated from a source gas and are supplied to the substrate. Thus, radical reaction on the substrate surface is promoted and the formation rate of the microcrystalline semiconductor can be increased. Further, a microwave plasma CVD apparatus which includes a plurality of microwave generating apparatuses and a plurality of dielectric plates can generate large-area plasma stably. Therefore, even if a large-area substrate is used, a layer having uniform film quality can be formed over the large-area substrate and mass productivity (yield) can be improved.

In addition, when the microcrystalline semiconductor layer and the amorphous semiconductor layer are successively formed in the same processing container, an interface with little distortion can be formed and an atmosphere component which may be mixed into an interface can be reduced, which is preferable.

Note that in the manufacturing steps of the insulating layer and semiconductor layers, when a protective layer having a thickness of 500 nm to 2000 nm is formed on the inner wall of the reaction chamber, the cleaning treatment and the formation of a protective layer can be omitted.

Figure 2A:
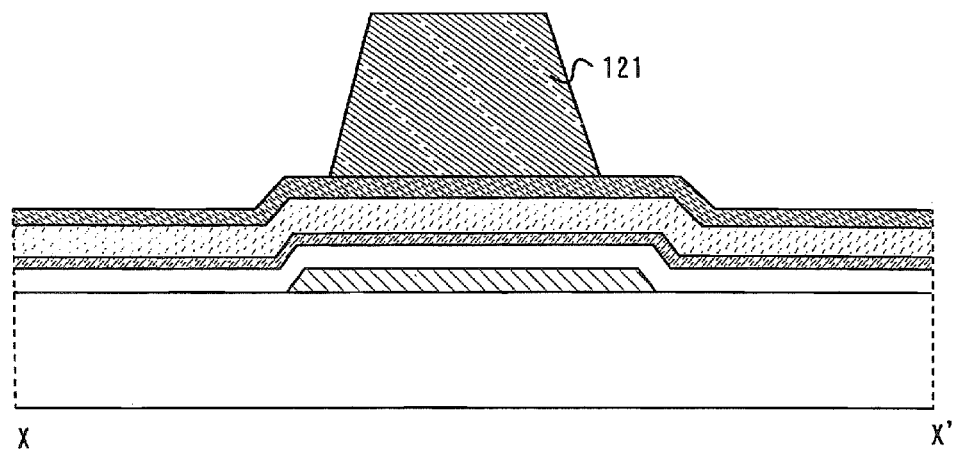
FIGS. 2A to 2C illustrate an example of a method for manufacturing a thin film transistor according to an aspect of the present invention.

Next, the resist mask 121 is formed over the impurity semiconductor layer (see FIG. 2A). The resist mask 121 is formed by a photolithography method or an inkjet method.

Figure 2B:
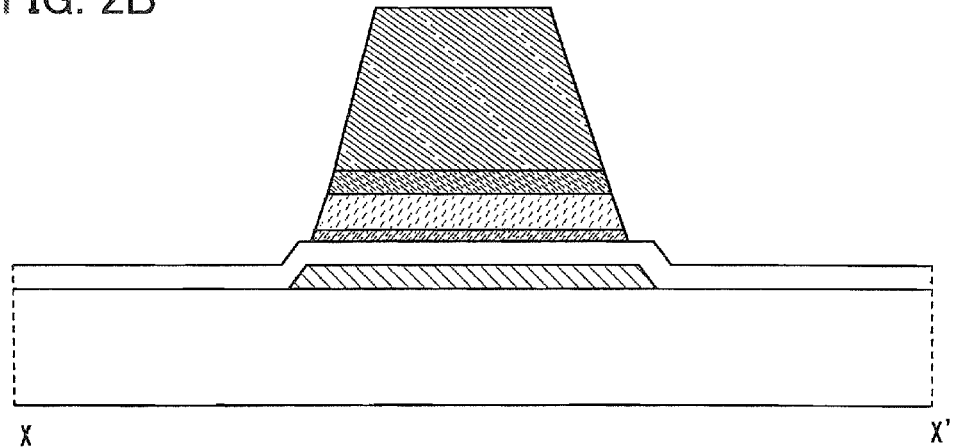

Next, the microcrystalline semiconductor layer, the amorphous semiconductor layer and the impurity semiconductor layer are etched using the resist mask 121. With this treatment, the semiconductor layer 106, the buffer layer 108, and the source and drain regions 110 are separated for each element (see FIG. 2B). Then, the resist mask 121 is removed.

Note that the etching is performed so that a side face of a layer where the microcrystalline semiconductor layer, the amorphous semiconductor, and the impurity semiconductor layer ate stacked has a tapered shape. The taper angle is from 30° to 90° inclusive, preferably from 40° to 80° inclusive.

In addition, when the side face has a tapered shape, coverage with a layer to be formed thereover (e.g., a wiring layer) in a later step can be improved. Therefore, disconnection or the like at a step portion can be prevented.

Figure 6:
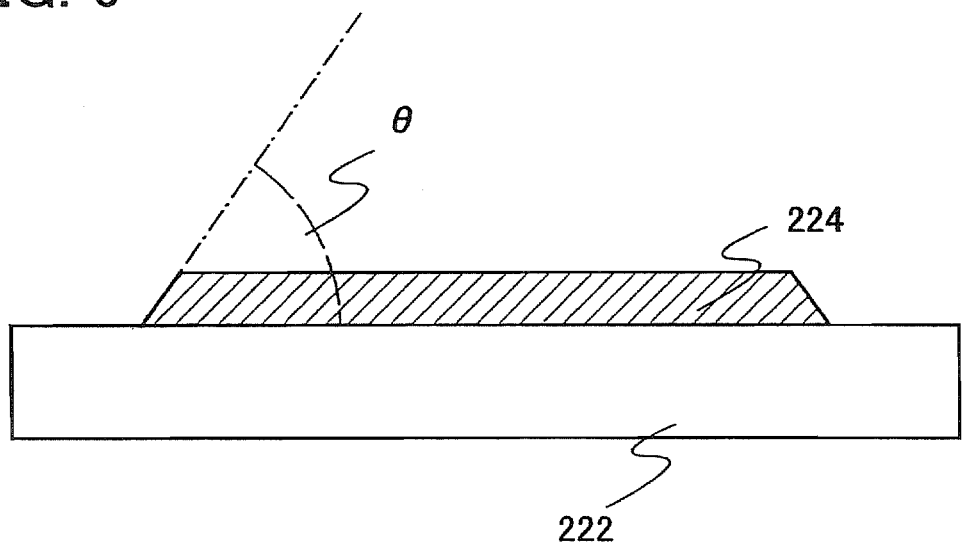
FIG. 6 is a view in which a "taper angle" in this specification is defined.

Note that the "taper angle" refers to an angle θ shown in FIG. 6. In FIG. 6, a layer 224 having a tapered side face is formed over a substrate 222. The taper angle of the layer 224 is θ.

Figure 2C:
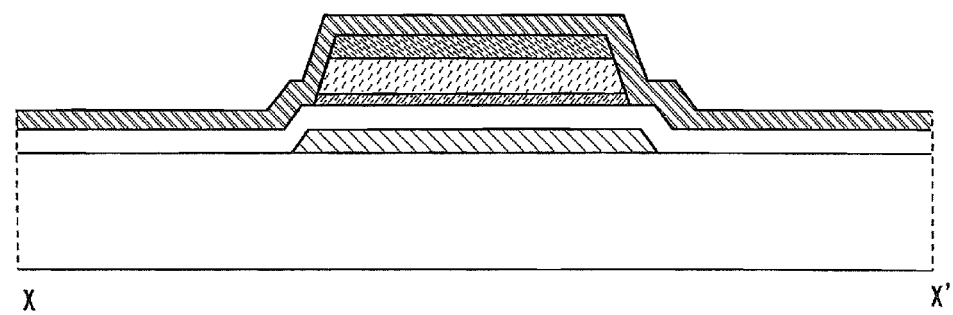

Next, a conductive layer is formed over the impurity semiconductor layer and the gate insulating layer 104 (FIG. 2C).

The conductive layer can be formed of a single-layer structure or a stacked-layer structure of aluminum, copper, titanium, neodymium, scandium, molybdenum, chromium, tantalum, tungsten or the like. An aluminum alloy to which an element to prevent a hillock is added (e.g., an Al—Nd alloy which can be used for the gate electrode layer 102) may be used. Alternatively, crystalline silicon to which an impurity element imparting one conductivity type is added may be used. The conductive layer may have a stacked-layer structure where a layer on the side which is in contact with the crystalline silicon to which an impurity imparting one conductivity type is added is formed using titanium, tantalum, molybdenum, tungsten, or nitride of any of these elements and aluminum or an aluminum alloy is formed thereover. Further alternatively, the conductive layer 111 may have a stacked-layer structure where an upper side and a lower side of aluminum or an aluminum alloy is provided with titanium, tantalum, molybdenum, tungsten, or nitride of any of these elements so as to be sandwiched. For example, the conductive layer preferably has a three-layer structure in which an aluminum layer is sandwiched with molybdenum layers.

The conductive layer is formed by a sputtering method or a vacuum evaporation method. Alternatively, the conductive layer may be formed by discharge of a conductive nanopaste of silver, gold, copper, or the like by using a screen printing method, an inkjet method, or the like and by baking the conductive nanopaste.

Figure 3A:
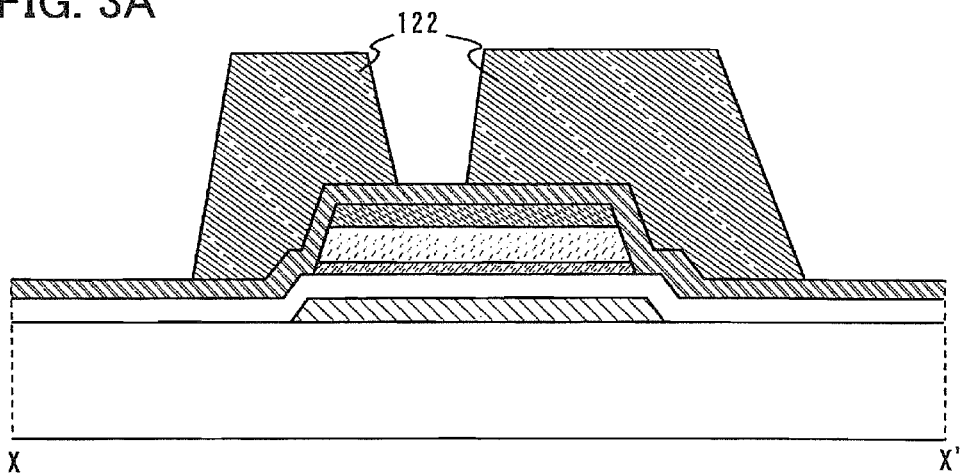
FIGS. 3A to 3C illustrate an example of a method for manufacturing a thin film transistor according to an aspect of the present invention.

Then, a resist mask 122 is formed over the conductive layer (FIG. 3A). The resist mask 122 is formed by a photolithography method or an inkjet method, similar to the resist mask 121. Here, $O_2$ plasma ashing may be conducted to control the size of the resist mask.

Figure 3B:
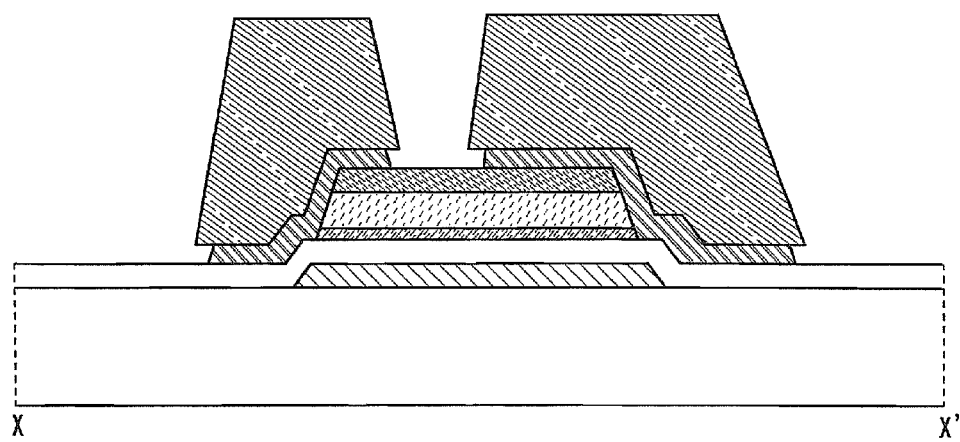

Then, the conductive layer is etched using the resist mask 122 to be patterned (FIG. 3B). The patterned conductive layers serve as source and drain electrodes. The etching is preferably wet etching. By wet etching, the side faces of the conductive layers are selectively etched. As a result, the side faces of the conductive layers recede inward, so that source and drain electrode layers 112 are formed. In the case, the side faces of the source and drain electrode layers 112 are not aligned with the side faces of the impurity semiconductor layers, and the side faces of the impurity semiconductor layers are located outside the side faces of the source and drain electrode layers 112. The source and drain electrode layers 112 serving as the source and drain electrodes also constitute a part of a signal line.

Figure 3C:
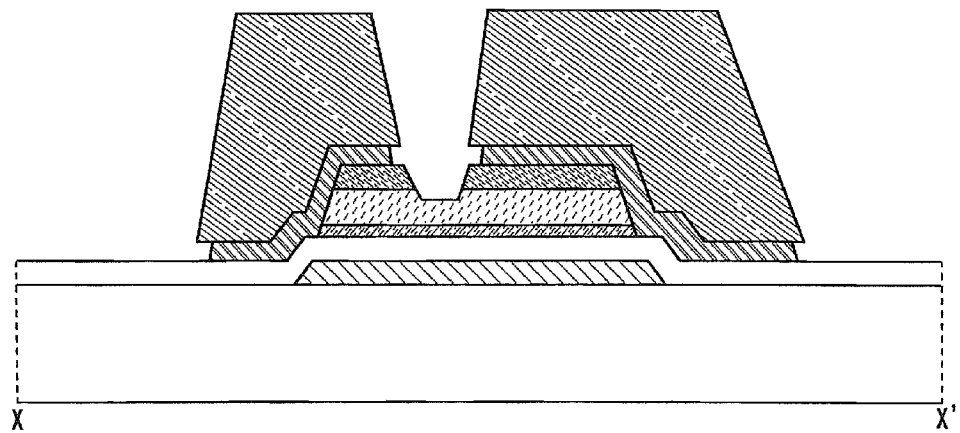

Next, the impurity semiconductor layer and the amorphous semiconductor layer are etched with the resist mask 122 formed thereover, so that a back channel portion is formed (FIG. 3C). Note that the amorphous semiconductor layer is etched to leave a part thereof, and the surface of the semiconductor layer 106 is covered with the amorphous semiconductor layer. By etching the amorphous semiconductor layer, the buffer layer 108 is formed.

The buffer layer 108 has a depression portion which is formed when part of the buffer layer 108 is etched in forming the source and drain regions. The buffer layer 108 is preferably formed to a thickness such that part of the buffer layer 108 overlapping with the depression portion remains after etching. Preferably, the thickness of a remaining portion after the etching (the portion overlapping with the depression portion) is approximately half the thickness before the etching. Note that the thickness before the etching is 100 nm to 500 nm inclusive, preferably 150 nm to 400 nm inclusive, more preferably 200 nm to 300 nm inclusive. Note that since the thickness of part of the buffer layer 108 overlapping with the source and drain regions 110 has a thickness thereof is 100 nm to 500 nm inclusive, preferably 150 nm to 400 nm inclusive, more preferably 200 nm to 300 nm inclusive, since the buffer layer 108 in the part is not etched in formation of the source and drain regions 110. When an amorphous semiconductor layer serving as the buffer layer 108 is sufficiently thick as described above, the semiconductor layer 106 can be formed stably. In this manner, the buffer layer 108 serves as an etching stopper for the semiconductor layer 106.

Figure 4A:
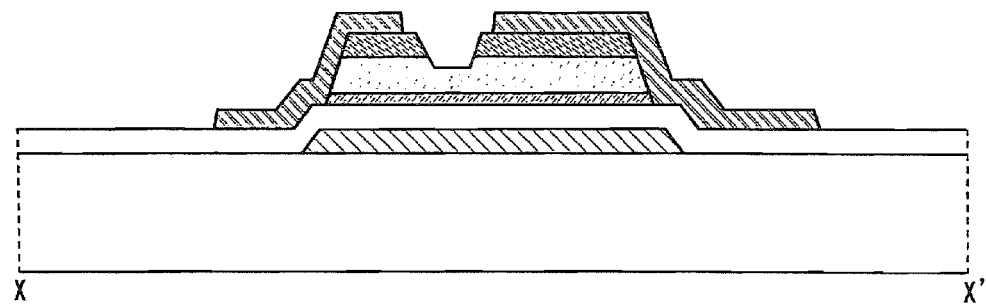
FIGS. 4A to 4C illustrate an example of a method for manufacturing a thin film transistor according to an aspect of the present invention.

Next, the resist mask 122 is removed (FIG. 4A).

As described above, the buffer layer 108 is provided in the thin film transistor formed using the microcrystalline semiconductor layer, so that etching residue can be prevented from mixing into the semiconductor layer 106. However, residual product caused by the etching process, residue of the resist mask and substances that may be contamination sources in an apparatus, which has been used for removal of the resist mask are attached or deposited over the buffer layer 108 between the source region and the drain region. Thus, by electric conduction through the product, residue and substances, off current is increased in many elements, which leads to variation between the elements over the same substrate in many cases. This trend is apparent especially when a remover including sulfur is used in removing the resist mask.

Therefore, in order to solve the above problem, dry etching is conducted. By dry etching, insulation between the source region and drain region can be secured. The etching condition is set such that the exposed amorphous semiconductor layer is not damaged and the etching rate to the amorphous semiconductor layer is low. In other words, a condition which gives almost no damages to the surface of the exposed amorphous semiconductor layer and does not reduce the thickness of the amorphous semiconductor layer may be applied. At this time, a gas used for forming the back channel (e.g., a chlorine gas) may be used as the etching gas. An inductively-coupled plasma etching method is preferably employed for the etching. As an example of the etching condition, the gas flow rate is 30 sccm, the pressure of a chamber is 0.67 Pa, the temperature of a lower electrode is −10° C., the temperature of the side wall of the chamber is about 80° C., and an RF power (13.56 MHz) of 2000 W is applied to a coiled electrode to generate plasma while no power is applied to a substrate side (i.e., 0 W, non-biased). On the condition, etching may be conducted for thirty seconds. By this etching, sulfur or the like included in the remover is removed, for example.

There is no particular limitation on an etching method and a capacitively coupled plasma (CCP) method, an electron cyclotron resonance (ECR) method, or a reactive ion etching (RIE) method, or the like can be used, as well as an inductively coupled plasma (ICP) method.

Note that the dry etching is preferably conducted by a discontinuous discharge (pulsed discharge), not by continuous discharge. More preferably, a repetition pulse discharge is conducted. Since dry etching is conducted using pulse discharge, charge-up damage generated in the back channel portion which is subjected to etching can be reduced. By reducing the charge-up damages in the back channel portion, leakage current can be reduced between the source electrode and the drain electrode. Accordingly, by pulsed discharge, off current can be more reduced and thus switching characteristics can be improved. Therefore, the effect of the present invention can be more advantageous.

Figure 4B:
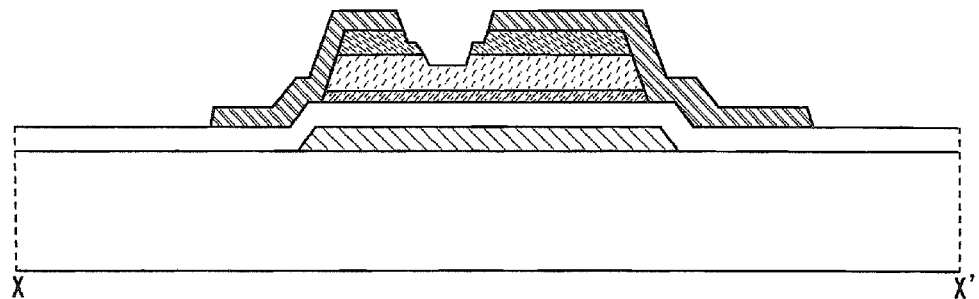

The above-described etching can remove residue and the like existing over the buffer layer 108 between the source region and the drain region. In addition, by this etching process, the impurity semiconductor layer not overlapping with the source and drain electrode layers 112 is also slightly etched. In the above etching condition, the impurity semiconductor layer is etched for example, 0 nm to 5 nm deep in many cases. Accordingly, in the thin film transistor formed according to the present invention, a side face (an inner side face) of an upper portion (first portion) of the source and drain regions 110 exists in the same as or substantially the same plane as a side face of the source and drain electrode layers 112, and a side face (an inner side face) of a lower portion (second portion) of the source and drain regions 110 exists in the same as or substantially the same plane as a side face of the buffer layer (FIG. 4B). By this etching process, the impurity semiconductor layer may be nearly stepwise-shaped in some cases.

In addition, as described above, since the side faces of the source and drain electrode layers 112 are not aligned with the side faces of the source and drain regions 110, the distance between the source electrode and the drain electrode is sufficiently long. Thus, leakage current can be reduced and short-circuit can be prevented. Further, since the side faces of the source and drain electrode layers 112 are not aligned with the side faces of the source and drain regions 110, electric field concentration hardly occurs in the side faces of the source and drain electrode layers 112 and the side faces of the source and drain regions 110. Further, by the buffer layer 108 which is a high-resistant region, the distance between the gate electrode layer 102 and the source and drain electrode layers 112 is sufficiently large. Therefore, generation of parasitic capacitance can be suppressed and leakage current can be reduced, so that a thin film transistor which has high reliability, small off current, and high withstand voltage can be formed.

Through the above-mentioned process, a channel-etched thin film transistor of the present invention can be formed.

Figure 4C:
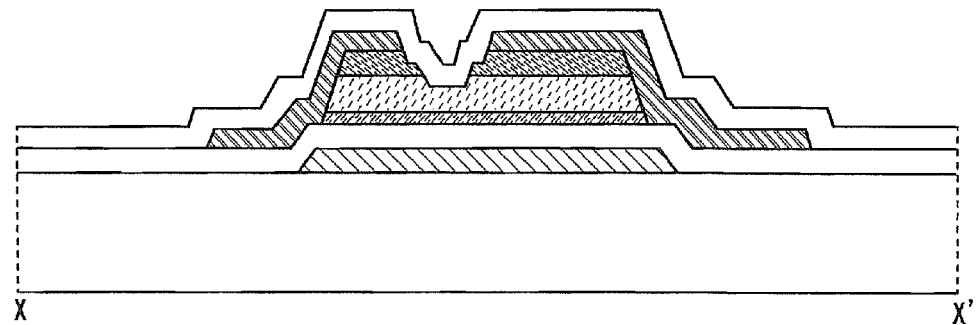

Next, the insulating layer 114 is formed over the source and drain electrode layers 112, the source and drain regions 110, the semiconductor layer 106, and the gate insulating layer 104 (FIG. 4C). Note that the insulating layer 114 can be formed in a manner similar to the gate insulating layer 104. The insulating layer 114 is preferably a dense silicon nitride layer such that entry of a contaminant impurity such as an organic substance, a metal substance, or moisture floating in the atmosphere can be prevented. In addition, the carbon, nitrogen and oxygen concentrations in the buffer layer 108 is preferably $1 \times 10^{19}$ atoms/cm$^3$ or less, more preferably $5 \times 10^{18}$ atoms/cm$^3$ or less.

Note that the thin film transistor illustrated in FIG. 1 serves as a pixel transistor, and thus one of the source electrode and the drain electrode is connected to the pixel electrode. In the thin film transistor illustrated in FIG. 1, one of the source electrode and the drain electrode is connected to the pixel electrode layer 118 though the opening portion 116 provided in the insulating layer 114.

The pixel electrode layer 118 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition including a conductive high molecule (also referred to as a conductive polymer) can be used for the pixel electrode layer 118. The pixel electrode layer 118 formed using such a conductive composition preferably has a sheet resistance of 10000 Ω/cm$^2$ or less and a light transmittance of 70% or higher at a wavelength of 550 nm. Note that resistance of the conductive high molecule included in the conductive composition is preferably 0.1 Ω·cm or lower.

As such a conductive high molecule, so-called π electron conjugated conductive high-molecule can be used. For example, polyaniline and/or a derivative thereof, polypyrrole and/or a derivative thereof, polythiophene and/or a derivative thereof, and a copolymer of two or more kinds of those materials can be given.

The pixel electrode layer 118 may be formed in a manner similar to the source and drain electrode layers 112 or the like, in other words, a conductive layer is entirely formed and etched using a resist mask or the like to be patterned.

Note that in the above description, the gate electrode and the scan line are formed in the same process and the source and drain electrodes and the signal line are formed in the same process. However, the present invention is not limited to the description. The electrodes and wirings connected to the electrodes may be formed in a separate process.

As described above in this embodiment mode, a thin film transistor with less leakage current between the source and drain electrodes and high withstand-voltage can be manufactured according to the present invention. The thin film transistor manufactured as described above can have excellent electric characteristics. Even when such thin film transistors are formed over a large-size substrate, variation between elements formed over the same substrate can be reduced.

In addition, as described above, the thin film transistor in this embodiment mode can have excellent switching characteristics. Thus, with use of the thin film transistor as a pixel transistor, a display device having high contrast ratio can be manufactured.

(Embodiment Mode 2)

In Embodiment Mode 2, a method for manufacturing a thin film transistor of the present invention, which is different from that of Embodiment Mode 1, is described with reference to drawings. Specifically, no resist mask is used in forming a back channel, and a back channel is formed using source and drain electrode layers as a mask.

One mode of the method for manufacturing a thin film transistor of the present invention is described with reference to FIGS. 7A to 7C and FIGS. 8A and 8B.

Figure 7A:
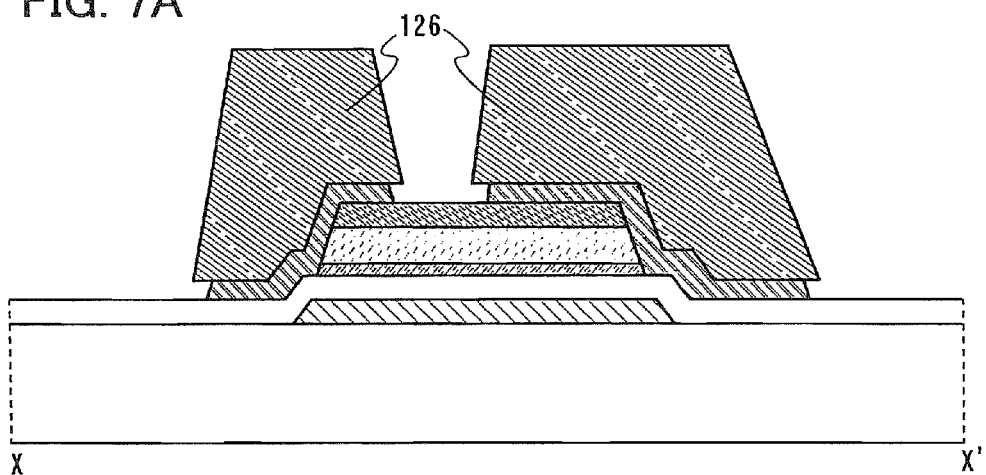
FIGS. 7A to 7C illustrate an example of a method for manufacturing a thin film transistor according to an aspect of the present invention.

First, steps up to and including the etching of a conductive layer serving as source and drain electrodes are conducted (FIG. 7A). FIG. 7A is similar to FIG. 3A. By this step, the source and drain electrodes are formed. In etching the conductive layer, a resist mask 126 is used.

Figure 7B:
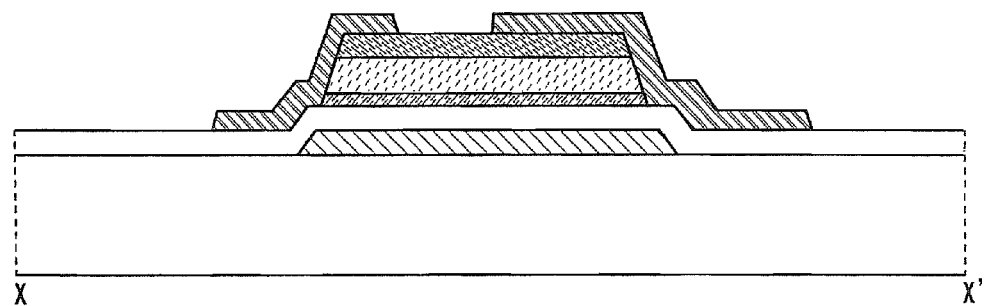
Figure 7C:
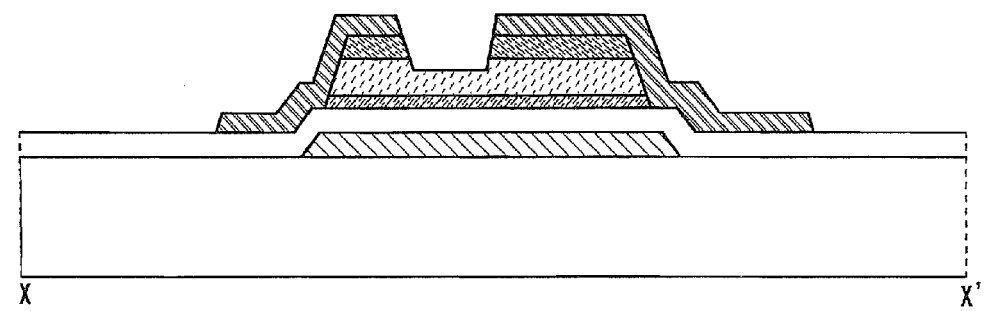

After that, the resist mask 126 is removed (FIG. 7B). Then, an impurity semiconductor layer and a buffer layer are partially etched using the source and drain electrodes as a mask to separate a source region and a drain region from each other. By this step, the source and drain regions are formed, so that a back channel portion is formed (FIG. 7C).

Similar to Embodiment Mode 1, also in this method, residual product caused by the etching process, residue of the resist mask and substances that may be contamination sources in an apparatus, which has been used for removal of the resist mask are attached or deposited over the buffer layer between the source region and the drain region, and thus by conduction through the product, residue and substances, off current is increased in many elements, which leads to variation between the elements over the same substrate in many cases. This trend is apparent especially when a remover including sulfur is used in removing the resist mask.

Therefore, in order to solve the above problem, dry etching is conducted. By dry etching, insulation between the source region and drain region can be secured. The etching condition is set such that the exposed amorphous semiconductor layer is not damaged and the etching rate to the amorphous semiconductor layer is low. In other words, a condition which gives almost no damages to the surface of the exposed amorphous semiconductor layer and does not reduce the thickness of the amorphous semiconductor layer may be applied. At this time, a gas used for forming the back channel (e.g., a chlorine gas) may be used as the etching gas. An inductively-coupled plasma etching method is preferably employed for the etching. As an example of the etching condition, the gas flow rate is 30 sccm, the pressure of a chamber is 0.67 Pa, the temperature of a lower electrode is −10° C., the temperature of the side wall of the chamber is about 80° C., and an RF power (13.56 MHz) of 2000 W is applied to a coiled electrode to generate plasma and no power is applied to a substrate side (i.e., 0 W, non-biased). On the condition, etching may be conducted for thirty seconds. By this etching, sulfur or the like included in the remover is removed, for example.

There is no particular limitation on an etching method and a capacitively coupled plasma (CCP) method, an electron cyclotron resonance (ECR) method, or a reactive ion etching (RIE) method, or the like can be used, as well as an inductively coupled plasma (ICP) method.

Note that the dry etching is preferably by a discontinuous discharge, not by continuous discharge. More preferably, a pulsed discharge is conducted. Since dry etching is conducted using pulse discharge, charge-up damage generated in the back channel portion which is subjected to etching can be reduced. By reducing the charge-up damages in the back channel portion, leakage current can be reduced between the source electrode and the drain electrode. Accordingly, by pulsed discharge, off current can be more reduced, and thus switching characteristics can be improved. Thus, the effect of the present invention is more advantageous.

Figure 8A:
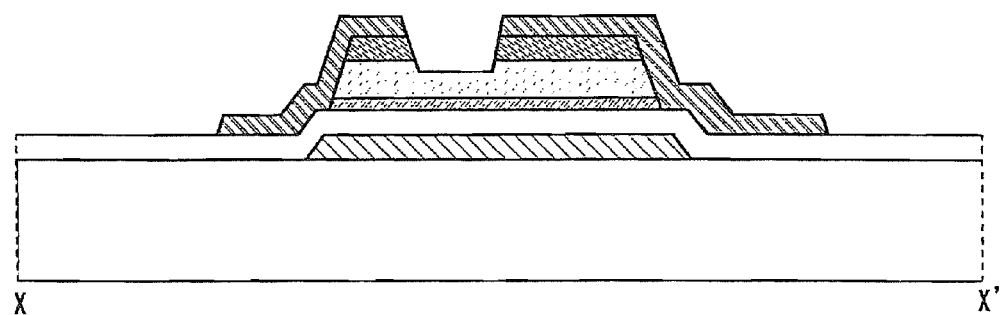
FIGS. 8A and 8B illustrate an example of a method for manufacturing a thin film transistor according to an aspect of the present invention.

The above-described etching can remove residue and the like existing over the buffer layer 108 between the source region and the drain region. However, as described in Embodiment Mode 1, the impurity semiconductor layer does not exist in a region not overlapping the source and drain electrode layers, and thus the impurity semiconductor layer is not etched in this etching step (FIG. 8A). Through the above steps, the thin film transistor can be manufactured.

Figure 8B:
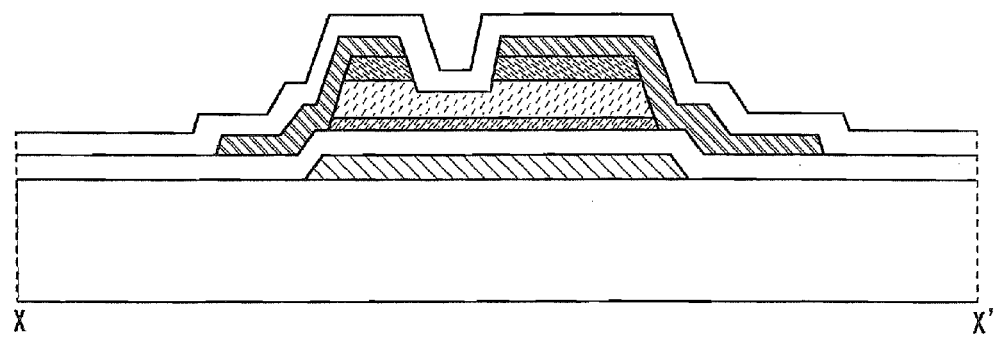

Next, an insulating layer is formed to cover the manufactured thin film transistor (FIG. 8B). This insulating layer may be formed in a similar manner to the insulating layer 114 in Embodiment Mode 1.

When the thin film transistor is used as a pixel transistor, one of the source and drain electrodes may be connected to a pixel electrode.

Next, a manufacturing method, which is different from the above method, is described.

Figure 9A:
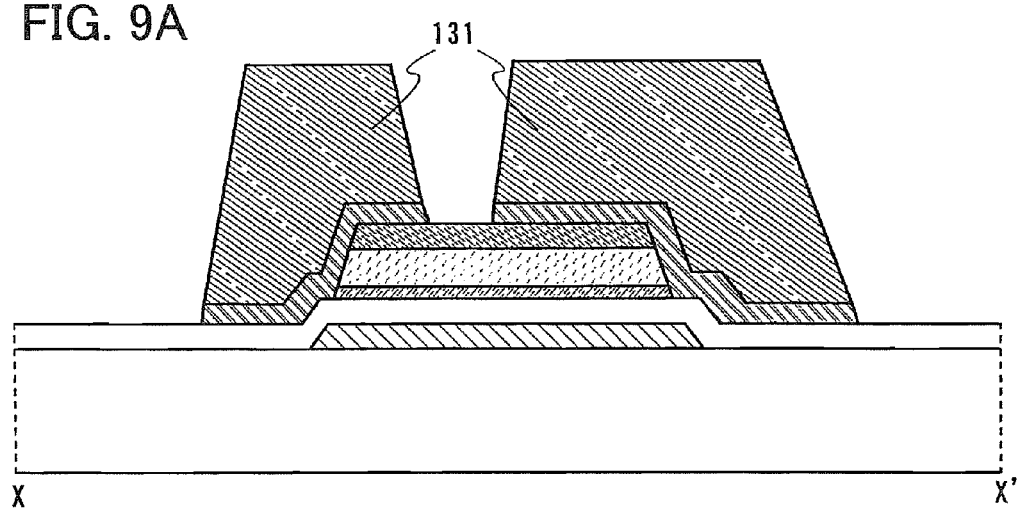
FIGS. 9A to 9C illustrate an example of a method for manufacturing a thin film transistor according to an aspect of the present invention.

First, similar to FIG. 3A, a conductive layer is etched to a desired pattern with a resist mask formed thereover. In this case, dry etching is conducted, unlike in Embodiment Mode 1. The conductive layer is dry-etched so as to be patterned conductive layers and side faces of the conductive layers do not recess inwardly from side faces of the resist, as illustrated in FIG. 9A. At this time, a resist mask 131 is used in this etching.

Figure 9B:
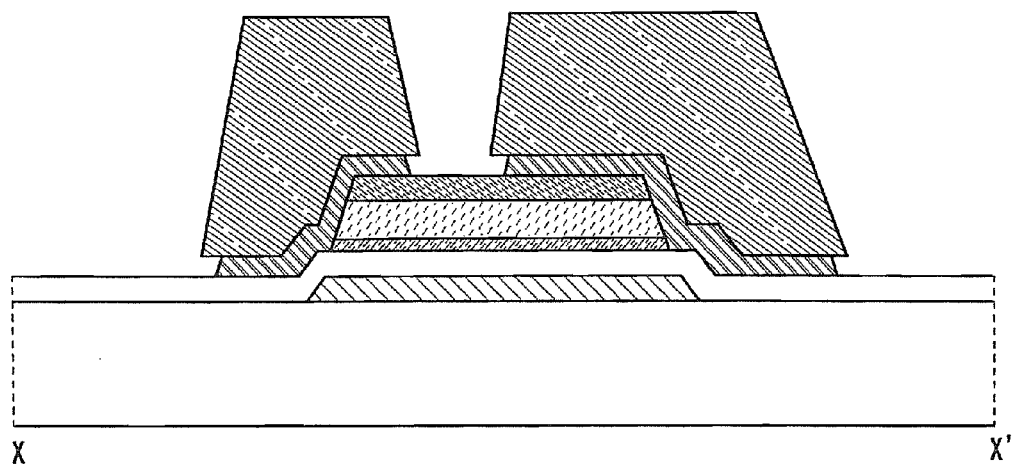

Then, the conductive layers are wet-etched. By this wet etching, the side faces of the conductive layers recede, so that source and drain electrodes are formed (FIG. 9B).

Figure 9C:
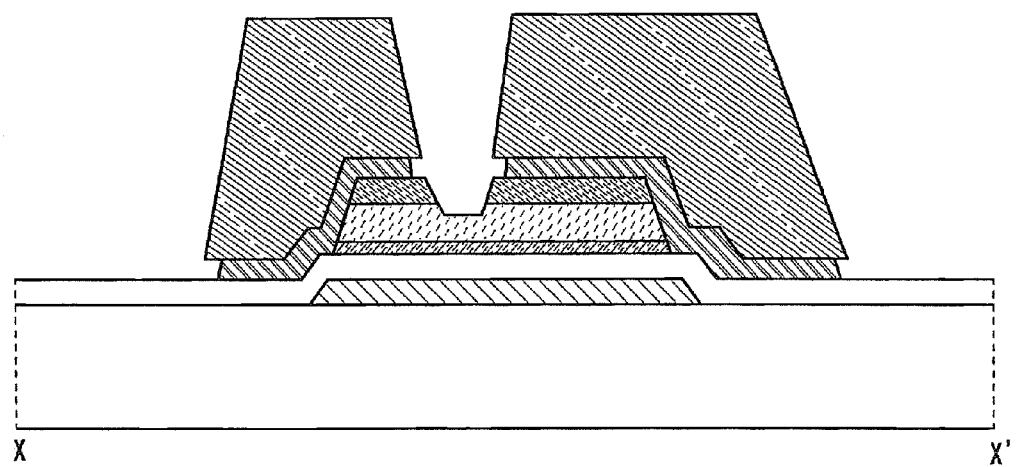

Then, the impurity semiconductor layer and the buffer layer are partially etched to separate the source region and the drain region from each other. By this step, the source and drain regions are formed, so that the back channel portion is formed (FIG. 9C).

Figure 10A:
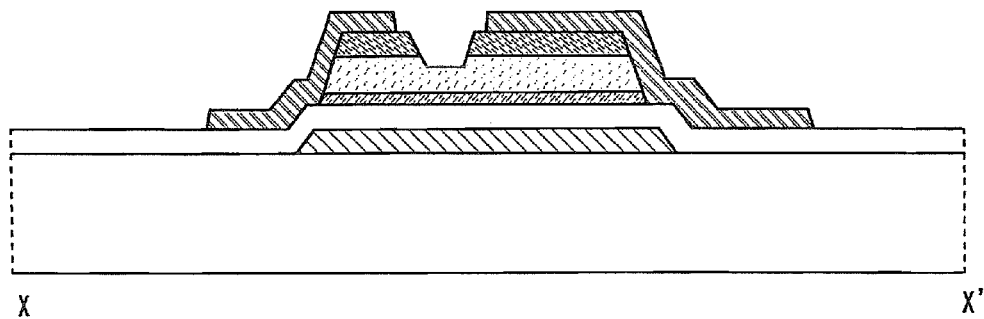
FIGS. 10A to 10C illustrate an example of a method for manufacturing a thin film transistor according to an aspect of the present invention.

After that, the resist mask 131 is removed (FIG. 10A).

Similar to other methods, also in this method, residual product caused by the etching process, residue of the resist mask and substances that may be contamination sources in an apparatus, which has been used for removal of the resist mask are attached or deposited over the buffer layer between the source region and the drain region, and thus by conduction through the product, residue and substances, off current is increased in many elements, which leads to variation between the elements over the same substrate in many cases. This trend is apparent especially when a remover including sulfur is used in removing the resist mask.

Therefore, in order to solve the above problem, dry etching is conducted. By dry etching, insulation between the source region and drain region can be secured. The etching condition is set such that the exposed amorphous semiconductor layer is not damaged and the etching rate to the amorphous semiconductor layer is low. In other words, a condition which gives almost no damages to the surface of the exposed amorphous semiconductor layer and does not reduce the thickness of the amorphous semiconductor layer may be applied. At this time, a gas used for forming the back channel (e.g., a chlorine gas) may be used as the etching gas. An inductively-coupled plasma etching method is preferably employed for the etching. As an example of the etching conditions, the gas flow rate is 30 sccm, the pressure of a chamber is 0.67 Pa, the temperature of a lower electrode is −10° C., the temperature of the side wall of the chamber is about 80° C., and an RF power (13.56 MHz) of 2000 W is applied to a coiled electrode to generate plasma and no power is applied to a substrate side (i.e., 0 W non-biased). On the condition, etching may be conducted for thirty seconds. By this etching, sulfur or the like included in the remover is removed, for example.

There is no particular limitation on an etching method and a capacitively coupled plasma (CCP) method, an electron cyclotron resonance (ECR) method, or a reactive ion etching (RIE) method, or the like can be used, as well as an inductively coupled plasma (ICP) method.

Note that the dry etching is preferably by a discontinuous discharge, not by continuous discharge. More preferably, a pulsed discharge is conducted. Since dry etching is conducted using pulsed discharge, charge-up damage generated in the back channel portion which is subjected to etching can be reduced. By reducing the charge-up damages in the back channel portion, leakage current can be reduced between the source electrode and the drain electrode. Accordingly, by pulsed discharge, off current can be more reduced, and thus switching characteristics can be improved. Thus, the effect of the present invention is more advantageous.

Figure 10B:
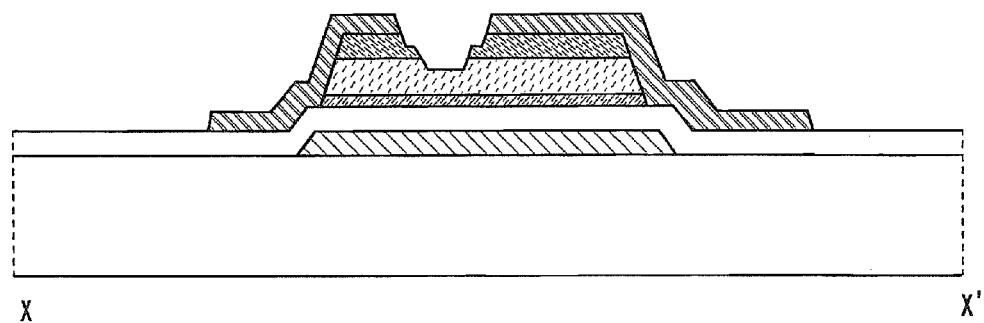

The above-described etching can remove residue and the like existing over the buffer layer between the source region and the drain region. In addition, by this etching process, the impurity semiconductor layer not overlapping the source and drain electrode layers 112 is slightly etched. In the above etching condition, the impurity semiconductor layer is etched, for example 0 nm to 5 nm deep. Accordingly, in the thin film transistor formed according to the present invention, a side face (an inner side face) of an upper portion (first portion) of the source and drain regions exists in the same as or substantially the same plane as a side face of the source and drain electrode layers, and a side face (an inner side face) of a lower portion (second portion) of the source and drain regions exists in the same as or substantially the same plane as a side face of the buffer layer (FIG. 10B). By this etching process, the impurity semiconductor layer may be nearly stepwise-shaped in some cases. In this manner, the thin film transistor can be manufactured.

Figure 10C:
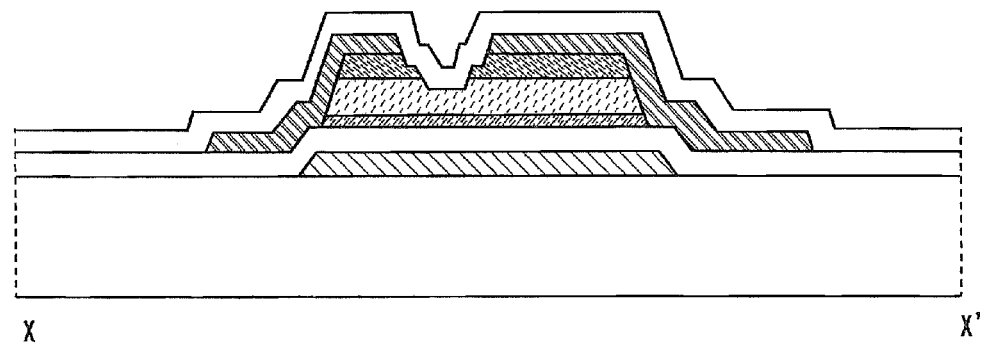

Next, an insulating layer is formed to cover the manufactured thin film transistor (FIG. 10C). This insulating layer may be formed in a similar manner to the insulating layer 114 in Embodiment Mode 1.

When the thin film transistor is used as a pixel transistor, one of the source and drain electrodes may be connected to a pixel electrode.

As described above, the present invention is not limited to the method described in Embodiment Mode 1, and can be applied to a wide variety of methods for manufacturing thin film transistors.

(Embodiment Mode 3)

In Embodiment Mode 3, a method for manufacturing a thin film transistor of the present invention, which is different from those of Embodiment Modes 1 and 2, is described with reference to drawings. Specifically, a multi-tone mask is used.

Figure 11A:
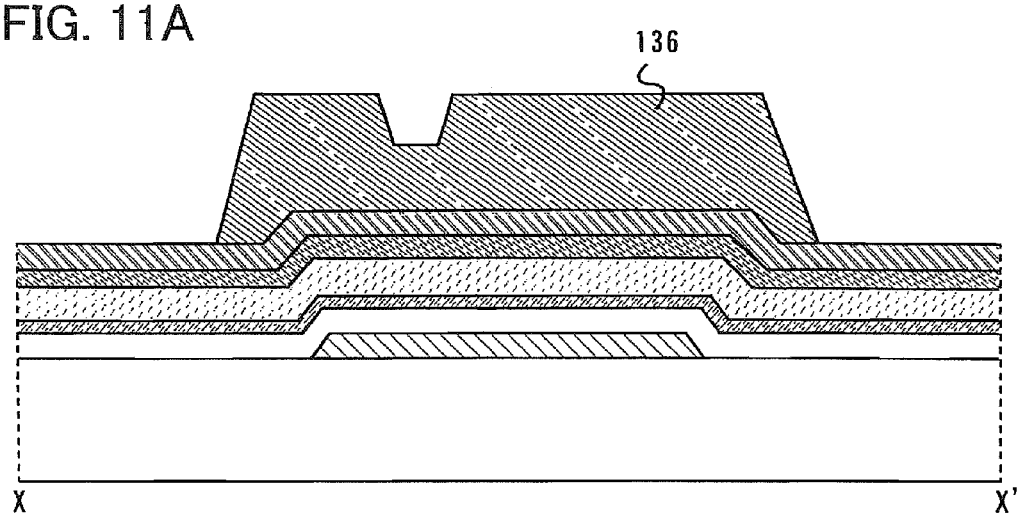
FIGS. 11A to 11C illustrate an example of a method for manufacturing a thin film transistor according to an aspect of the present invention.

First, a stacked body in which layers up to and including a conductive layer have been formed in a manner similar to the manufacturing method of Embodiment Mode 1 is obtained. Then, a resist mask 136 having a depression portion (concave portion) at a desired position is formed over the stacked body (FIG. 11A). The resist mask can be a multi-tone mask. As examples of the multi-tone mask, a grey tone mask or a halftone mask can be given, and a known multi-tone mask may be used.

Figure 11B:
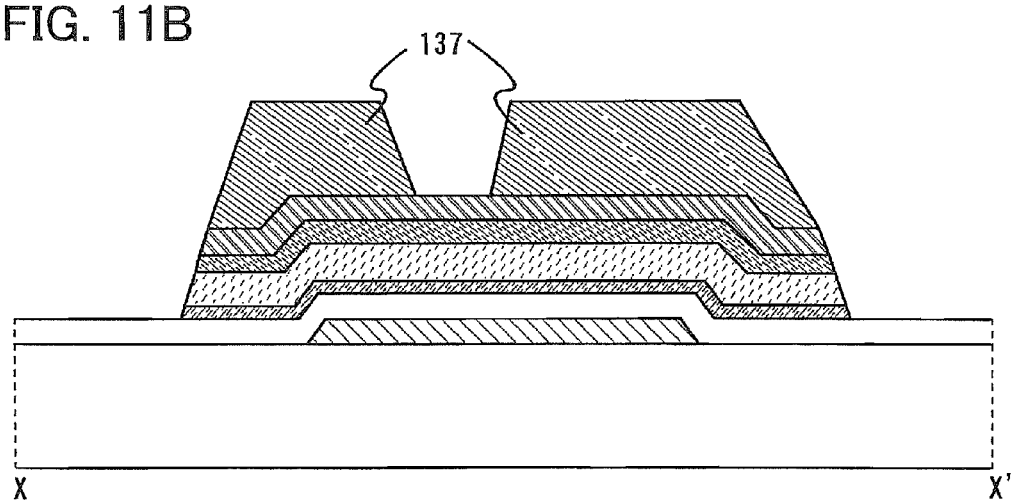

Then, a microcrystalline semiconductor layer, an amorphous semiconductor layer and an impurity semiconductor layer are etched using the resist mask 136. By this etching, the semiconductor layer, the buffer layer and the impurity semiconductor layer are separated corresponding to each element. The etching may be dry etching or wet etching. After that, ashing using oxygen plasma or the like is conducted so that the depression portion (concave portion) of the resist mask can reach a conductive layer directly under the resist mask, and thereby a resist mask 137 is formed (FIG. 11B).

Figure 11C:
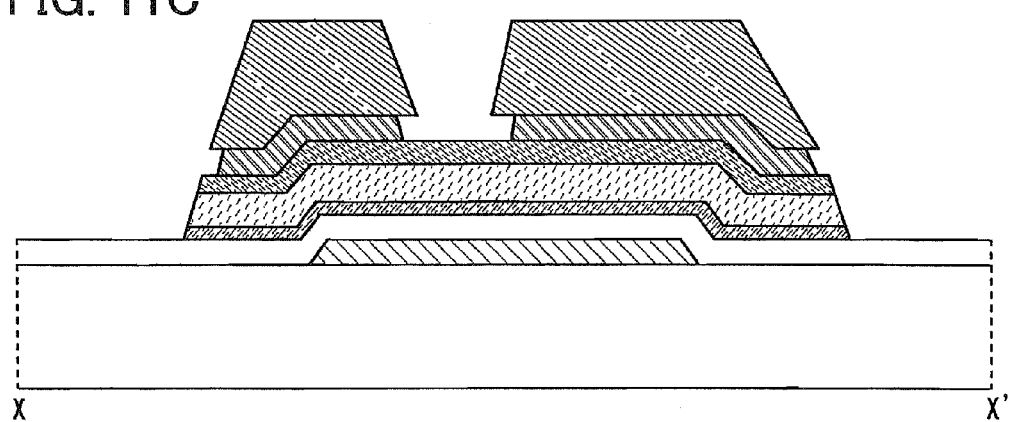

Next, the conductive layer is etched using the resist mask 137 so as to be patterned (FIG. 11C). The patterned conductive layers serve as source and drain electrodes. In this case, the etching is wet etching. In this manner, the same state as that in FIG. 3B can be obtained.

Figure 12A:
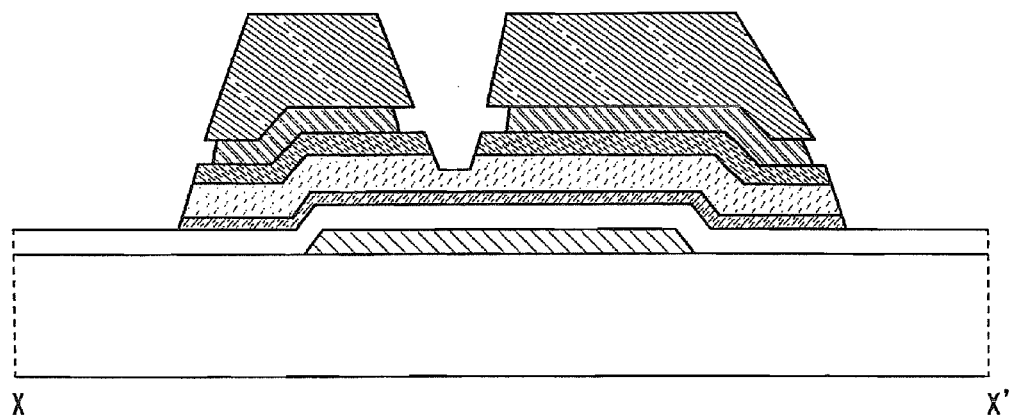
FIGS. 12A to 12C illustrate an example of a method for manufacturing a thin film transistor according to an aspect of the present invention.

Then, the impurity semiconductor layer and the buffer layer are partially etched to separate a source region and a drain region from each other. By this step, the source and drain regions are formed, so that a back channel portion is formed (FIG. 12A).

Figure 12B:
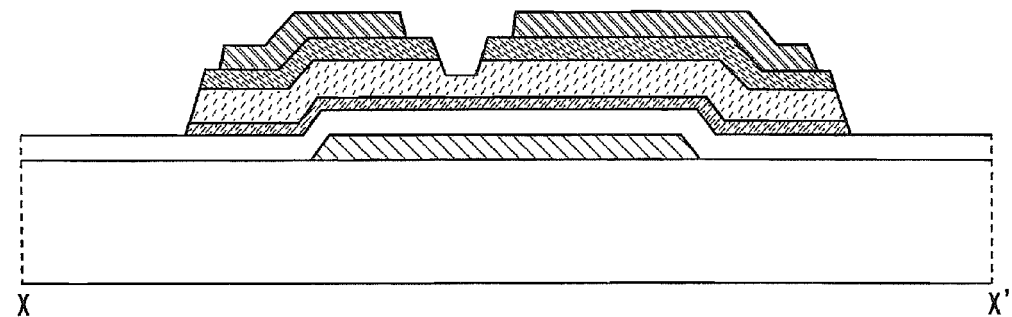

After that, the resist mask 137 is removed (FIG. 12B).

Similar to other methods, also in this method, residual product caused by the etching process, residue of the resist mask and substances that may be contamination sources in an apparatus, which has been used for removal of the resist mask are attached or deposited over the buffer layer between the source region and the drain region, and thus by conduction through the product, residue and substances, off current is increased in many elements, which leads to variation between the elements over the same substrate in many cases. This trend is apparent especially when a remover including sulfur is used in removing the resist mask.

Therefore, in order to solve the above problem, dry etching is conducted. By dry etching, insulation between the source region and drain region can be secured. The etching condition is set such that the exposed amorphous semiconductor layer is not damaged and the etching rate to the amorphous semiconductor layer is low. In other words, a condition which gives almost no damages to the surface of the exposed amorphous semiconductor layer and does not reduce the thickness of the amorphous semiconductor layer may be applied. At this time, a gas used for forming the back channel (e.g., a chlorine gas) may be used as the etching gas. An inductively-coupled plasma etching method is preferably employed for the etching. As an example of the etching conditions, the gas flow rate is 30 sccm, the pressure of a chamber is 0.67 Pa, the temperature of a lower electrode is −10° C., the temperature of the side wall of the chamber is about 80° C., and an RF power (13.56 MHz) of 2000 W is applied to a coiled electrode to generate plasma and no power is applied to a substrate side (i.e., 0 W, non-biased). On the conditions, etching may be conducted for thirty seconds. By this etching, sulfur or the like included in the remover is removed, for example.

There is no particular limitation on an etching method and a capacitively coupled plasma (CCP) method, an electron cyclotron resonance (ECR) method, or a reactive ion etching (RIE) method, or the like can be used, as well as an inductively coupled plasma (ICP) method.

Note that the dry etching is preferably by a discontinuous discharge, not by continuous discharge. More preferably, a pulsed discharge is conducted. Since dry etching is conducted using pulsed discharge, charge-up damage generated in the back channel portion which is subjected to etching can be reduced. By reducing the charge-up damages in the back channel portion, leakage current can be reduced between the source electrode and the drain electrode. Accordingly, by pulsed discharge, off current can be more reduced, and thus switching characteristics can be improved. Thus, the effect of the present invention is more advantageous.

Figure 12C:
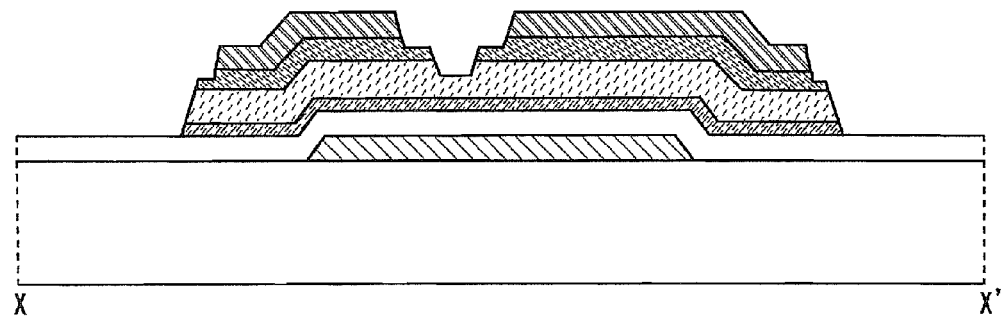

The above-described etching can remove etching residue and the like existing over the buffer layer between the source region and the drain region. In addition, by this etching process, the impurity semiconductor layer not overlapping the source and drain electrode layers is also slightly etched. In the above etching condition, the impurity semiconductor layer is etched, for example, 0 nm to 5 nm deep. Accordingly, in the thin film transistor formed according to the present invention, a side face (an inner side face) of an upper portion (first portion) of the source and drain regions exists in the same as or substantially the same plane as a side face of the source and drain electrode layers, and a side face (an inner side face) of a lower portion (second portion) of the source and drain regions exists in the same as or substantially the same plane as a side face of the buffer layer (FIG. 12C). By this etching process, the impurity semiconductor layer may be nearly stepwise-shaped in some cases. Through the above steps, the thin film transistor can be manufactured.

Although not illustrated, an insulating layer may be formed to cover the thin film transistor, similar to the other methods described above, and an opening portion is formed in the insulating layer and one of the source and drain electrodes is connected to a pixel electrode through the opening portion. In this manner, a pixel transistor is manufactured.

Figure 13A:
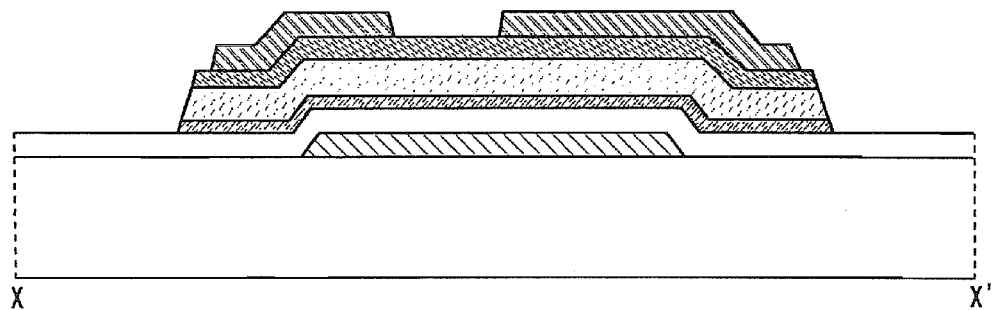
FIGS. 13A to 13C illustrate an example of a method for manufacturing a thin film transistor according to an aspect of the present invention.

Note that even when the multi-tone mask is used, similar to the method described with reference to FIGS. 7A to 7C, the impurity semiconductor layer and the buffer layer may be partially etched using the source and drain electrodes as a mask, so that the source region and the drain region are separated. In this case, the conductive layer is etched using a resist mask, so that the source and drain electrodes are formed (FIG. 13A).

Figure 13B:
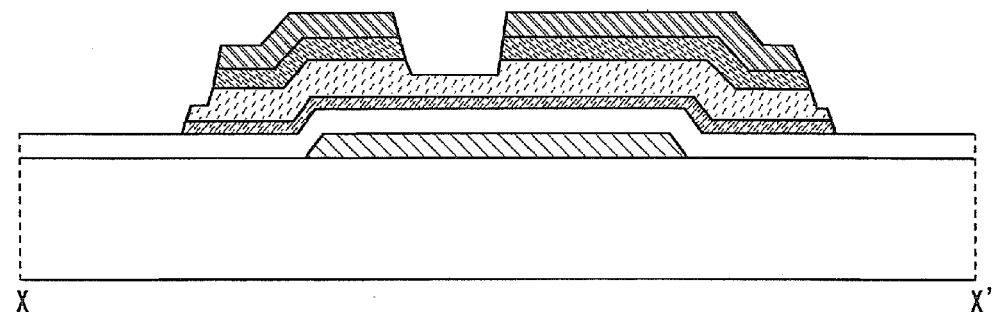

Then, the impurity semiconductor layer and the buffer layer are partially etched using the source and drain electrodes as a mask to separate the source region and the drain region from each other. By this step, the source and drain regions are formed, so that the back channel portion is formed (FIG. 13B).

Similar to other methods, also in this method, residual product caused by the etching process, residue of the resist mask and substances that may be contamination sources in an apparatus, which has been used for removal of the resist mask are attached or deposited over the buffer layer between the source region and the drain region, and thus by conduction through the product, residue and substances, off current is increased in many elements, which leads to variation between the elements over the same substrate in many cases. This trend is apparent especially when a remover including sulfur is used in removing the resist mask.

Therefore, in order to solve the above problem, dry etching is conducted. By dry etching, insulation between the source region and drain region can be secured. The etching condition is set such that the exposed amorphous semiconductor layer is not damaged and the etching rate to the amorphous semiconductor layer is low. In other words, a condition which gives almost no damages to the surface of the exposed amorphous semiconductor layer and does not reduce the thickness of the amorphous semiconductor layer may be applied. At this time, a gas used for forming the back channel (e.g., a chlorine gas) may be used as the etching gas. An inductively-coupled plasma etching method is preferably employed for the etching. As an example of the etching conditions, the gas flow rate is 30 sccm, the pressure of a chamber is 0.67 Pa, the temperature of a lower electrode is −10° C., the temperature of the side wall of the chamber is about 80° C., and an RF power (13.56 MHz) of 2000 W is applied to a coiled electrode to generate plasma and no power is applied to a substrate side (i.e., 0 W, non-biased). On the conditions, etching may be conducted for thirty seconds. By this etching, sulfur or the like included in the remover is removed, for example.

There is no particular limitation on an etching method and a capacitively coupled plasma (CCP) method, an electron cyclotron resonance (ECR) method, or a reactive ion etching (RIE) method, or the like can be used, as well as an inductively coupled plasma (ICP) method.

Note that the dry etching is preferably by a discontinuous discharge, not by continuous discharge. More preferably, a pulsed discharge is conducted. Since dry etching is conducted using pulsed discharge, charge-up damage generated in the back channel portion which is subjected to etching can be reduced. By reducing the charge-up damages in the back channel portion, leakage current can be reduced between the source electrode and the drain electrode. Accordingly, by pulsed discharge, off current can be more reduced and thus switching characteristics can be improved. Thus, the effect of the present invention is more advantageous.

Figure 13C:
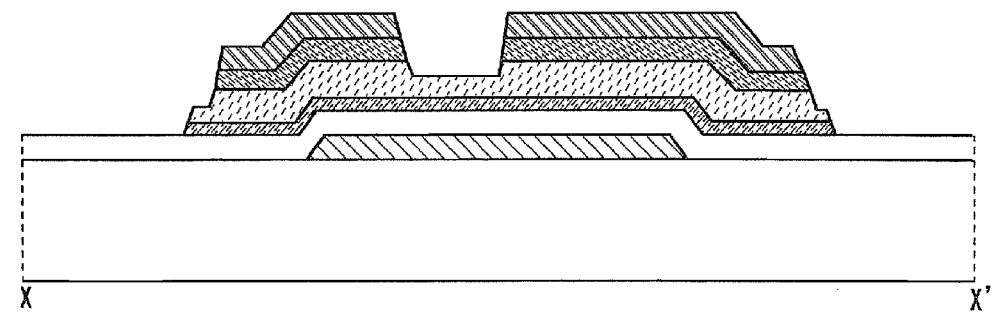

The above-described etching can remove residue and the like existing over the buffer layer between the source region and the drain region. In addition, by this etching process, the impurity semiconductor layer not overlapping the source and drain electrode layers is also slightly etched. In the above etching condition, the impurity semiconductor layer is etched, for example, 0 nm to 5 nm deep. Accordingly, in the thin film transistor formed according to the present invention, a side face (an inner side face) of an upper portion (first portion) of the source and drain regions exists in the same as or substantially the same plane as a side face of the source and drain electrode layers, and a side face (an inner side face) of a lower portion (second portion) of the source and drain regions exists in the same as or substantially the same plane as a side face of the buffer layer (FIG. 13C). By this etching process, the impurity semiconductor layer may be nearly stepwise-shaped in some cases.

Figure 14:
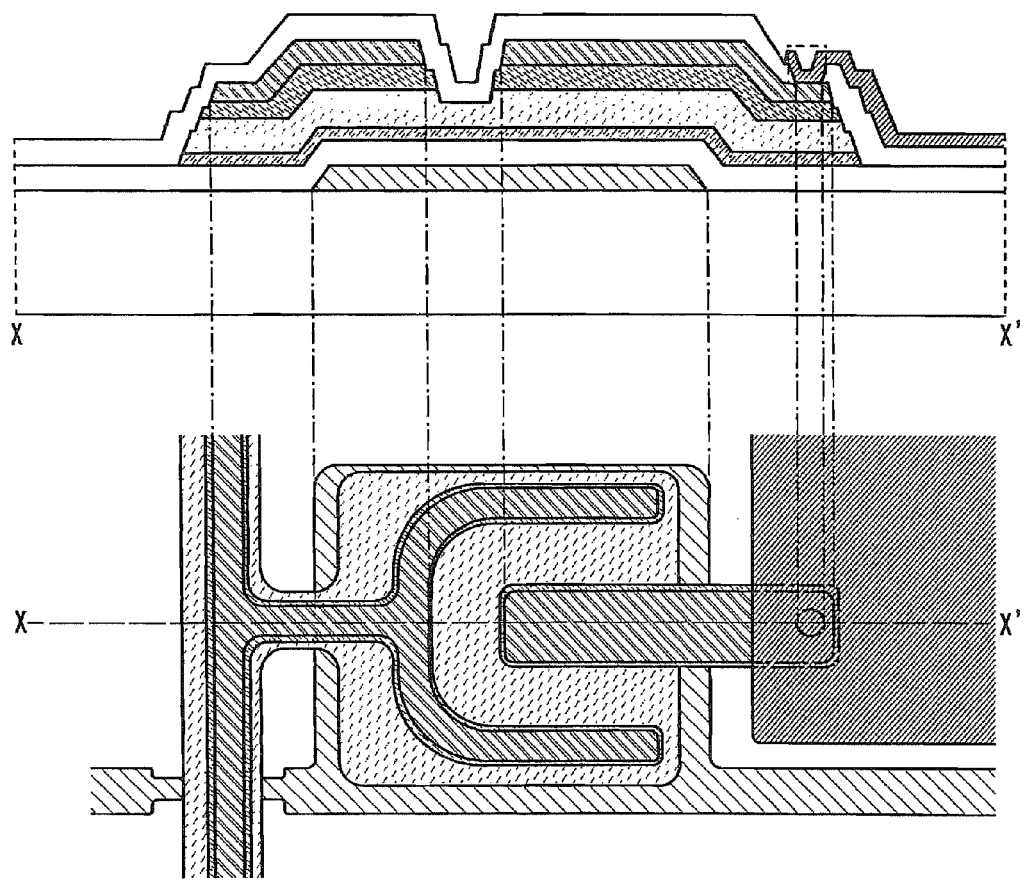
FIG. 14 illustrates an example of a structure of a thin film transistor according to an aspect of the present invention.

FIG. 14 illustrates a pixel transistor, similar to FIG. 1. The pixel transistor illustrated in FIG. 14 includes a semiconductor layer (e.g., a microcrystalline semiconductor layer), a buffer layer (an amorphous semiconductor layer) and an impurity semiconductor layer under the source and drain electrode layers, unlike the pixel transistor illustrated in FIG. 1.

As described in this embodiment mode, in the manufacturing method using a multi-tone mask, as illustrated in FIG. 14, under source and drain electrode layers, the semiconductor layer (e.g., a microcrystalline semiconductor layer), the buffer layer (an amorphous semiconductor layer) and the impurity semiconductor layer are formed. This similarly applies to a case where the manufacturing method described in Embodiment Mode 2 with reference to FIGS. 7A to 7C and FIGS. 8A and 8B is applied.

As described above, the present invention can also be applied to the case where a multi-tone mask is used. By use of the multi-tone mask, the number of steps can be decreased, and a highly reliable thin film transistor having excellent electric characteristics can be manufactured at high yield according to the present invention. Variation between the thus formed thin film transistors is small. Accordingly, it is extremely effective that the present invention is applied to the method for manufacturing a thin film transistor using a multi-tone mask.

In addition, another method for manufacturing a thin film transistor using a multi-tone mask is described below.

When the multi-tone mask is used as described above, all layers of from a gate electrode to a pixel electrode can be formed using three photomasks. However, even without using the multi-tone mask, the all layers of from the gate electrode to the pixel electrode can be formed using three photomasks. A method for manufacturing a thin film transistor, in which from the gate electrode to the pixel electrode can be formed using three photomasks, instead of using the multi-tone mask, is described below.

Figure 17A:
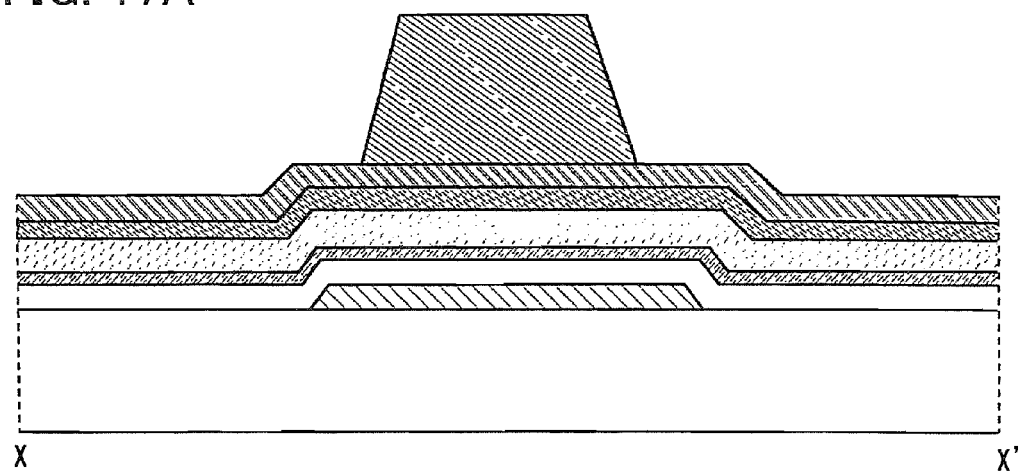
FIGS. 17A to 17C illustrate an example of a method for manufacturing a thin film transistor according to an aspect of the present invention.

First, similar to FIG. 11A, a stacked body in which layers up to and including a conductive layer have been stacked is formed. Then, a resist mask is formed over the stacked body (FIG. 17A). Note that one photomask is used to form a gate electrode layer.

Figure 17B:
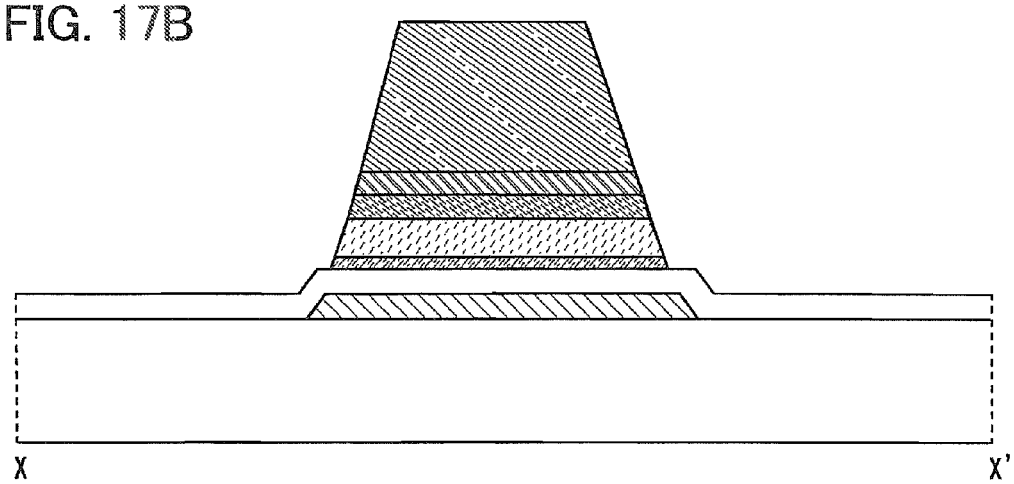

Next, a conductive layer, a semiconductor layer (e.g., a microcrystalline semiconductor layer), an amorphous semiconductor layer and an impurity semiconductor layer are etched using the resist mask to be separated corresponding to each element. The etching may be dry etching or wet etching (FIG. 17B).

Figure 17C:
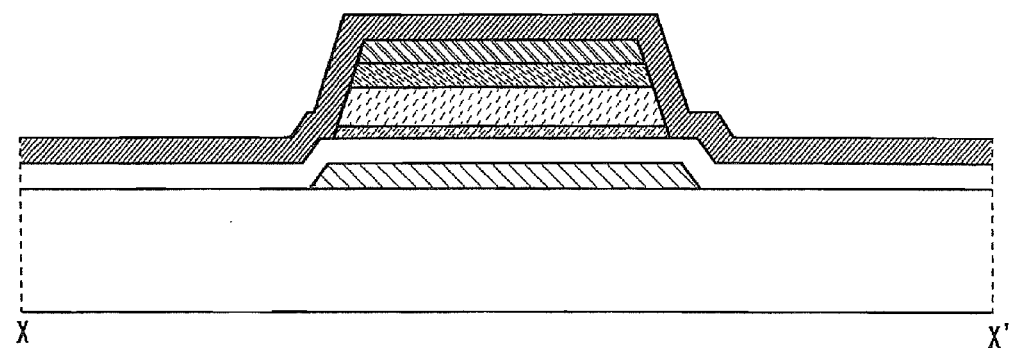
Figure 18A:
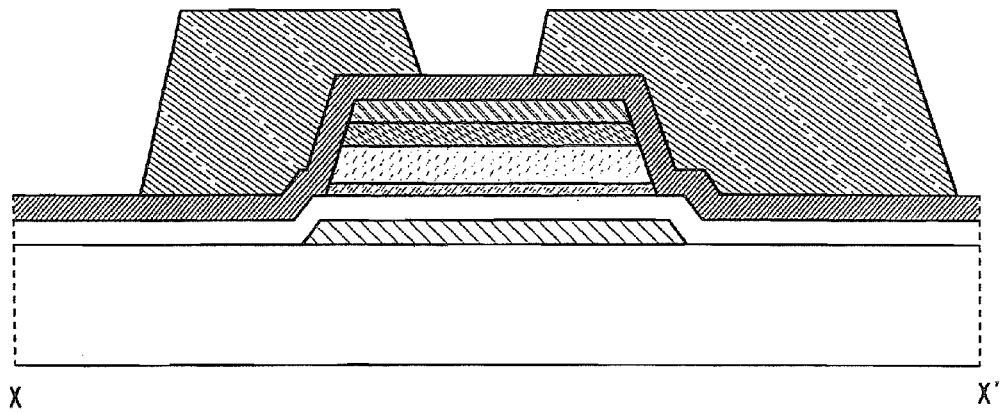
FIGS. 18A to 18C illustrate an example of a method for manufacturing a thin film transistor according to an aspect of the present invention.
Figure 18B:
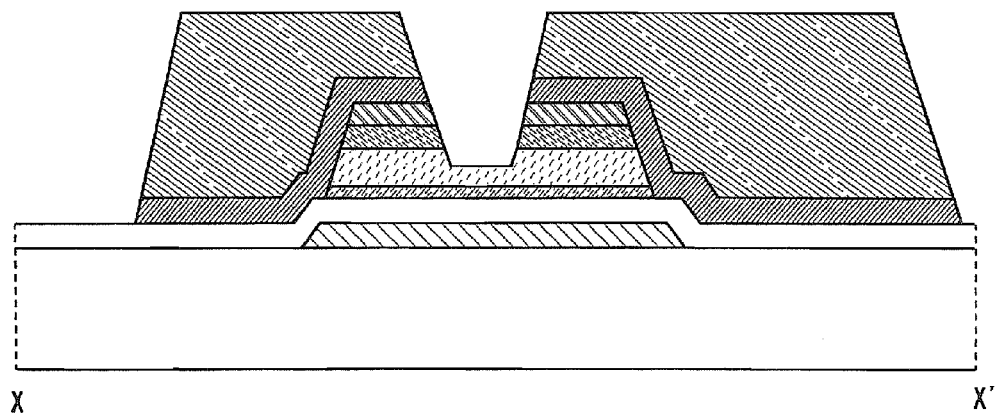
Figure 18C:
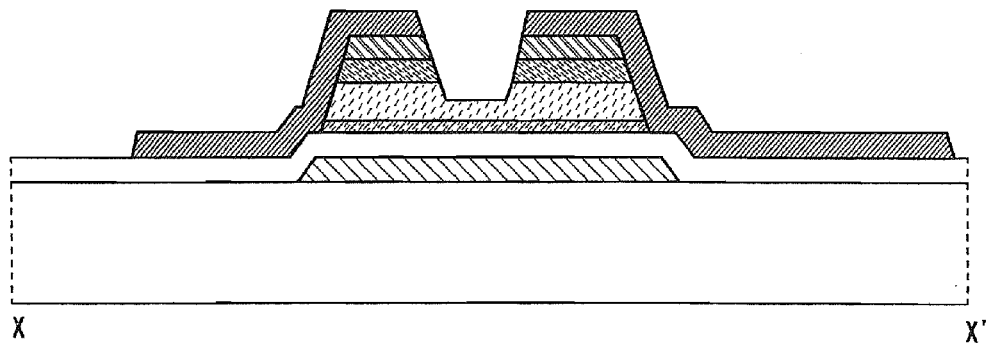

Then, a pixel electrode layer is formed over the separated conductive layer for each element (FIG. 17C), and a resist mask is formed over the pixel electrode layer (FIG. 18A). In this case, the pixel electrode layer is formed using indium tin oxide (ITO) typically. By using this resist mask, etching is conducted for patterning the pixel electrode layer, and the impurity semiconductor layer and a buffer layer are partially etched so that the source region and the drain region are separated from each other. By this step, the source and drain regions are formed so that a back channel portion is formed (FIG. 18B). After that, the resist mask is removed (FIG. 18C).

Similar to other methods, also in this method, residual product caused by the etching process, residue of the resist mask and substances that may be contamination sources in an apparatus, which has been used for removal of the resist mask are attached or deposited over the buffer layer between the source region and the drain region, and thus by conduction through the product, residue and substances, off current is increased in many elements, which leads to variation between the elements over the same substrate in many cases. This trend is apparent especially when a remover including sulfur is used in removing the resist mask.

Therefore, in order to solve the above problem, dry etching is conducted. By dry etching, insulation between the source region and drain region can be secured. The etching condition is set such that the exposed amorphous semiconductor layer is not damaged and the etching rate to the amorphous semiconductor layer is low. In other words, a condition which gives almost no damages the exposed amorphous semiconductor layer and does not reduce the thickness of the amorphous semiconductor layer may be applied. At this time, a gas used for forming the back channel (e.g., a chlorine gas) may be used as the etching gas. An inductively-coupled plasma etching method is preferably employed for the etching. As an example of the etching condition, the gas flow rate is 30 sccm, the pressure of a chamber is 0.67 Pa, the temperature of a lower electrode is −10° C., the temperature of the side wall of the chamber is about 80° C., and an RF power (13.56 MHz) of 2000 W is applied to a coiled electrode to generate plasma and no power is applied to a substrate side (i.e., 0 W non-biased). On the condition, etching may be conducted for thirty seconds. By this etching, sulfur or the like included in the remover is removed, for example.

There is no particular limitation on an etching method and a capacitively coupled plasma (CCP) method, an electron cyclotron resonance (ECR) method, or a reactive ion etching (RIE) method, or the like can be used, as well as an inductively coupled plasma (ICP) method.

Note that the dry etching is preferably by a discontinuous discharge, not by continuous discharge. More preferably, a pulsed discharge is conducted. Since dry etching is conducted using pulsed discharge, charge-up damage generated in the back channel portion which is subjected to etching can be reduced. By reducing the charge-up damages in the back channel portion, leakage current can be reduced between the source electrode and the drain electrode. Accordingly, by pulsed discharge, off current can be more reduced, and thus switching characteristics can be improved. Thus, the effect of the present invention is more advantageous.

The above-described etching can remove residue and the like existing over the buffer layer between the source region and the drain region. In addition, by this etching process, the impurity semiconductor layer not overlapping the source and drain electrode layers is also slightly etched. In the above etching conditions, the impurity semiconductor layer is etched, for example, 0 nm to 5 nm deep. Accordingly, in the thin film transistor formed according to the present invention, a side face (an inner side face) of an upper portion (first portion) of the source and drain regions exists in the same as or substantially the same plane as a side face of the source and drain electrode layers, and a side face (an inner side face) of a lower portion (second portion) of the source and drain regions exists in the same as or substantially the same plane as a side face of the buffer layer (FIG. 13C). By this etching process, the impurity semiconductor layer may be nearly stepwise-shaped in some cases.

As described above, the present invention can be applied to a wide variety of manufacturing methods.

(Embodiment Mode 4)

The present invention is not limited to thin film transistors using a microcrystalline semiconductor layer or the like described in Embodiment Modes 1 to 3. The present invention can be applied to an inversely-staggered thin film transistor having a microcrystalline semiconductor film but also an inversely-staggered thin film transistor having only an amorphous semiconductor layer (the buffer layer in Embodiment Mode 1).

Even in a case where the present invention is applied to an inversely-staggered thin film transistor using only amorphous semiconductor as a semiconductor layer, the method for manufacturing the thin film transistor is similar to those described in Embodiment Modes 1 to 3. Note that the thin film transistor does not include a layer typified by the semiconductor layer 106 as described in Embodiment Mode 1 or the other embodiment modes.

Figure 15:
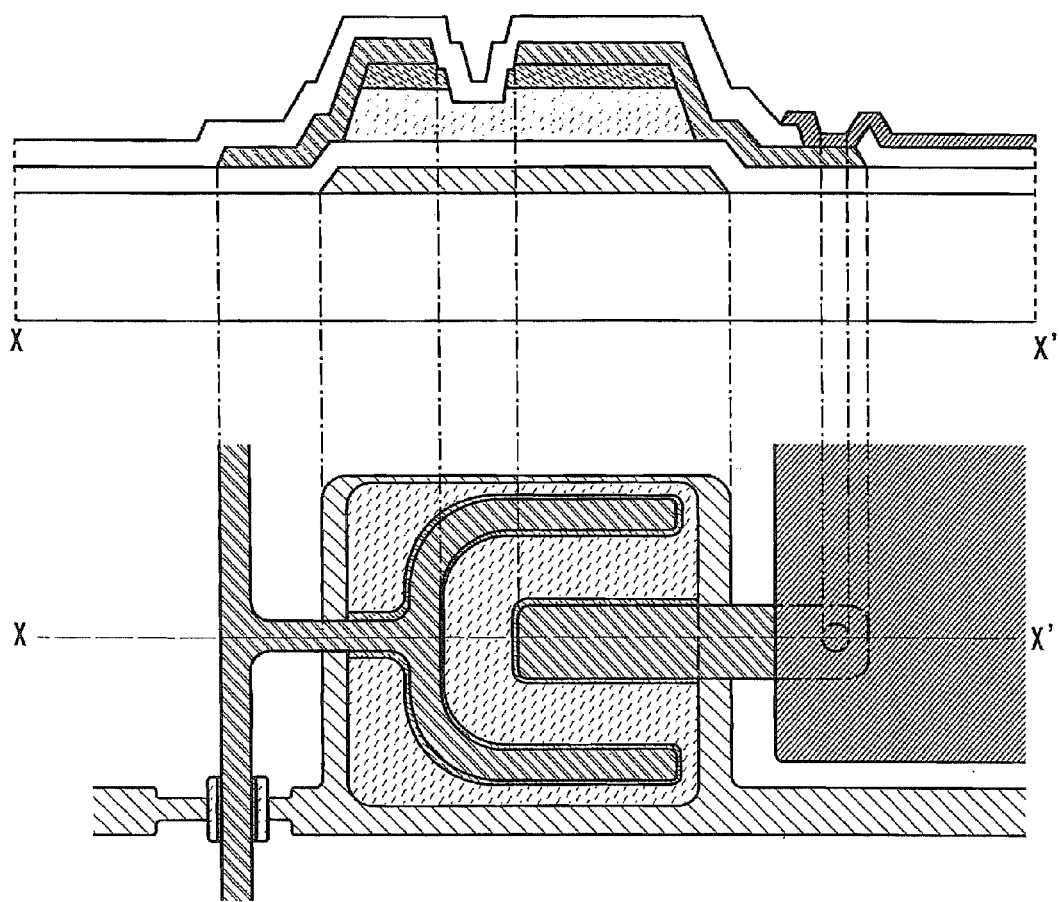
FIG. 15 illustrates an example of a structure of a thin film transistor according to an aspect of the present invention.
Figure 16:
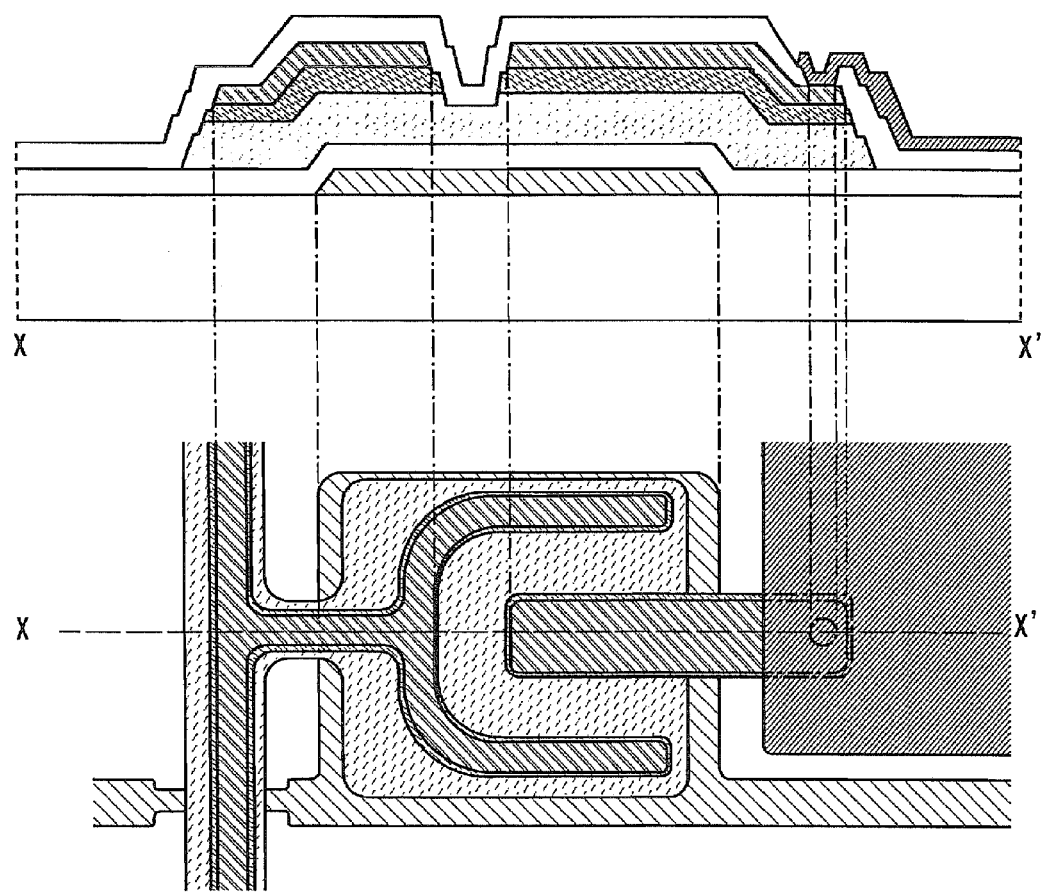
FIG. 16 illustrates an example of a structure of a thin film transistor according to an aspect of the present invention.

FIG. 15 illustrates an inversely-staggered thin film transistor which uses only an amorphous semiconductor layer as a semiconductor layer and is formed in a manner similar to that of FIG. 1, in accordance with the present invention. In addition, FIG. 16 illustrates an inversely-staggered thin film transistor using only amorphous semiconductor as a semiconductor layer, formed using a multi-tone mask similar to FIG. 14. In this manner, also when the present invention is applied to manufacturing of the inversely-staggered thin film transistor using only an amorphous semiconductor layer as a semiconductor layer, a highly reliable thin film transistor having excellent electric characteristics can be manufactured at low cost at high yield. In addition, variation in electric characteristics between elements formed over the same substrate can be made small.

(Embodiment Mode 5)

In Embodiment Mode 5, a liquid crystal display device including a thin film transistor formed according to any of the above embodiment modes is described.

First, a VA (vertical alignment) mode liquid crystal display device is described. A VA-mode is a mode in which longitudinal axes of liquid crystal molecules are vertical to a panel surface when voltage is not applied. In particular, in this embodiment mode, it is devised that a pixel is divided into several regions (subpixels) so that molecules are aligned in different directions. This is referred to as domain multiplication or multi-domain. In the following description, a multi-domain liquid crystal display device is described.

Figure 19:
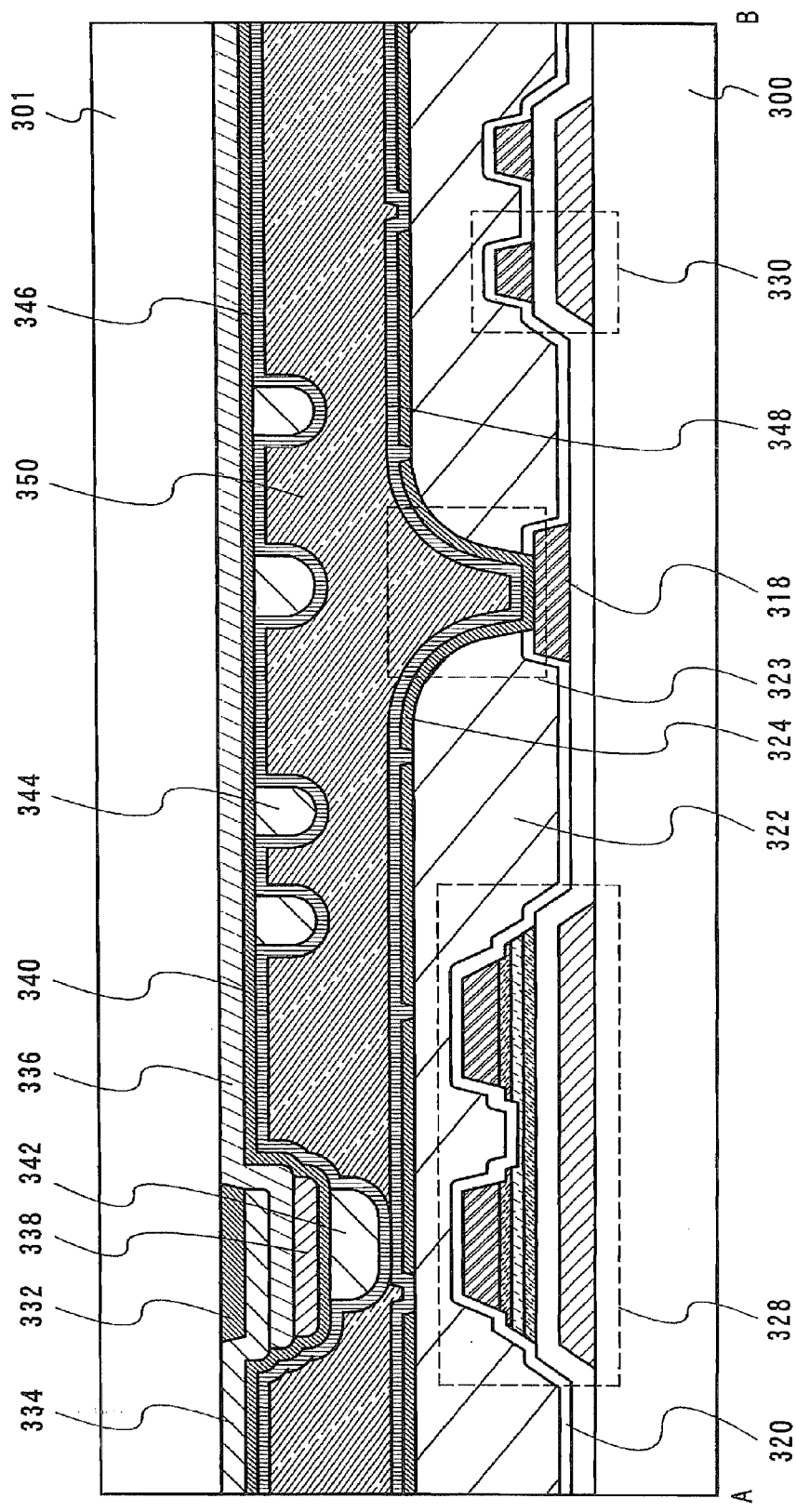
Figure 20:
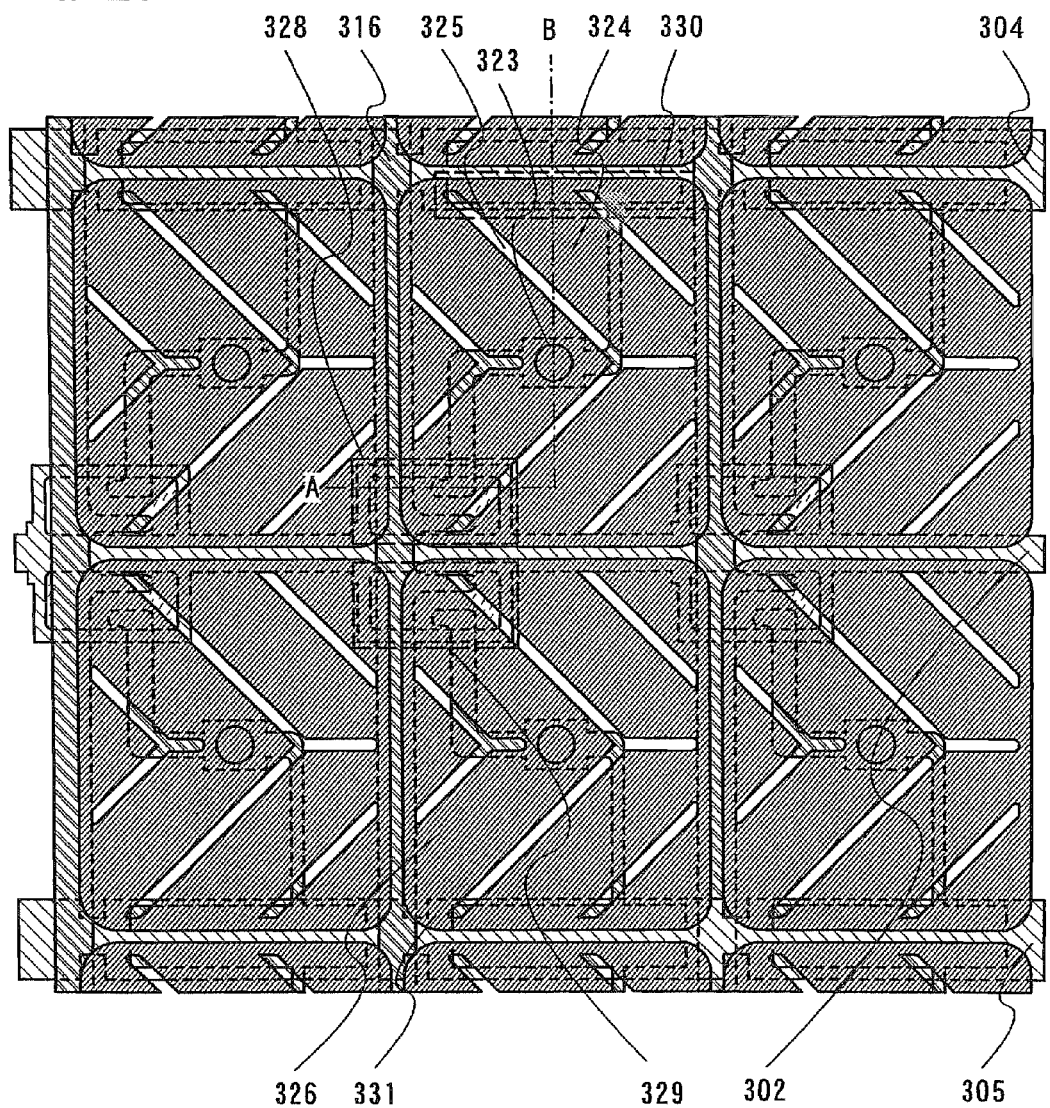
Figure 21:
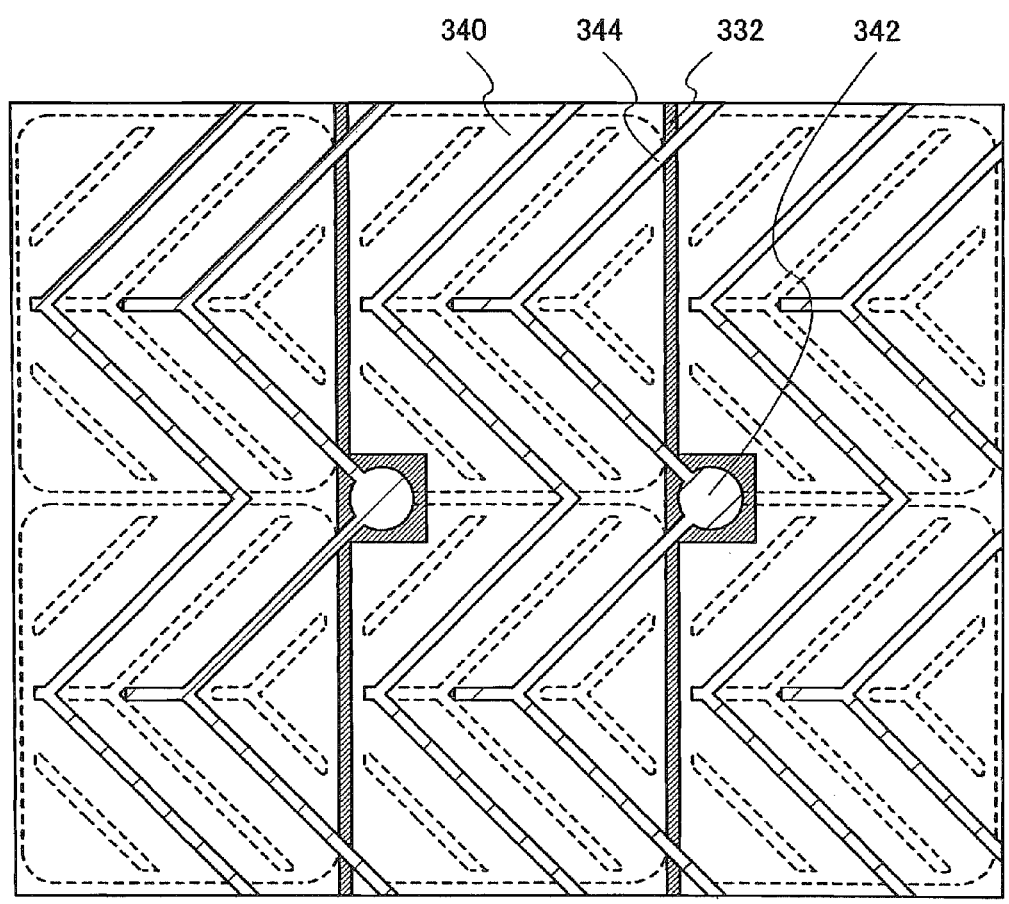

FIG. 20 is a top plan view of a side of a substrate over which a pixel electrode is formed. FIG. 19 illustrates a cross-sectional structure taken along the line A-B in FIG. 20. In addition, FIG. 21 is a top plan view of a side of a substrate on which a counter electrode is formed.

FIG. 19 illustrates a state in which a substrate 300 and a substrate 301 which is opposite to the substrate 300 face with each other, and liquid crystals are injected therebetween. A thin film transistor 328, a pixel electrode 324 connected to a source electrode layer or a drain electrode layer of the thin film transistor 328, and a storage capacitor portion 330 are provided over the substrate 300. The substrate 301 is provided with a counter electrode 340.

At a position where a spacer 342 is formed over the substrate 301, a light-shielding layer 332, a first colored layer 334, a second colored layer 336, a third colored layer 338, and the counter electrode 340 are formed. With the structure in which the colored layers are stacked in a region in which the spacer 342 is formed, the height of a protrusion 344 for controlling alignment of the liquid crystals and the height of the spacer 342 are different from each other. An alignment film 348 is formed over the pixel electrode 324. An alignment film 346 is provided in contact with the counter electrode 340. A liquid crystal layer 350 is provided between the alignment film 346 and the alignment film 348.

Although a post spacer (a columnar spacer) is used as the spacer 342 in FIG. 19, the present invention is not limited to this. A bead spacer (a spherical spacer) may be dispersed as the spacer. Further, the spacer 342 may be provided on the pixel electrode 324 provided over the substrate 300.

The thin film transistor 328, the pixel electrode 324 connected to the thin film transistor 328, and the storage capacitor portion 330 are provided over the substrate 300. The pixel electrode 324 and a wiring 318 are connected through an opening portion 323 which penetrates an insulating layer 320 and an insulating layer 322. The insulating layer 320 is provided so as to cover the thin film transistor 328, the wiring 318, and the storage capacitor portion 330. The insulating layer 322 is provided so as to cover the insulating layer 320. The thin film transistor 328 can be formed by any of the methods described in the above embodiment modes (e.g., Embodiment Mode 1). In addition, the storage capacitor portion 330 is formed by sandwiching a gate insulating layer of the thin film transistor 328 between a conductive layer which is formed in the same step and in a manner similar to that of a gate electrode of the thin film transistor 328 and a scan line, and a conductive layer which is formed in the same step and in a manner similar to that of a source electrode of the thin film transistor 328 and a signal line.

A liquid crystal element is formed by overlapping of the pixel electrode 324 which has the alignment film 348, the counter electrode 340 which has the alignment film 346, and the liquid crystal layer 350 interposed therebetween.

FIG. 20 is a top plan view of the substrate 300 side. The pixel electrode 324 is formed using a material similar to that of the pixel electrode layer 118 described in Embodiment Mode 1. The pixel electrode 324 is provided with a slit 325. The slit 325 is used for controlling alignment of the liquid crystals.

A thin film transistor 329 illustrated in FIG. 20 can be formed in a similar manner to the thin film transistor 328. The pixel electrode 326 connected to the thin film transistor 329 can be formed by a material and method similar to those of the pixel electrode 324. In addition, a storage capacitor portion 331 can be formed in a similar manner to the storage capacitor portion 330.

Sources or drains of the thin film transistor 328 and the thin film transistor 329 are connected to a wiring 316. One pixel of this liquid crystal panel includes the pixel electrode 324 and the pixel electrode 326. The pixel electrode 324 and the pixel electrode 326 constitute subpixels.

FIG. 21 is a top plan view of the substrate 301 side. The counter electrode 340 is provided above the light-shielding layer 332. The counter electrode 340 is preferably formed using a material which is similar to that of the pixel electrode 324. The protrusion 344 for controlling alignment of the liquid crystals is provided in contact with the counter electrode 340. In addition, the spacer 342 is provided in a predetermined region overlapping with the light-shielding layer 332. Note that in FIG. 21, hatching is done only on the light-shielding layer 332, the spacer 342, and the protrusion 344.

Figure 22:
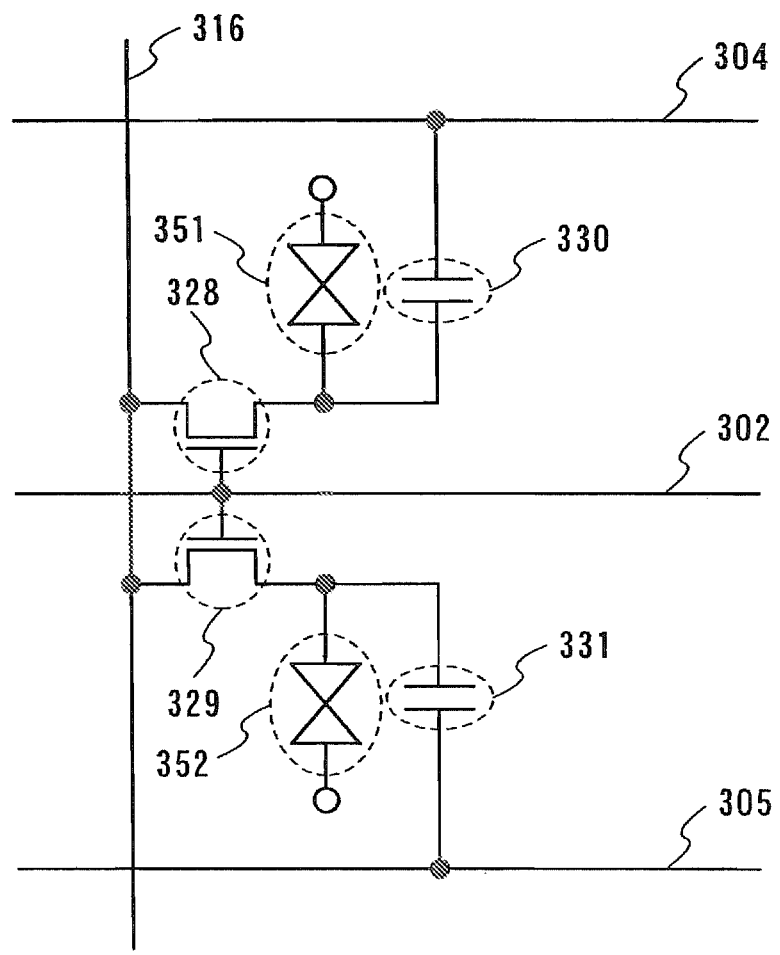

FIG. 22 illustrates an equivalent circuit of the above-described pixel structure. Gates of the thin film transistor 328 and the thin film transistor 329 are both connected to a wiring 302 functioning as a scan line. One of a source and a drain each of the thin film transistor 328 and the thin film transistor 329 is connected to the wiring 316, and the other thereof is connected to the wiring 304 and the wiring 305 via the storage capacitor portion 330 or the storage capacitor portion 331. In FIG. 22, when a potential of a wiring 304 functioning as a capacitor line and a potential of a wiring 305 functioning as a capacitor line are different, operations of a liquid crystal element 351 and a liquid crystal element 352 can be different. That is, the viewing angle is increased by individually controlling the potentials of the wiring 304 and the wiring 305.

When voltage is applied to the pixel electrode 324 provided with the slit 325 (the potential of the pixel electrode 324 is different from the potential of the counter electrode 340), electric field distortion is generated near the slit 325 to produce an oblique electric field. When the slits 325 and the protrusions 344 on the substrate 301 side are alternately provided, an oblique electric field is effectively generated, so that alignment of the liquid crystals can be controlled. Therefore, directions of alignment of the liquid crystals are made to be different depending on location. That is, the viewing angle of the liquid crystal panel is increased by domain multiplication.

Next, a VA-mode liquid crystal display device, which is different from the above-described device, is described with reference to FIGS. 23 to 26.

Figure 23:
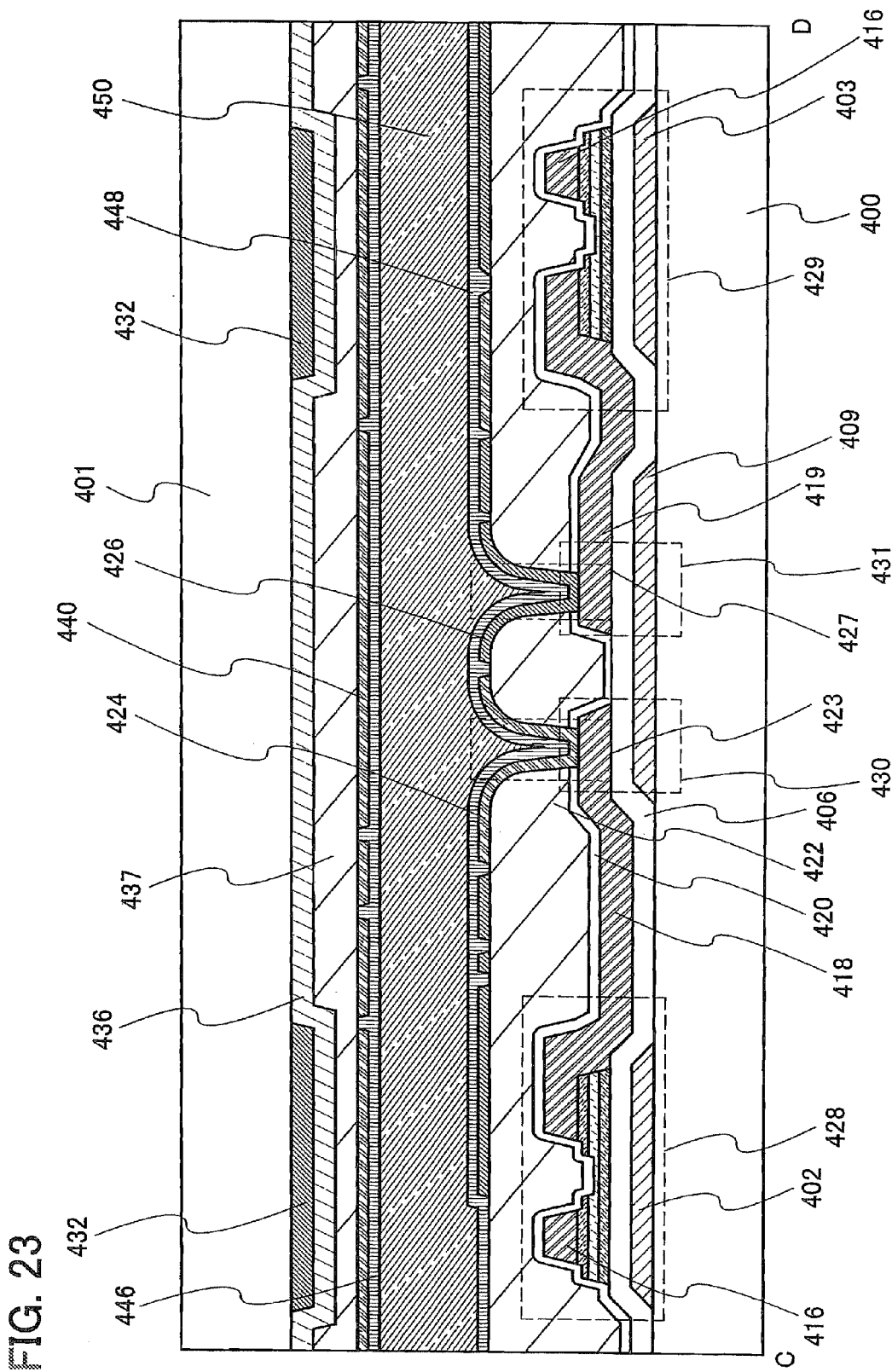
Figure 24:
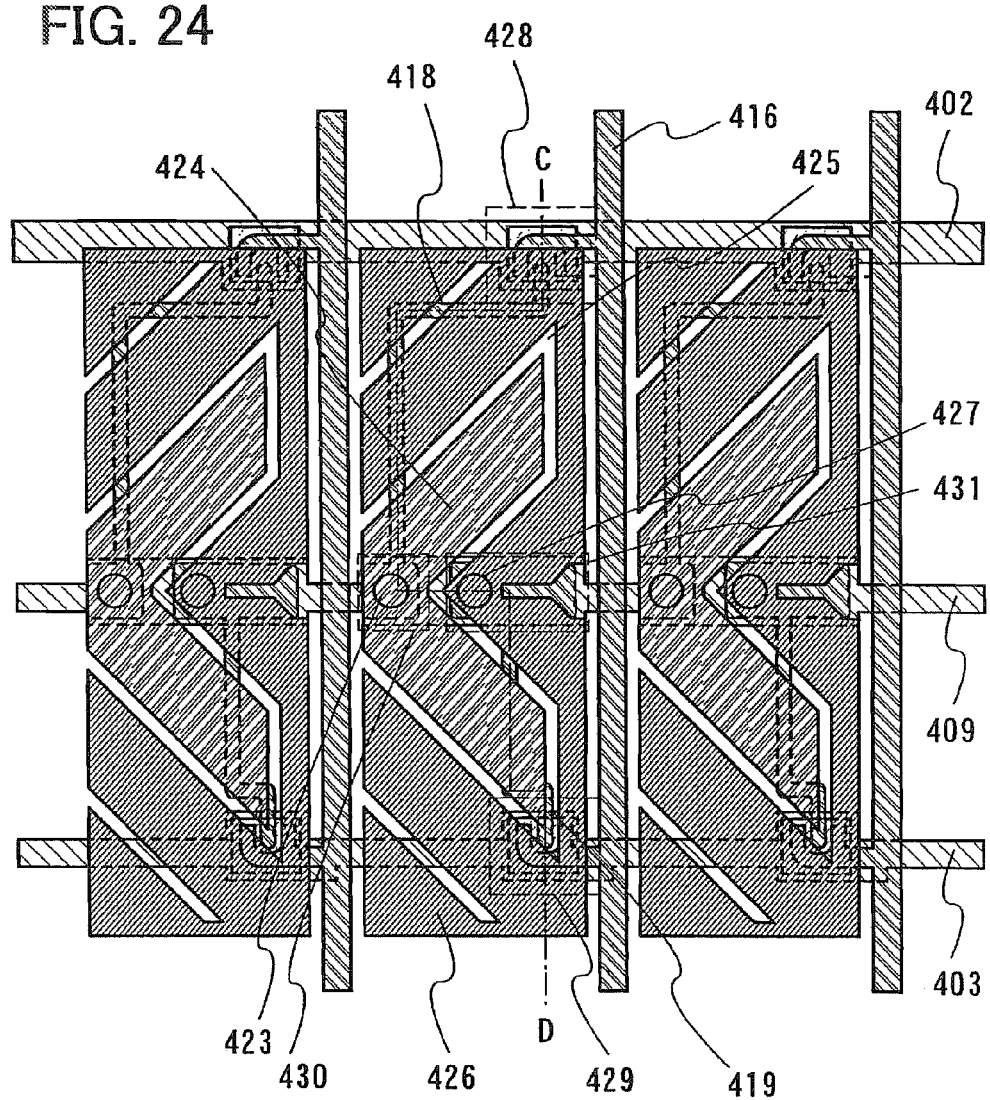
Figure 25:
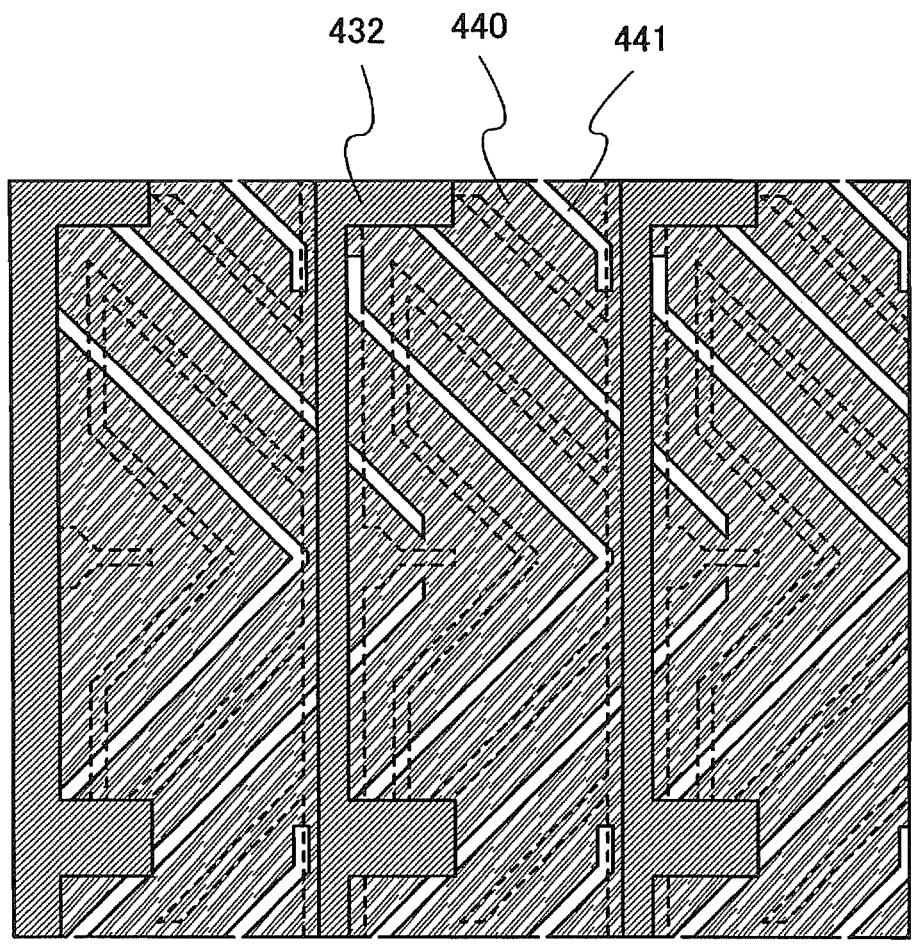

FIG. 24 is a top plan view of a side of a substrate over which a pixel electrode is formed. FIG. 23 illustrates a cross-sectional structure taken along the line C-D in FIG. 24. In addition, FIG. 25 is a top plan view of a side of a substrate on which a counter electrode is formed. Hereinafter, description is made with reference to these drawings.

Figure 26:
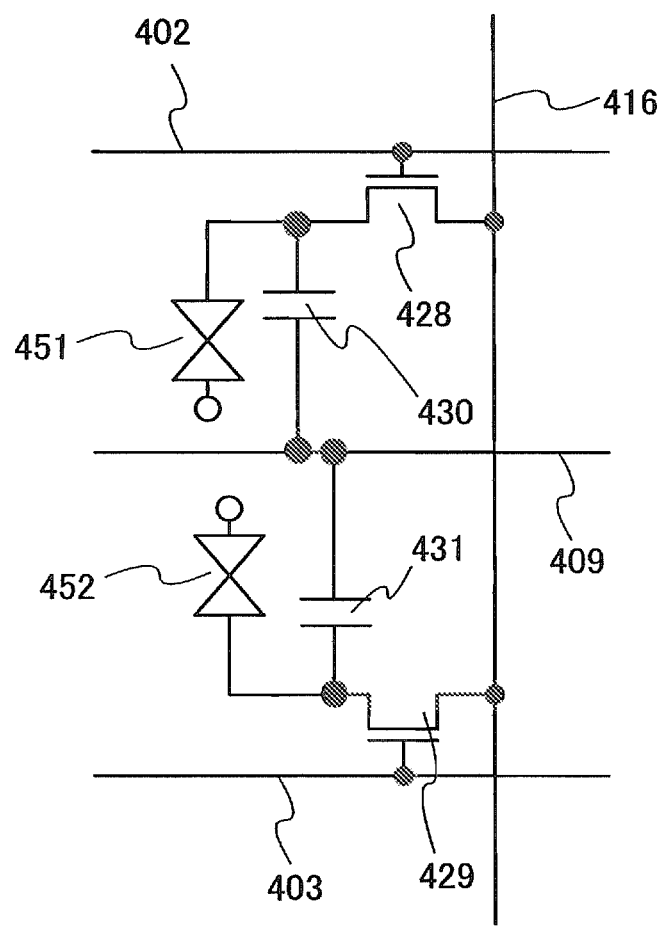

In each of the pixels of the liquid crystal display device, which are illustrated in FIGS. 23 to 26, one pixel includes a plurality of pixel electrodes and a thin film transistor is connected to each of the plurality of pixel electrodes. That is, the pixel is a multi-domain pixel. The thin film transistors are driven by different gate signals. In other words, signals supplied to the respective pixel electrodes can be controlled separately (FIG. 26).

A pixel electrode 424 is connected to a thin film transistor 428 by a wiring 418 through an opening portion 423. A pixel electrode 426 is connected to a thin film transistor 429 by a wiring 419 through an opening portion 427. A wiring 402 functioning as a scan line which is connected to a gate electrode of the thin film transistor 428 and a wiring 403 functioning as a scan line which is connected to a gate electrode of the thin film transistor 429 are separated so that different gate signals can be supplied to the gate electrodes. On the other hand, as for a signal line, a wiring 416 is shared between the thin film transistor 428 and the thin film transistor 429. As each of the thin film transistor 428 and the thin film transistor 429, a thin film transistor formed according to a manufacturing method of the above-described embodiment modes can be used as appropriate.

Note that a storage capacitor portion 430 is connected to the thin film transistor 428. A storage capacitor portion 431 is connected to the thin film transistor 429. The storage capacitor portion 430 includes the wiring 409, the wiring 418 and the insulating layer 406 interposed therebetween. The storage capacitor portion 431 includes the wiring 409, the wiring 419, and the insulating layer 406 interposed therebetween. The insulating layer 406 serves as gate insulating layers of the thin film transistor 428 and the thin film transistor 429.

Note that an opening portion 423 and an opening portion 427 are formed to penetrate the insulating layer 420 and the insulating 422 formed covering the thin film transistor 428 and the thin film transistor 429.

Note that the wiring 409 serves as a capacitor line, and is kept at a constant potential (common potential).

The pixel electrode 424 and the pixel electrode 426 have different shapes (FIG. 24) and are separated by the slit 425. Specifically, the pixel electrode 426 is provided so as to surround the external side of the pixel electrode 424 which is spread in a V shape. Timings of voltage application are varied between the pixel electrode 424 and the pixel electrode 426 by using the thin film transistor 428 and the thin film transistor 429, so that alignment of liquid crystals can be controlled. FIG. 26 illustrates an equivalent circuit of this pixel structure. When different gate signals are supplied to the wiring 402 and the wiring 403, operation timings of the thin film transistor 428 and the thin film transistor 429 can be varied.

A substrate 401 which is opposite to the substrate 400 is provided with a light-shielding layer 432, a colored layer 436, and a counter electrode 440. In addition, a planarization layer 437 is formed between the colored layer 436 and the counter electrode 440 and prevents alignment disorder of the liquid crystals. FIG. 25 is a top plan view of the counter substrate side. The counter electrode 440 is shared between different pixels and is provided with a slit 441. When the slit 441 and the slit 425 on the pixel electrodes 424 and 426 side are alternately provided, an oblique electric field is effectively generated, so that alignment of the liquid crystals can be controlled. Therefore, directions of alignment of the liquid crystals can be different in a first liquid crystal element 451 and a second liquid crystal element 452, and a wide viewing angle can be realized.

The first liquid crystal element 451 is formed by overlapping of the pixel electrode 424 having an alignment film 448, a liquid crystal layer 450, and the counter electrode 440 having an alignment film 446. In addition, the second liquid crystal element 452 is formed by overlapping of the pixel electrode 426 having the alignment film 448, the liquid crystal layer 450, and the counter electrode 440 having an alignment film 446. Therefore, in each of the pixel structures shown in FIGS. 23 to 26, a multi-domain structure in which the first liquid crystal element 451 and the second liquid crystal element 452 are provided in one pixel is formed.

The present invention can also be applied to a horizontal electric field-mode liquid crystal display device. A horizontal electric field-mode is a mode in which a liquid crystal layer is driven to express grayscale by horizontally applying an electric field to liquid crystal molecules in a cell. According to a horizontal electric field-mode, the viewing angle can be widened to approximately 180 degrees. Hereinafter, a horizontal electric field-mode liquid crystal display device to which the present invention is applied is described with reference to FIGS. 27 and 28.

Figure 27:
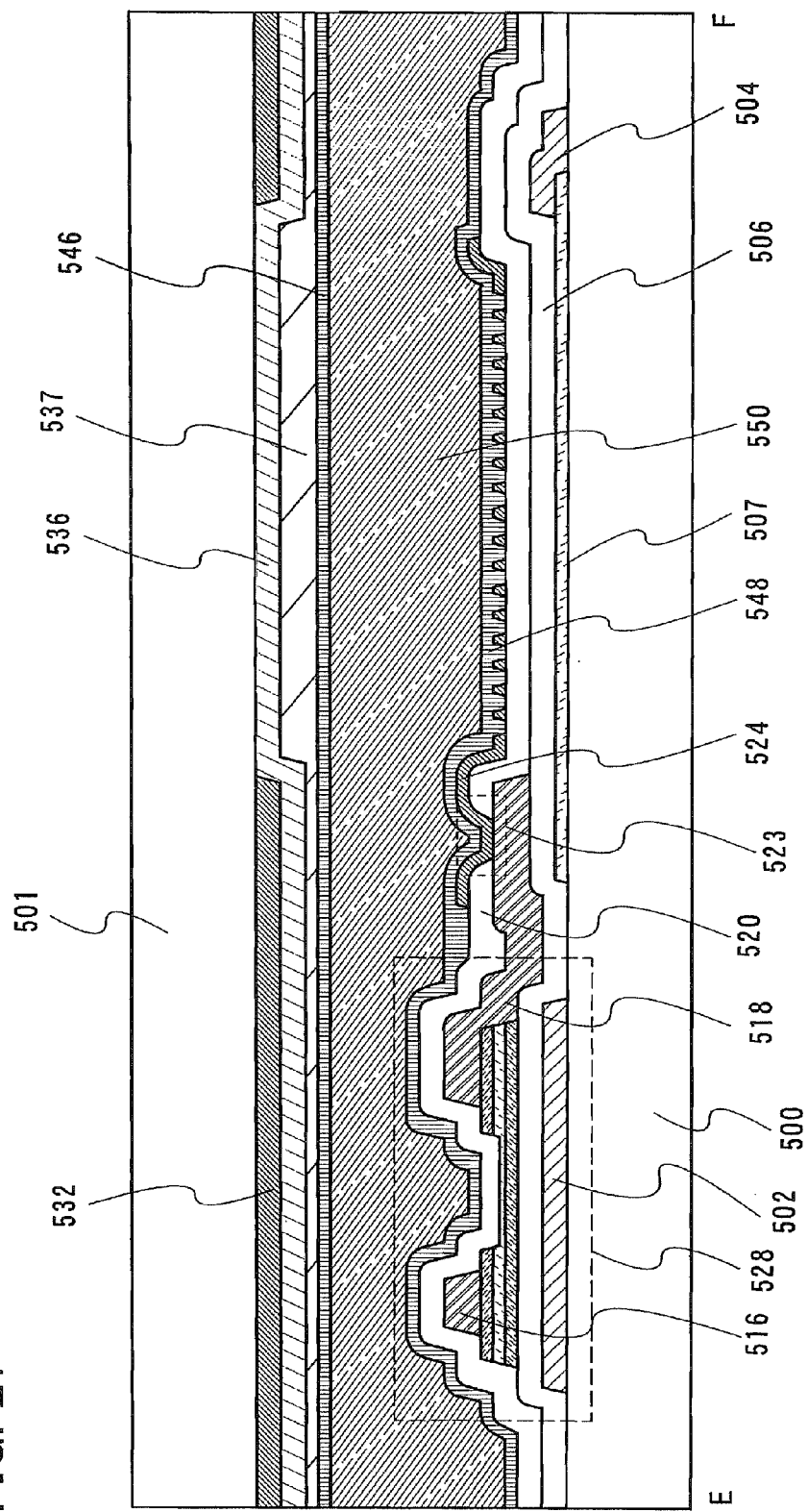

FIG. 27 illustrates a state in which a substrate 500 over which a thin film transistor 528, and a pixel electrode 524 connected to the thin film transistor 528 are provided and a substrate 501 which is opposite to the substrate 500, face with each other, and liquid crystals are injected therebetween. The substrate 501 is provided with a light-shielding layer 532, a colored layer 536, and a planarization layer 537. Although a pixel electrode is provided over the substrate 500, a counter electrode is not provided on the substrate 501. A liquid crystal layer 550 is provided by injection of liquid crystals between the substrate 500 and the substrate 501. Note that the substrate 500 has an alignment film 548, the substrate 501 has the alignment film 546, and the alignment film 546 and the alignment film 548 are provided in contact with the liquid crystal layer 550.

A counter electrode 507, a wiring 504 functioning as a capacitor line which is connected to the counter electrode 507, and the thin film transistor 528 are formed over the substrate 500. A thin film transistor formed according to any of the above embodiment modes (e.g., Embodiment Mode 1) can be used as the thin film transistor 528 as appropriate. The counter electrode 507 can be formed using a material which is similar to that of the pixel electrode layer 118 described in Embodiment Mode 1. In addition, the counter electrode 507 is formed in a shape which is compartmentalized roughly in a pixel shape. Note that a first insulating layer 506 is formed over the counter electrode 507 and the wiring 504. The first insulating layer 506 is formed over the wiring 502 serving as a gate electrode of the thin film transistor 528, and the first insulating layer 506 serves as a gate insulating layer of the thin film transistor 528.

A source electrode and a drain electrode of the thin film transistor 528 and a wiring 516 and a wiring 518 which are connected to the source electrode and the drain electrode of the thin film transistor 528 are formed over the first insulating layer 506. The wiring 516 is a signal line to which a video signal is input in a liquid crystal display device. The wiring 516 is a wiring extending in one direction, is connected to one of source and drain regions of the thin film transistor 528 and serves as one of the source electrode and the drain electrode. The wiring 518 is connected to the other of the source electrode and the drain electrode and the pixel electrode 524.

A second insulating layer 520 is formed over the wiring 516 and the wiring 518. In addition, the pixel electrode 524 connected to the wiring 518 through an opening portion 523 formed in the second insulating layer 520 is provided over the second insulating layer 520. The pixel electrode 524 is formed using a material which is similar to that of the pixel electrode layer 118 described in Embodiment Mode 1.

As described above, the thin film transistor 528 and the pixel electrode 524 connected to the thin film transistor 528 are provided over the substrate 500. Note that a storage capacitor is formed between the counter electrode 507 and the pixel electrode 524.

Figure 28:
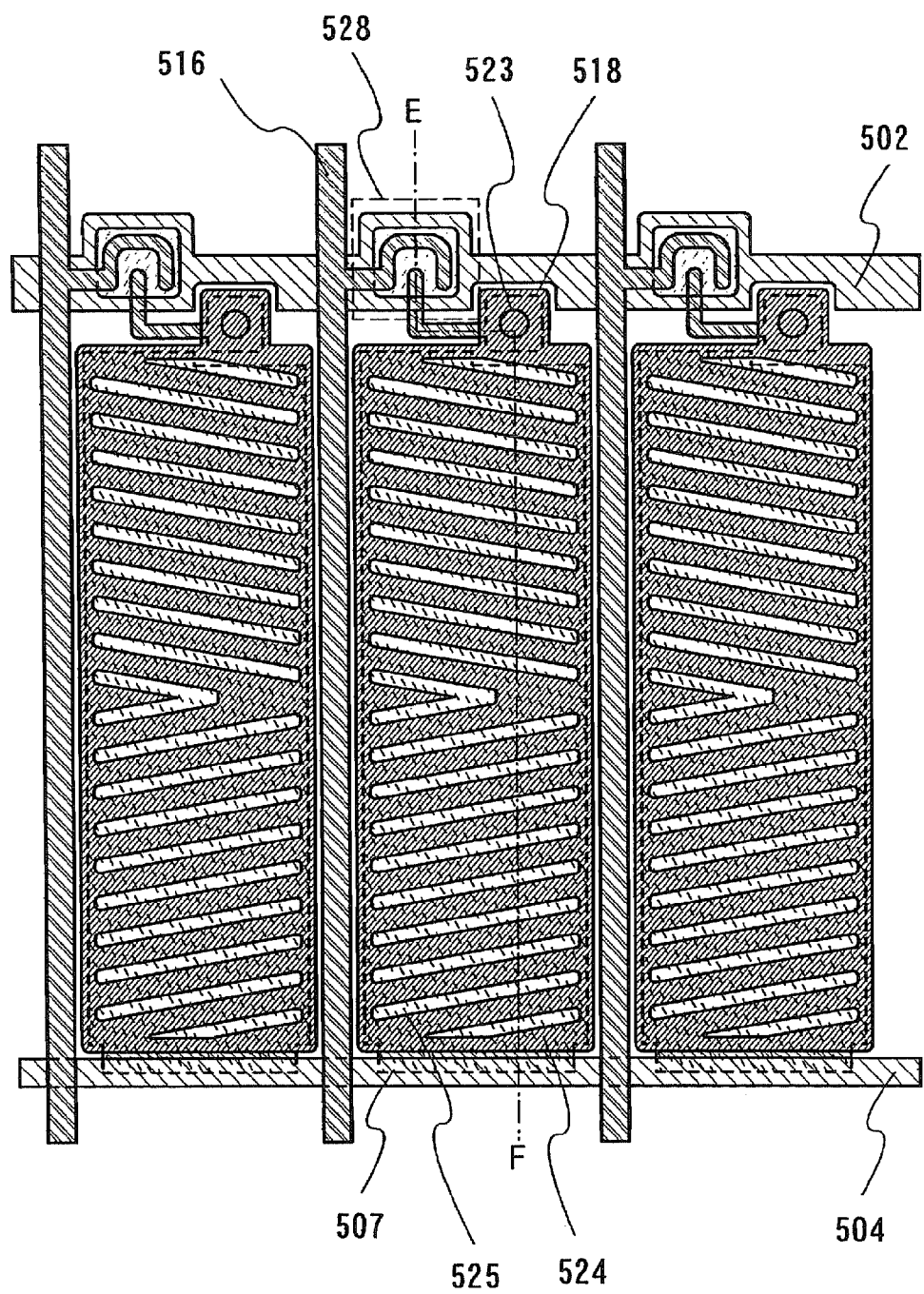

FIG. 28 is a plan view showing the structure of the pixel electrodes. The pixel electrode 524 is provided with a slit 525. The slit 525 is used for controlling alignment of the liquid crystals. In this case, an electric field is generated between the counter electrode 507 and the pixel electrode 524. The first insulating layer 506 is formed between the counter electrode 507 and the pixel electrode 524 and has a thickness of approximately 50 nm to 200 nm, which is much thinner than the liquid crystal layer having a thickness of 2 µm to 10 µm. Accordingly, an electric field is generated substantially in a parallel direction (in a horizontal direction) to the substrate 500. Alignment of the liquid crystals is controlled by the electric field. The liquid crystal molecules are horizontally rotated by utilizing the electric field which is approximately parallel to the substrate. In this case, since the liquid crystal molecules are parallel to the substrate in any state, contrast or the like is hardly affected by change in angle of viewing. That is, a wide viewing angle can be realized. Further, since both the counter electrode 507 and the pixel electrode 524 are light-transmitting electrodes, a high aperture ratio can be obtained.

Next, a horizontal electric field-mode liquid crystal display device, which is different from the above-described device, is described with reference to FIG. 29 and FIG. 30.

Figure 29:
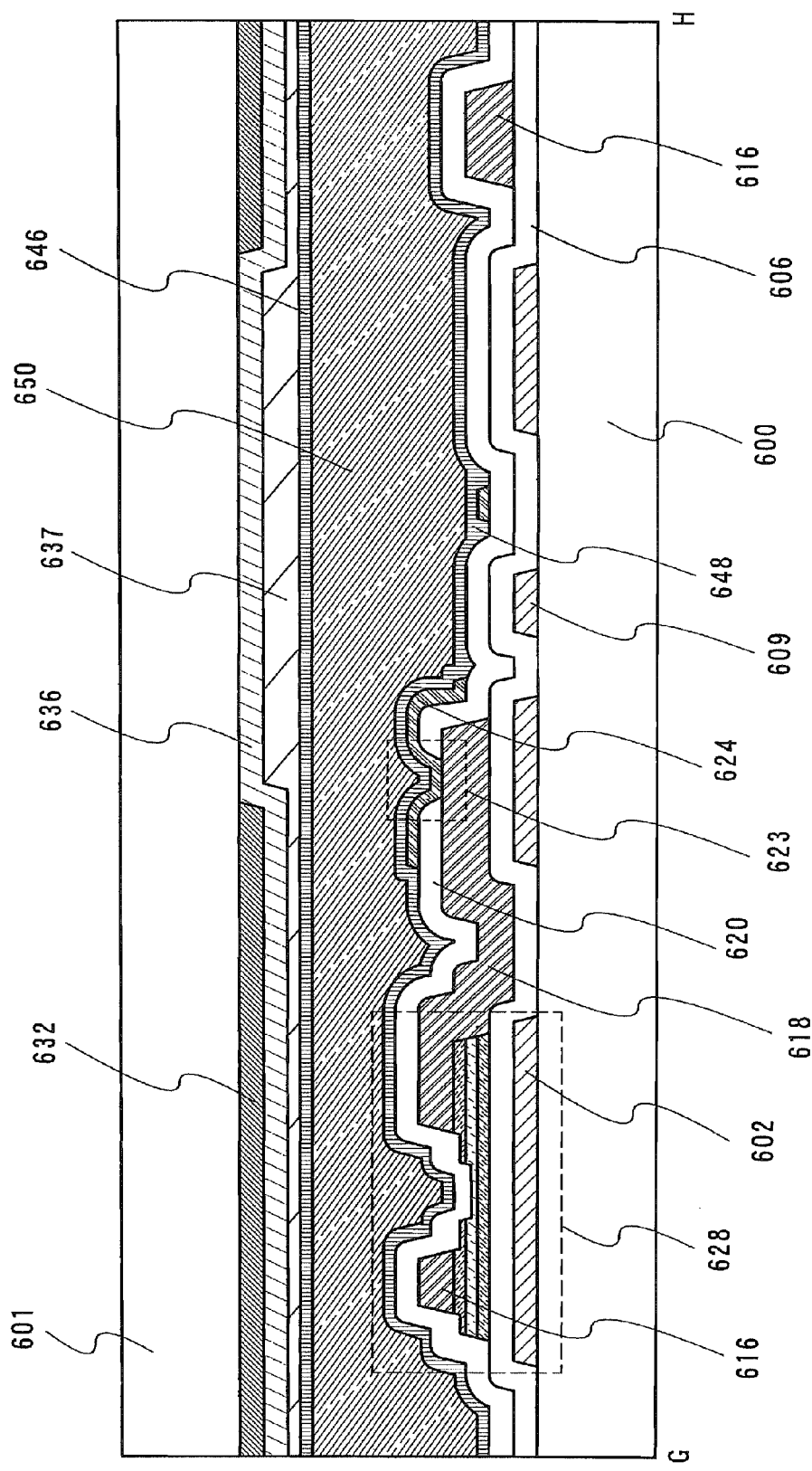
Figure 30:
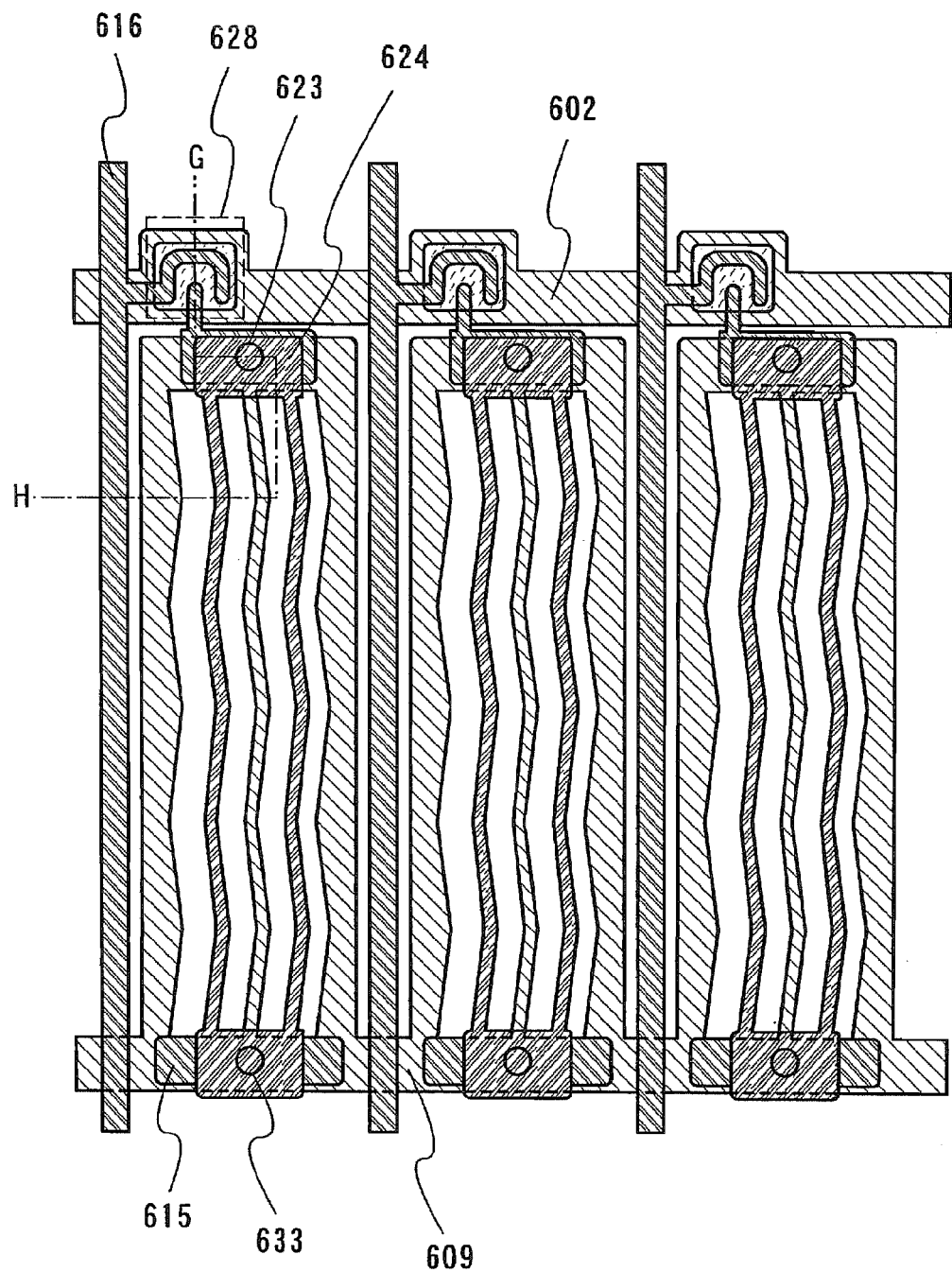

FIG. 29 and FIG. 30 each show a pixel structure of a horizontal-electric field mode liquid crystal display device. FIG. 30 is a top plan view. FIG. 29 illustrates a cross-sectional structure taken along the line G-H in FIG. 30.

FIG. 29 illustrates a state in which a substrate 600 over which a thin film transistor 628 and a pixel electrode 624 connected to the thin film transistor 628 are provided and a substrate 601 which is opposite to the substrate 600 face with each other and liquid crystals are injected therebetween. The substrate 601 is provided with a light-shielding layer 632, a colored layer 636, a planarization layer 637, and the like. Although a pixel electrode is provided over the substrate 600, a pixel electrode is not provided on the substrate 601. A liquid crystal layer 650 is provided by injection of liquid crystals between the substrate 600 and the substrate 601. Note that the substrate 600 has an alignment film 648, the substrate 601 has the alignment film 646, and the alignment film 646 and the alignment film 648 are provided in contact with the liquid crystal layer 650.

The substrate 600 is provided with a wiring 609 kept at a common potential and the thin film transistor 628 formed according to any of the methods described in the above embodiment modes (e.g., Embodiment Mode 1). The wiring 609 can be formed in the same step as a scan line 602 of the thin film transistor 628. A counter electrode (common electrode) is formed in the same layer as the wiring 609 and formed in a shape which is compartmentalized roughly in a pixel shape.

A wiring 616 and a wiring 618 which each are connected to a source electrode and a drain electrode of the thin film transistor 628 are formed over a first insulating layer 606. Note that the first insulating layer 606 serves as a gate insulating film of the thin film transistor 628. The wiring 616 is a signal line to which a video signal is input in a liquid crystal display device. The wiring 616 is a wiring extending in one direction, is connected to one of source and drain region of the thin film transistor 628 and serves as one of the source electrode and the drain electrode thereof. The wiring 618 is connected to the other of the source electrode and the drain electrode and the pixel electrode 624. Note that a thin film transistor formed according to any of the methods in the above-described embodiment modes can be used as the thin film transistor 628 as appropriate.

A second insulating layer 620 is formed over the wiring 616 and the wiring 618. In addition, the pixel electrode 624 connected to the wiring 618 through an opening portion 623 formed in the second insulating layer 620 is formed over the second insulating layer 620. The pixel electrode 624 is formed using a material which is similar to that of the pixel electrode layer 118 described in Embodiment Mode 1. Note that as shown in FIG. 30, the pixel electrode 624 is formed so as to generate a horizontal electric field between the pixel electrode 624 and a comb-shaped electrode which is formed at the same time as the wiring 609. Further, the pixel electrode 624 is formed so that comb-shaped portions of the pixel electrode 624 and the counter electrode (common electrode) which is formed at the same time as the wiring 609 are alternately provided.

Alignment of the liquid crystals can be controlled by an electric field which is almost parallel to the substrate, generated by a potential difference between a potential applied to the pixel electrode 624 and a potential of the wiring 609. The liquid crystal molecules are horizontally rotated by utilizing the electric field which is approximately parallel to the substrate, whereby the alignment of the liquid crystals can be controlled. In this case, since the longitudinal axes of the liquid crystal molecules are almost parallel to the substrate in any state, contrast or the like is hardly affected by change in angle of viewing. Therefore, a wide viewing angle can be realized.

As described above, the thin film transistor 628 and the pixel electrode 624 connected to the thin film transistor 628 are provided over the substrate 600. A storage capacitor is formed by providing the first insulating layer 606 between the wiring 609 and a capacitor electrode 615. The capacitor electrode 615 which is formed at the same time as the wiring 616 and the pixel electrode 624 are connected through an opening portion 623.

The present invention can also be applied to a TN-mode liquid crystal display device. Thus, a mode of a TN-mode liquid crystal display device to which the present invention is applied is described below with reference to FIG. 31 and FIG. 32.

Figure 31:
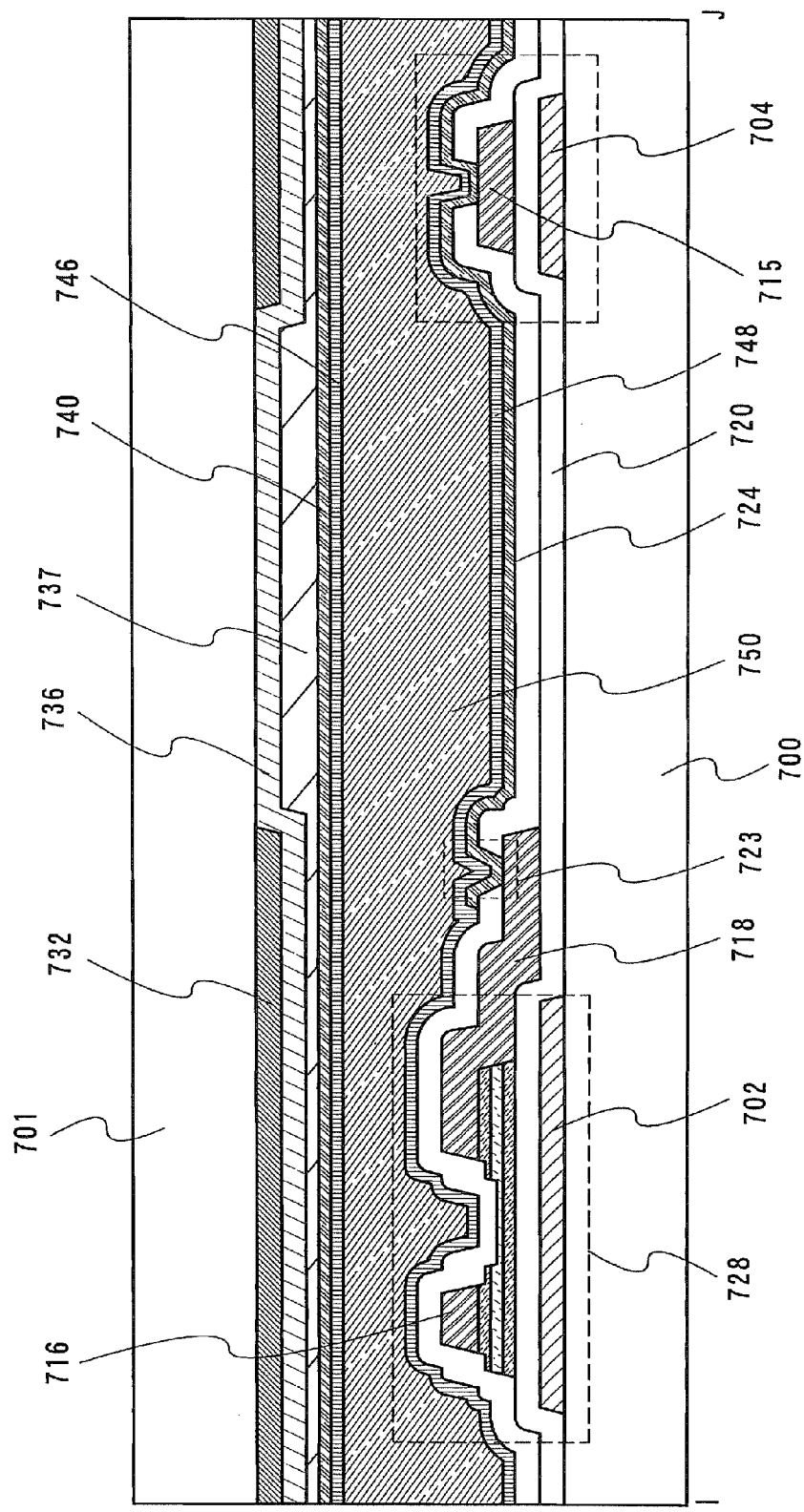
Figure 32:
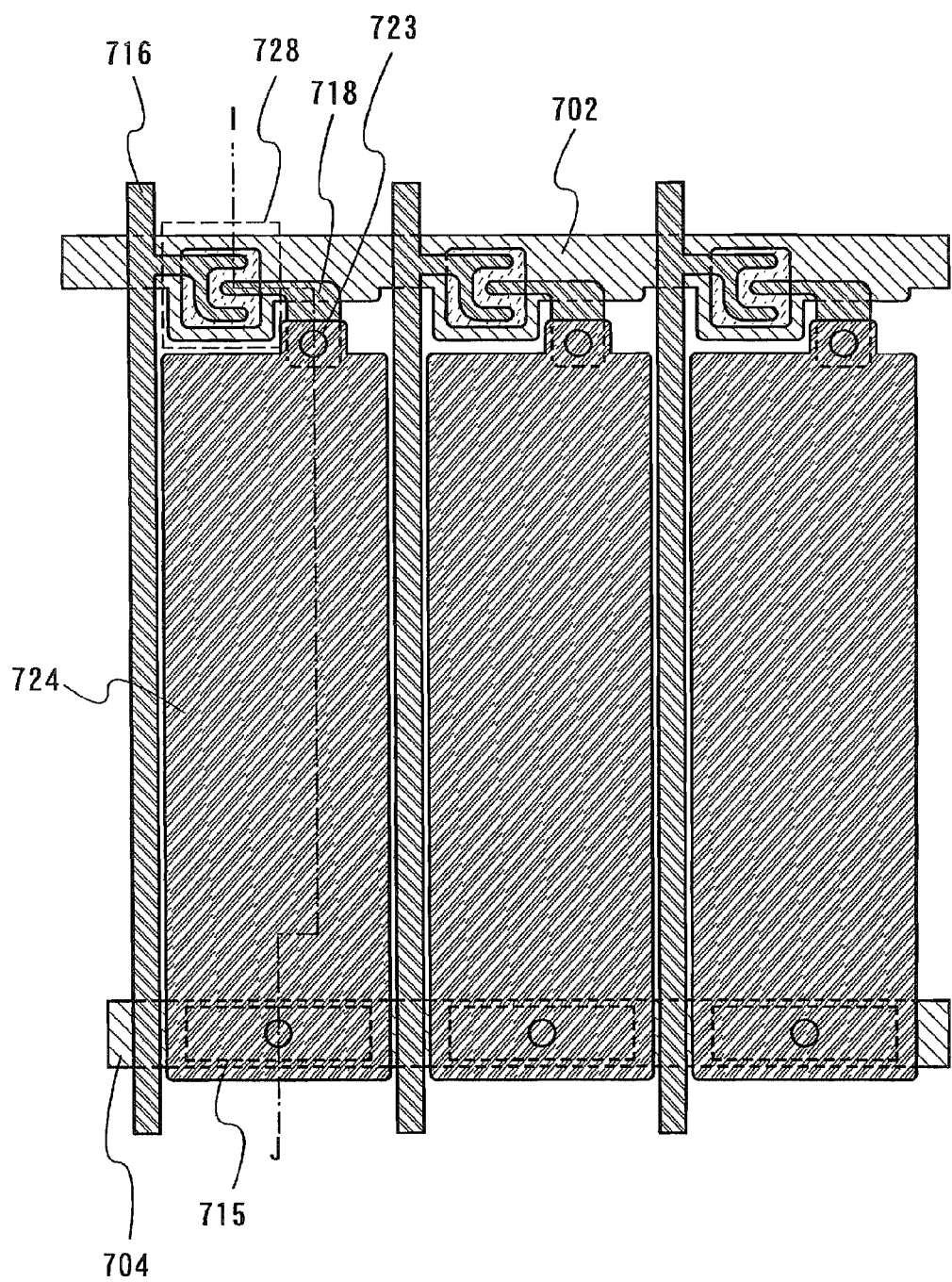

FIG. 31 and FIG. 32 each show a pixel structure of a TN-mode liquid crystal display device. FIG. 32 is a top plan view. FIG. 31 illustrates a cross-sectional structure taken along the line I-J in FIG. 32. Hereinafter, description is made with reference to FIG. 31 and FIG. 32.

Over a substrate 700, a pixel electrode 724 is connected to a thin film transistor 728 by a wiring 718 through an opening portion 723. The wiring 716 functioning as a signal line is connected to the thin film transistor 728. The wiring 702 serves as a scan line. Note that a thin film transistor formed according to any of the methods in the above embodiment modes (e.g., Embodiment Mode 1) can be used as the thin film transistor 728 as appropriate.

The pixel electrode 724 is formed using a material which is similar to that of the pixel electrode layer 118 described in Embodiment Mode 1.

A substrate 701 opposite to the substrate 700 is provided with a light-shielding layer 732, a colored layer 736, and a counter electrode 740. In addition, a planarization layer 737 is formed between the colored layer 736 and the counter electrode 740 and prevents alignment disorder of the liquid crystals. A liquid crystal layer 750 is provided between the pixel electrode 724 and the counter electrode 740. Note that an alighment film 748 is provided between the liquid crystal layer 750 and the pixel electrode 724, and an alignment film 746 is provided between the liquid crystal layer 750 and the counter electrode 740.

A liquid crystal element is formed by overlapping of the pixel electrode 724, the liquid crystal layer 750, and the counter electrode 740.

A shielding layer (a black matrix) or a colored layer serving as a color filter may be provided over a substrate 700. Further, a polarizing plate is attached to a surface (rear surface) of the substrate 700, which is opposite to a surface over which the thin film transistor and the like are provided. A polarizing plate is attached to a surface (rear surface) of the substrate 701, which is opposite to a surface on which the counter electrode 740 and the like are formed.

A material which is similar to that of the pixel electrode 724 can be used as the counter electrode 740 as appropriate. A liquid crystal element is formed by overlapping of the pixel electrode 724, the liquid crystal layer 750, and the counter electrode 740.

The storage capacitor includes the wiring 704, the wiring 715 and the insulating layer 720 interposed therebetween.

Note that in the referred drawings in the above description, gate electrodes and scan lines are formed in the same layers and are denoted by the same reference numerals. Similarly, source electrodes, drain electrodes, and signal lines are formed in the same layers and are denoted by the same reference numerals.

Through the above-described steps, the liquid crystal display device can be manufactured. The thin film transistor included in the liquid crystal display device in this embodiment mode is formed according to any of the methods of the above-described embodiment modes. Therefore, since the thin film transistor has a small amount of off current and high reliability in electric characteristics, the liquid crystal display device described in this embodiment mode can have high contrast and high visibility.

(Embodiment Mode 6)

The present invention can be applied not only to a liquid crystal display device but also a light-emitting device. In this embodiment mode, a manufacturing process of light-emitting devices are described with reference to FIGS. 33A and 33B and FIGS. 34A to 34C. A light-emitting element utilizing electroluminescence is used for a light-emitting device. Light-emitting elements utilizing electroluminescence are classified according to whether a light-emitting material is an organic compound or an inorganic compound. In general, the former is referred to as organic EL elements and the latter as inorganic EL elements.

In an organic EL element, when voltage is applied to a light-emitting element, carriers (electrons and holes) are injected from a pair of electrodes into a layer containing a light-emitting organic compound, and current flows therein. Then, recombination of these carriers (the electrons and holes) allows the light-emitting organic compound to form an excited state and to emit light when the carriers in the organic compound return from the excited state to a ground state. Due to such a mechanism, such a light-emitting element is referred to as a current-excitation type light-emitting element.

Inorganic EL elements are classified into a dispersion type inorganic EL element and a thin-film type inorganic EL element depending on their element structures. A dispersion type inorganic EL element has a light-emitting layer where particles of a light-emitting material are dispersed in a binder, and its light emission mechanism is donor-acceptor recombination type light emission which utilizes a donor level and an acceptor level. A thin-film type inorganic EL element has a structure where a light-emitting layer is sandwiched between dielectric layers, which are further sandwiched between a pair of electrodes, and its light emission mechanism is localized type light emission which utilizes inner-shell electron transition of metal ions.

Note that here, an organic EL element is used as a light-emitting element. In addition, a thin film transistor formed according to any of the methods of the above-described embodiment modes is used as a thin film transistor which controls driving of a light-emitting element.

A thin film transistor 801 and a thin film transistor 802 are formed over a substrate 800, as illustrated in FIG. 33A. In FIG. 33A, an insulating layer 803 functioning as a protective layer is formed over the thin film transistors 801 and 802, and an insulating layer 804 is formed over the insulating layer 803. The insulating layer 804 is provided for flattening a top surface. The insulating layer 803 may be formed using silicon oxide, silicon nitride, silicon oxynitride or the like, for example. The insulating layer 804 is preferably formed using an organic resin such as acrylic, polyimide, or polyamide, or siloxane.

A conductive layer 805 is formed over the insulating layer 804. The conductive layer 805 functions as a pixel electrode. In the case where the thin film transistor of a pixel is an n-channel transistor, it is preferable to form a cathode as the pixel electrode. On the other hand, in the case where the thin film transistor is a p-channel transistor, it is preferable to form an anode as the pixel electrode. Specifically, in a case a cathode serves as a pixel electrode, a material with low work function, such as Ca, Al, CaF, MgAg, or AlLi, may be used.

Next, as illustrated in FIG. 33B, a partition 806 is formed over the insulating layer 804 and a side face (an end portion) of the conductive layer 805. The partition 806 has an opening portion and the conductive layer 805 is exposed through the opening portion. The partition 806 is formed with an organic resin layer, an inorganic insulating layer, or organic polysiloxane. More preferably, the partition 806 is formed using a photosensitive material, the partition 806 over the conductive layer 805 is exposed to light so that an opening portion is formed. In this case, a sidewall of the opening portion is preferably formed as a tilted surface with continuous curvature.

Next, a light-emitting layer 807 is formed so as to be in contact with the conductive layer 805 in the opening portion of the partition 806. The light-emitting layer 807 may be formed with either a single-layer structure or a stacked-layer structure of a plurality of layers.

Then, a conductive layer 808 is formed so as to cover the light-emitting layer 807. The conductive layer 808 is referred to as a common electrode. In a case where the conductive layer 805 is formed using a material for a cathode, the conductive layer 808 is formed using a material used to form an anode. The conductive layer 808 can be formed of a light-transmitting conductive layer using any of the light-transmitting conductive materials described in Embodiment Mode 1 for the pixel electrode layer 118. As the conductive layer 808, a titanium nitride layer or a titanium layer may be used. In FIG. 33B, indium tin oxide (ITO) is used for the conductive layer 808. In the opening portion of the partition 806, a light-emitting element 809 is formed by overlapping of the conductive layer 805, the light-emitting layer 807, and the conductive layer 808. After that, it is preferable to form a protective layer 810 over the conductive layer 808 and the partition 806 so that oxygen, hydrogen, moisture, carbon dioxide, and the like cannot enter the light-emitting element 809. As the protective layer 810, a silicon nitride layer, a silicon nitride oxide layer, a DLC layer, or the like can be used.

More preferably, after the steps of FIG. 33B is finished, packaging (encapsulation) is performed using a protective film (a laminate film, an ultraviolet curable resin film, or the like) or a cover material, which has high airtightness and causes less degassing so as to prevent exposure to air.

Next, structures of light-emitting elements are described with reference to FIGS. 34A to 34C. Here, the case where a driving transistor is an n-channel transistor is illustrated as an example, and cross-sectional structures of pixels are described.

It is acceptable as long as light-emitting element has a transparent electrode for at least one of an anode and a cathode in order to extract light emission. There are light-emitting elements having the following structures: a top emission structure where a thin film transistor and a light-emitting element are formed over a substrate and light is extracted from a side opposite to the substrate; a bottom emission structure where light is extracted from the substrate side; and a dual emission structure where light is extracted from both the substrate side and the side opposite to the substrate. The present invention can be applied to a light-emitting element with any of the emission structures.

Figure 34A:
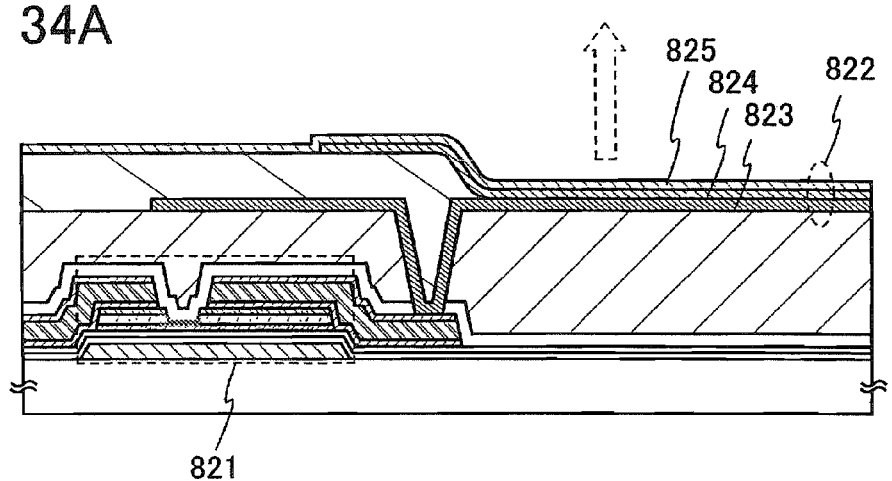

FIG. 34A illustrates a light-emitting element having a top emission structure. FIG. 34A is a cross-sectional view of a pixel in the case where a driving transistor 821 is an n-channel thin film transistor and light is emitted from a light-emitting element 822 to an anode 825 side. In FIG. 34A, a cathode 823 of the light-emitting element 822 is electrically connected to the driving transistor 821, and a light-emitting layer 824 and the anode 825 are sequentially stacked over the cathode 823. The cathode 823 may be formed using a conductive material that has a low work function and can reflect light (for example, calcium, aluminum, calcium fluoride, a silver magnesium alloy, a lithium aluminum alloy, or the like). The light-emitting layer 824 may be formed using either a single-layer structure or a stacked-layer structure of a plurality of layers. In the case of using a plurality of layers, an electron injection layer, an electron transport layer, a light-emitting layer, a hole transport layer, and/or a hole injection layer are stacked in that order over the cathode 823. Note that all these layers are not necessarily provided. The anode 825 is formed using a light-transmitting conductive layer which transmits light, and for example, a light-transmitting conductive layer of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like may be used.

A region where the light-emitting layer 824 is sandwiched between the cathode 823 and the anode 825 corresponds to the light-emitting element 822. In the case of the pixel shown in FIG. 34A, light is emitted from the light-emitting element 822 to the anode 825 side, as indicated by an outlined arrow.

Figure 34B:
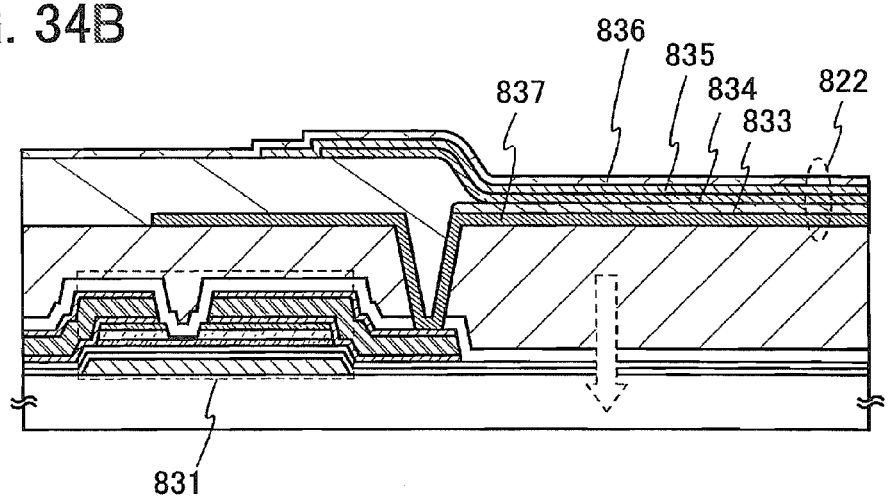

FIG. 34B illustrates a light-emitting element having a bottom emission structure. FIG. 34B is a cross-sectional view of a pixel in the case where a driving transistor 831 is an n-channel thin film transistor and light is emitted from a light-emitting element 822 to a cathode 833 side. In FIG. 34B, the cathode 833 of the light-emitting element 822 is formed over a light-transmitting conductive layer 837 which is electrically connected to the driving transistor 831, and a light-emitting layer 834 and an anode 835 are sequentially stacked over the cathode 833. Note that in the case where the anode 835 has light-transmitting properties, a shielding layer 836 for reflecting or shielding light may be formed so as to cover the anode 835. In a manner similar to that of the case of FIG. 34A, the cathode 833 may be a conductive layer formed using a material having a low work function, and a known material can be used therefor. Note that the thickness is set so that light can be transmitted therethrough (preferably about 5 nm to 30 nm). For example, aluminum having a thickness of 20 nm can be used as the cathode 833. In a manner similar to that of the case of FIG. 34A, the light-emitting layer 834 can be formed using either a single-layer structure or a stacked-layer structure of a plurality of layers. Although the anode 835 does not need to be able to transmit light, the anode 835 can be formed using a light-transmitting conductive material in a manner similar to that of FIG. 34A. The light-shielding layer 836 can be formed using, for example, a metal layer which reflects light, or the like. However, the present invention is not limited to this. For example, a resin to which a black pigment is added can also be used.

A region where the light-emitting layer 834 is sandwiched between the cathode 833 and the anode 835 corresponds to the light-emitting element 822. In the case of the pixel shown in FIG. 34B, light is emitted from the light-emitting element 822 to the cathode 833 side as indicated by an outlined arrow.

Figure 34C:
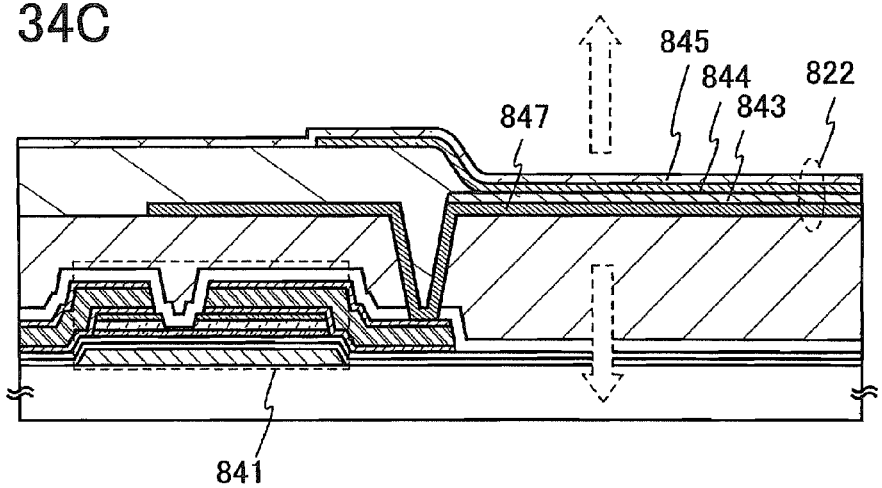

Next, FIG. 34C illustrates a light-emitting element having a dual emission structure. In FIG. 34C, a cathode 843 of a light-emitting element 822 is formed over a light-transmitting conductive layer 847 which is electrically connected to a driving transistor 841, and a light-emitting layer 844 and an anode 845 are sequentially stacked over the cathode 843. In a manner similar to that of FIG. 34A, the cathode 843 can be formed using a material having a low work function, and a known material can be used therefor. Note that the thickness is set so that light is transmitted therethrough. For example, an aluminum film formed to a thickness of about 20 nm can be used as the cathode 843. In a manner similar to that of FIG. 34A, the light-emitting layer 844 may be formed using either a single-layer structure or a stacked-layer structure of a plurality of layers. In a manner similar to that of FIG. 34A, the anode 845 can be formed using a light-transmitting conductive material.

A region where the cathode 843, the light-emitting layer 844, and the anode 845 overlap with each other corresponds to the light-emitting element 822. In the case of the pixel shown in FIG. 34C, light is emitted from the light-emitting element 822 to both the anode 845 side and the cathode 843 side as indicated by outlined arrows.

Note that although an organic EL element is described here as a light-emitting element, an inorganic EL element can also be used as a light-emitting element.

Note that although the example in which a thin film transistor (a driving transistor) which controls driving of a light-emitting element is directly connected to the light-emitting element is described in this embodiment mode, a transistor for controlling current may be connected between the driving transistor and the light-emitting element.

Note that the light-emitting device described in this embodiment mode is not limited to the structures shown in FIGS. 34A to 34C, and can be modified in various ways based on the technical idea of the present invention.

Through the above-described steps, the light-emitting device can be manufactured. A thin film transistor formed according to any of the methods of the above-described embodiment modes is used as the thin film transistor included in the light-emitting device of this embodiment mode. Therefore, since the thin film transistor has small off current and high reliability in electric characteristics, the light-emitting device described in this embodiment mode can have high contrast and high visibility.

(Embodiment Mode 7)

Next, a mode of a display panel which is incorporated in the display device described in Embodiment Mode 5 or a light-emitting panel which is incorporated in the light-emitting device described in Embodiment Mode 6 is described with reference to drawings.

In a liquid crystal display device or light-emitting device of the present invention, a signal line driver circuit and a scan line driver circuit which are connected to a pixel portion are preferably provided over a different substrate (e.g., a semiconductor substrate or an SOI substrate) and connected. However, the signal line driver circuit and the scan line driver circuit may be formed over the same substrate as a pixel circuit, instead of separately providing the signal line driver circuit and the scan line driver circuit.

Note that a connection method of a substrate which is separately formed is not particularly limited, and a known COG method, wire bonding method, TAB method, or the like can be used. Further, a connection position is not particularly limited to a certain position as long as electric connection is possible. Moreover, a controller, a CPU, a memory, and/or the like may be formed separately and connected to the pixel circuit.

Figure 35:
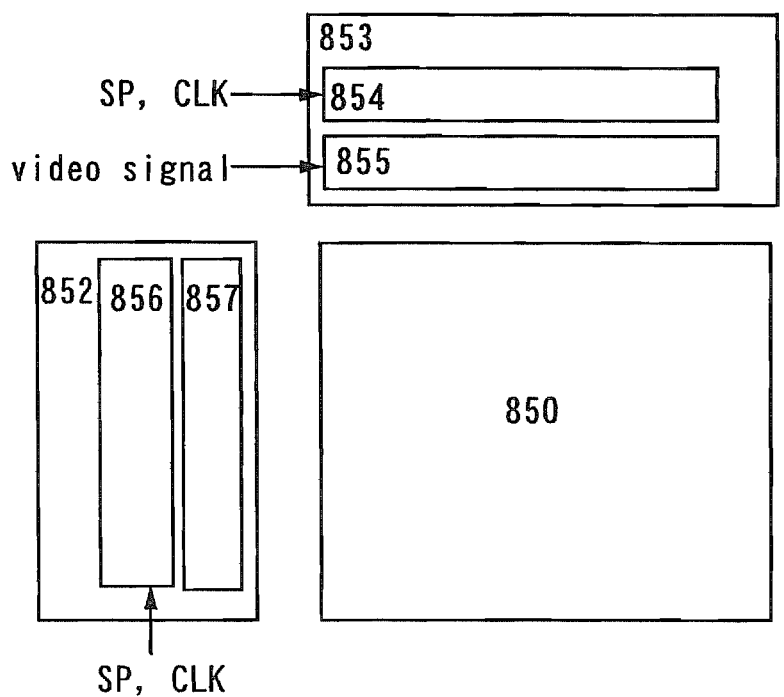

FIG. 35 is a block diagram of a display device of the present invention. The display device shown in FIG. 35 includes a pixel portion 850 including a plurality of pixels each provided with a display element, a scan line driver circuit 852 which selects each pixel, and a signal line driver circuit 853 which controls input of a video signal to a selected pixel.

Note that the display device of the present invention is not limited to the structure shown in FIG. 35. That is, a signal line driver circuit used in the present invention is not limited to a structure including only a shift register and an analog switch. In addition to the shift register and the analog switch, another circuit such as a buffer, a level shifter, or a source follower may be included. Further, the shift register and the analog switch are not necessarily provided. For example, another circuit such as a decoder circuit by which a signal line can be selected may be used instead of the shift register, or a latch or the like may be used instead of the analog switch.

The signal line driver circuit 853 shown in FIG. 35 includes a shift register 854 and an analog switch 855. A clock signal (CLK) and a start pulse signal (SP) are input to the shift register 854. When the clock signal (CLK) and the start pulse signal (SP) are input, a timing signal is generated in the shift register 854 and the timing single is input into the analog switch 855.

In addition, a video signal is supplied to the analog switch 855. The analog switch 855 samples the video signal in accordance with the input timing signal and supplies the sampled signal to a signal line of the next stage.

The scan line driver circuit 852 shown in FIG. 35 includes a shift register 856 and a buffer 857. The scan line driver circuit 852 may also include a level shifter in some cases. In the scan line driver circuit 852, when the clock signal (CLK) and the start pulse signal (SP) are input to the shift register 856, a selection signal is produced. The produced selection signal is buffered and amplified by the buffer 857, and the buffered and amplified signal is supplied to a corresponding scan line. Gates of transistors in pixels of one line are connected to the scan line. Further, since the transistors in the pixels of one line should be turned on at the same time in the operation, a buffer through which large current can flow is used as the buffer 857.

In a full-color display device, when video signals corresponding to R (red), G (green), and B (blue) are sequentially sampled and supplied to a corresponding signal line, the number of terminals for connecting the shift register 854 and the analog switch 855 corresponds to approximately ⅓ of the number of terminals for connecting the analog switch 855 and the signal line of the pixel portion 850. Accordingly, when the analog switch 855 and the pixel portion 850 are formed over the same substrate, the number of terminals used for connecting substrates which are separately formed can be suppressed compared to the case where the analog switch 855 and the pixel portion 850 are formed over different substrates. Thus, occurrence probability of defective connection can be suppressed, and thus yield can be improved.

Note that although the scan line driver circuit 852 in FIG. 35 includes the shift register 856 and the buffer 857, the present invention is not limited to this. The scan line driver circuit 852 may be formed using only the shift register 856.

Note that the structures of the signal line driver circuit and the scan line driver circuit are not limited to the structure shown in FIG. 35, which are merely one mode of the display device of the present invention.

Figure 36A:
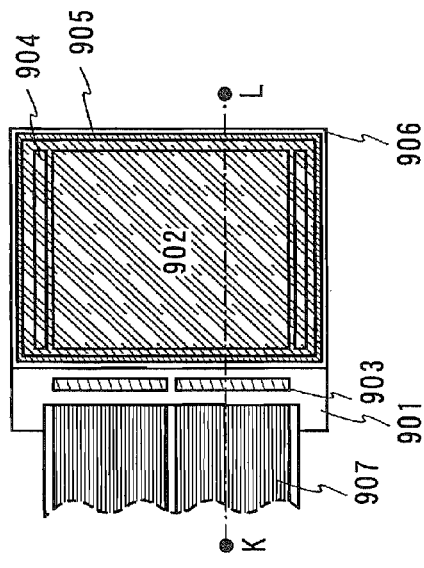
FIGS. 36A and 36B are a top view and a cross-sectional view illustrating a liquid crystal display panel according to an aspect of the present invention.
Figure 36B:
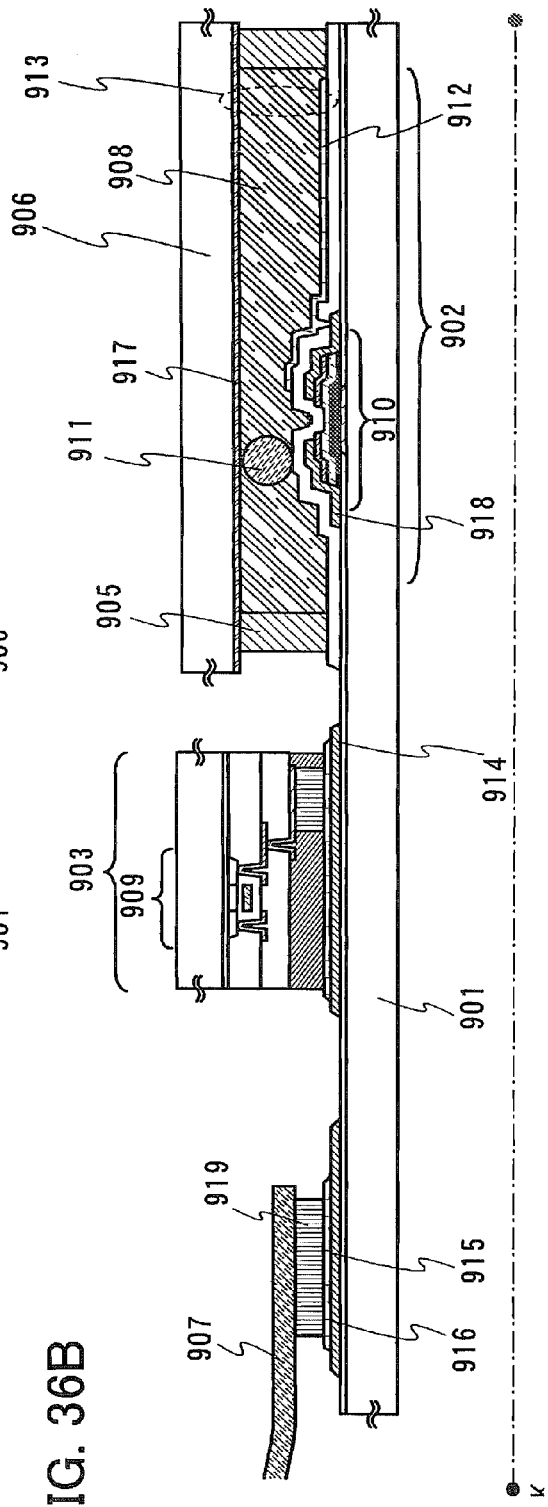
Figure 37A:
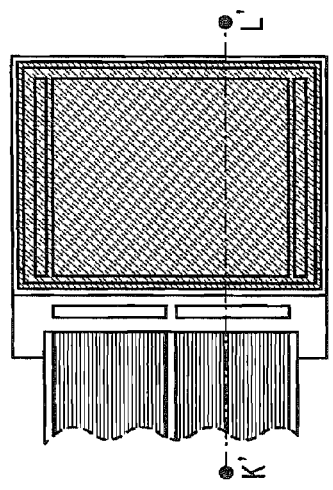
FIGS. 37A and 37B are a top view and a cross-sectional view illustrating a light-emitting display panel according to an aspect of the present invention.
Figure 37B:
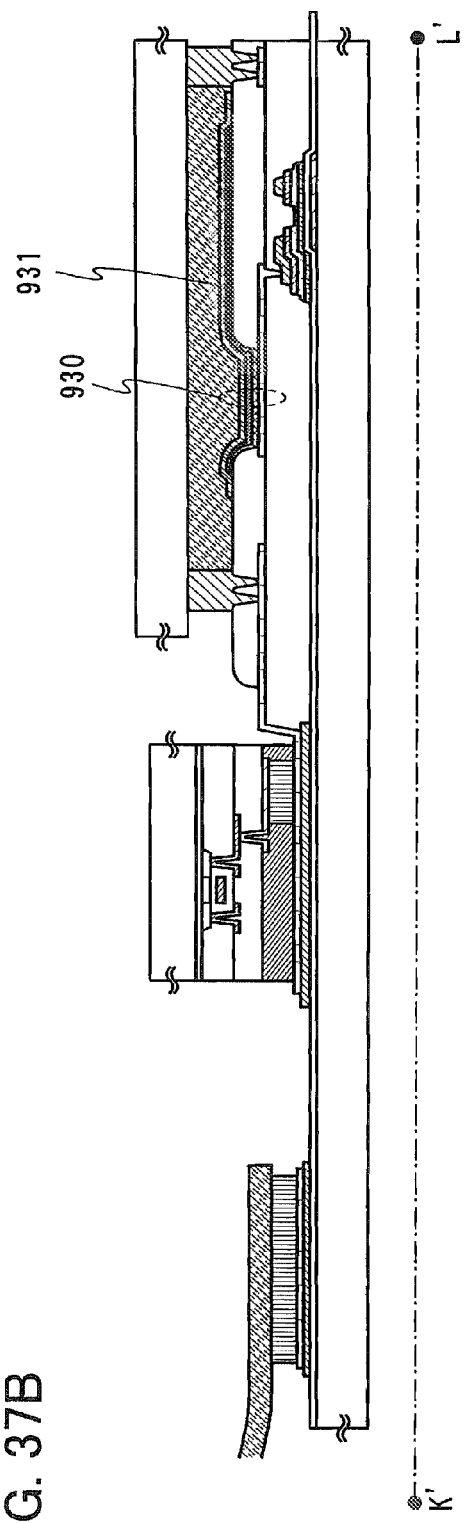

Next, appearance and cross sections of a liquid crystal display panel, which is one mode of the liquid crystal display device of the present invention, and a light-emitting panel are described with reference to FIGS. 36A and 36B and FIGS. 37A and 37B. FIG. 36A is a top view of a panel, in which a transistor 910 having a microcrystalline semiconductor layer and a liquid crystal element 913 which are formed over a first substrate 901 are sealed between the first substrate 901 and a second substrate 906 by a sealant 905. FIG. 36B is a cross-sectional view taken along the line K-L in FIG. 36A. FIGS. 37A and 37B illustrate a light-emitting device. Note that only portions which are different from those in FIGS. 36A and 36B are denoted by reference numerals in FIGS. 37A and 37B.

The sealant 905 is provided so as to surround a pixel portion 902 and a scan line driver circuit 904 which are provided over the first substrate 901. The second substrate 906 is provided over the pixel portion 902 and the scan line driver circuit 904. Thus, the pixel portion 902 and the scan line driver circuit 904 are sealed together with a liquid crystal layer 908 or a filler 931 by the first substrate 901, the sealant 905, and the second substrate 906. Further, a signal line driver circuit 903 is mounted on a region over the first substrate 901, which is different from the region surrounded by the sealant 905. Note that the signal line driver circuit 903 is formed with transistors having a polycrystalline semiconductor layer formed over a separately prepared substrate. Note that although an example in which the signal line driver circuit 903 including a transistor using a polycrystalline semiconductor layer is attached to the first substrate 901 is described in this embodiment mode, a signal line driver circuit may be formed using a transistor using a single crystalline semiconductor and attached to the first substrate 901. FIG. 36B illustrates a transistor 909 formed using a polycrystalline semiconductor layer, which is included in the signal line driver circuit 903.

The pixel portion 902 provided over the first substrate 901 includes a plurality of transistors, and in FIG. 36B, a thin film transistor 910 included in the pixel portion 902 is exemplified. The scan line driver circuit 904 also includes a plurality of thin film transistors, and in FIG. 36B, the transistor 909 included in the signal line driver circuit 903 is exemplified. In this embodiment mode, as for the light-emitting device, a case where the transistor 910 is a driving transistor is described, but the transistor 910 may be a current control transistor or an erasing transistor in the light-emitting device. The transistor 910 corresponds to a transistor using a microcrystalline semiconductor layer.

A pixel electrode 912 included in the liquid crystal element 913 is electrically connected to the transistor 910 via a wiring 918. Further, the wiring 918 is electrically connected to a lead wiring 914. A counter electrode 917 of the liquid crystal element 913 is formed on the second substrate 906. A portion where the pixel electrode 912, the counter electrode 917, and the liquid crystal layer 908 overlap with each other corresponds to the liquid crystal element 913.

In addition, a pixel electrode included in a light-emitting element 930 is electrically connected to a source electrode or a drain electrode of the transistor 910 through a wiring. In addition, in this embodiment mode, a common electrode of the light-emitting element 930 and a light-transmitting conductive material layer are electrically connected. Note that the structure of the light-emitting element 930 is not limited to the structure shown in this embodiment mode. The structure of the light-emitting element 930 can be changed as appropriate in accordance with a direction of light extracted from the light-emitting element 930, polarity of the transistor 910, or the like.

Note that as a material of each of the first substrate 901 and the second substrate 906, glass, metal (typically stainless steel), ceramics, plastics, or the like can be used. As plastics, a FRP (fiberglass-reinforced plastics) plate, a PVF (polyvinyl fluoride) film, a polyester film, an acrylic resin film or the like can be used. Alternatively, a sheet in which aluminum foil is interposed between PVF films or polyester films can be used.

A spacer 911 is a bead spacer and is provided for controlling a distance (a cell gap) between the pixel electrode 912 and the counter electrode 917. Note that a spacer obtained by selectively etching an insulating layer may be used. That is, a post spacer may be used.

A variety of signals (potentials) supplied to the pixel portion 902 and the scan line driver circuit 904, and the signal line driver circuit 903 which is formed separately are supplied from an FPC 907 through the lead wiring 914 and the lead wiring 915.

In this embodiment mode, a connection terminal 916 is formed using the same conductive layer as the pixel electrode 912 included in the liquid crystal element 913. Further, the lead wiring 914 and the lead wiring 915 are formed using the same conductive layer as the wiring 918.

The connection terminal 916 is electrically connected to a terminal included in the FPC 907 through an anisotropic conductive layer 919.

Note that although not illustrated, the liquid crystal display device shown in this embodiment mode includes alignment films and polarizing plates, and may also include a color filter, a light-shielding layer or the like.

Although the variety of signals (potentials) supplied to the scan line driver circuit 904, the pixel portion 902, and the signal line driver circuit 903 which is formed separately are supplied from the FPC 907 through the lead wiring 914 and the lead wiring 915.

In this embodiment mode, the connection terminal 916 is formed using the same conductive layer as the pixel electrode included in the light-emitting element 930. However, this is not a limiting example.

Note that the second substrate which is in a direction from which light from the light-emitting element 930 is extracted should have a light-transmitting property. In this case, a light-transmitting substrate such as a glass substrate, a plastic substrate, a polyester film, or an acrylic film is used.

As the filler 931, as well as an inert gas such as nitrogen or argon, an ultraviolet curable resin, a thermosetting resin, or the like can be used. For example, PVC (polyvinyl chloride), acrylic, polyimide, an epoxy resin, a silicone resin, PVB (polyvinyl butyral), or EVA (ethylene vinyl acetate) can be used. In this embodiment mode, for example, nitrogen may be used.

An optical film such as a polarizing plate, a circular polarizing plate (including an elliptical polarizing plate), a retardation plate (a λ/4 plate, a λ/2 plate), or a color filter may be provided as appropriate over a light-emitting surface of the light-emitting element. Further, an anti-reflection layer may be provided over a polarizing plate or a circularly polarizing plate.

This embodiment mode can be combined with any of the structures described in the other embodiment modes.
(Embodiment Mode 8)

Figure 38A:
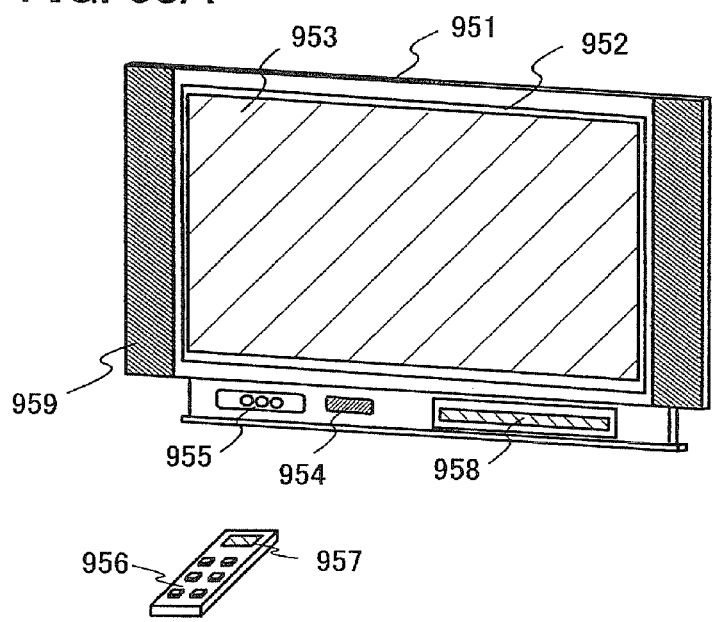
FIGS. 38A to 38C are perspective views of electronic devices using a light-emitting device according to an aspect of the present invention.
Figure 38B:
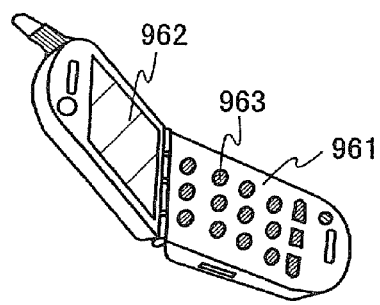
Figure 38C:
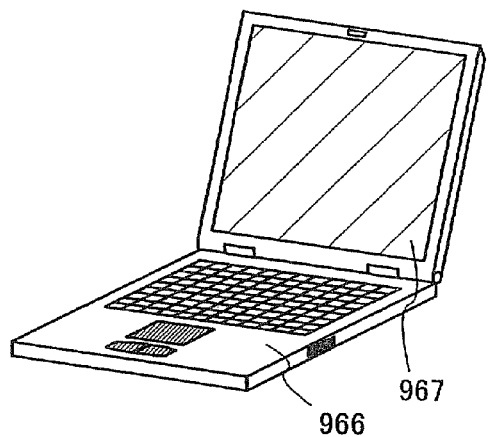

As described in the above embodiment modes, an active matrix display module can be manufactured according to the present invention. Note that a display panel provided with an FPC is called a display module. That is, the present invention can be applied to any of electronic devices in which such an active matrix liquid crystal module is incorporated in a display portion. Examples of such electronic devices are cameras such as video cameras and digital cameras, head-mounted displays (goggle-type displays), car navigation systems, projectors, car stereos, personal computers, portable information terminals (e.g., mobile computers, mobile phones, or electronic books), and the like. FIGS. 38A to 38C show examples of such electronic devices.

FIG. 38A illustrates a television set. A television set can be completed by incorporating a display module in a housing, as shown in FIG. 38A. A main screen 953 is formed using the display module, and a speaker portion 959, operation switches, and the like are provided as its accessory equipment.

As shown in FIG. 38A, a display panel 952 using a display element is incorporated in a housing 951. When a receiver 955 is used, including reception of general TV broadcast, communication of information can also be performed in one way or in two ways by connection to a wired or wireless communication network through a modem 954. The television set can be operated by switches incorporated in the housing or by a remote controller 956. A display portion 957 displaying information to be output may also be provided in this remote controller 956.

In addition, in the television set, a structure for displaying a channel, sound volume, or the like may be added by forming a subscreen 958 with a second display panel in addition to the main screen 953. In this structure, the main screen 953 may be formed with a liquid crystal display panel having a wide viewing angle, and the subscreen 958 may be formed with a liquid crystal display panel capable of displaying with low power consumption. In addition, when the subscreen 958 may be a liquid crystal display panel capable of flashing on and off, power consumption can be decreased. Further, power consumption can also reduced by using a light-emitting device for the subscreen.

Figure 39:
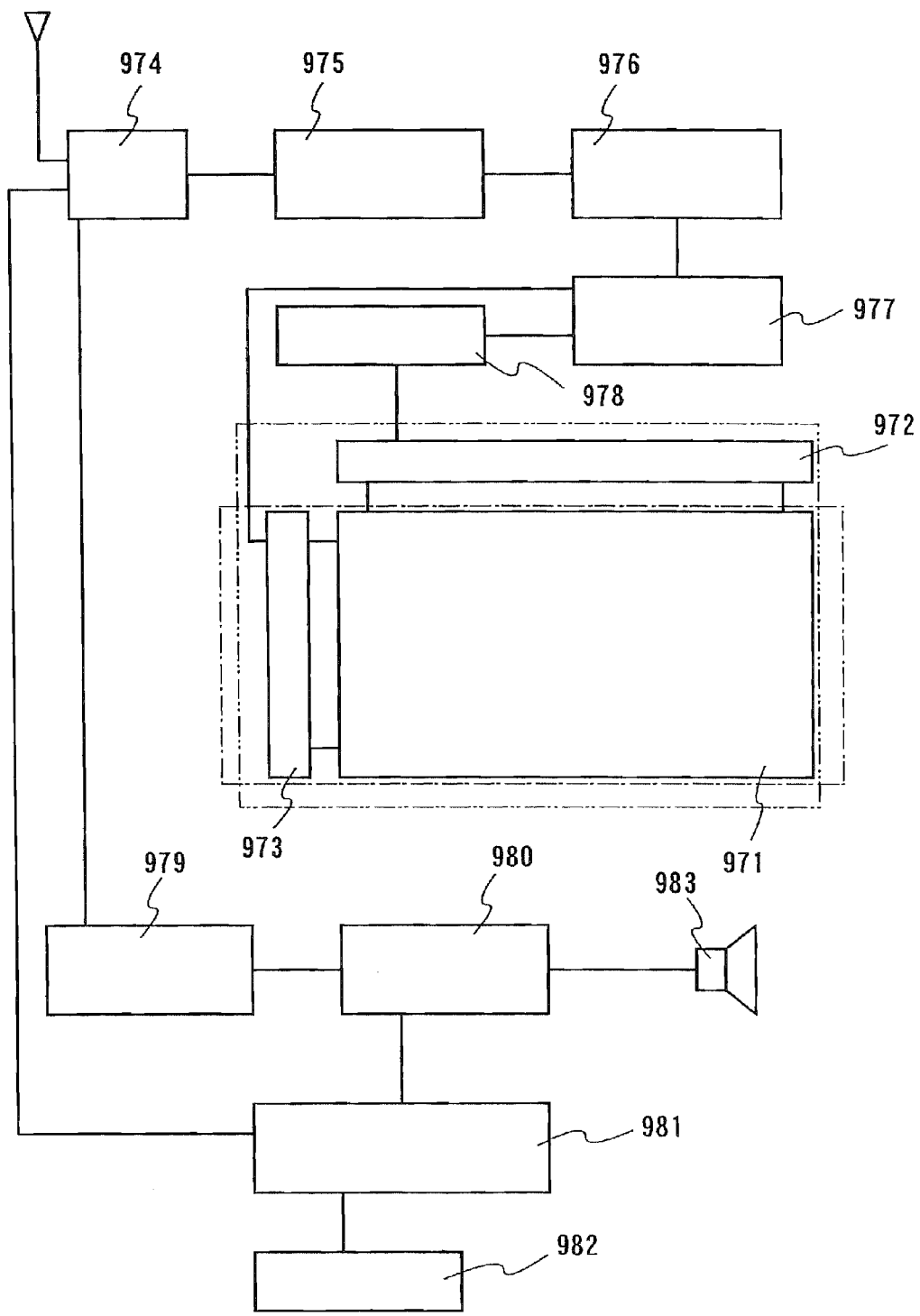
FIG. 39 illustrates an electronic-device using a light-emitting device according to an aspect of the present invention.

FIG. 39 is a block diagram showing a main structure of a television set which can be applied to the television set illustrated in FIG. 38A. A pixel portion 971 is formed over a display panel. A signal line driver circuit 972 and a scan line driver circuit 973 may be connected as described in any of the other embodiment modes.

As structures of other external circuits, a video signal amplifier circuit 975 amplifying a video signal among signals received by a tuner 974, a video signal processing circuit 976 converting signals output from the video signal amplifier circuit 975 into chrominance signals corresponding to respective colors of red, green, and blue, a control circuit 977 for converting the video signal into a signal which meets input specifications of a driver IC, and the like are provided on an input side of the video signal. The control circuit 977 outputs signals to both a scan line side and a signal line side. In the case of digital driving, a signal dividing circuit 978 may be provided on the signal line side and an input digital signal may be divided into m pieces to be supplied.

Among the signals received by the tuner 974, an audio signal is transmitted to an audio signal amplifier circuit 979, and output thereof is supplied to a speaker 983 through an audio signal processing circuit 980. A control circuit 981 receives control information on a receiving station (receiving frequency) or sound volume from an input portion 982 and transmits the signal to the tuner 974 or the audio signal processing circuit 980.

The present invention is applied to the television set described above, and thereby the television set can have a high contrast ratio, less unevenness in display, and low power consumption.

Needless to say, the present invention is not limited to the television set, and can be applied to various uses particularly as a large display medium such as an information display board at a train station, an airport, or the like, or an advertisement display board on the street, as well as a monitor of a personal computer. The present invention is applied to such a display medium, and thereby the display medium can have a high contrast ratio, less unevenness in display, and low power consumption.

FIG. 38B illustrates an example of a mobile phone. The mobile phone includes a main body 961, a display portion 962, an operation portion 963, and the like. The present invention is applied to the display portion 962, and thereby the mobile phone can have a high contrast ratio, less unevenness in display, and low power consumption.

FIG. 38C illustrates an example of a portable computer. The portable computer includes a main body 966, a display portion 967, and the like. The present invention is applied to the display portion 967, and thereby the portable computer can have a high contrast ratio, less unevenness in display, and low power consumption.

EXAMPLE 1

In Example 1, a method for manufacturing an inversely-staggered thin film transistor utilizing dry-etching as described in Embodiment Mode 1 is compared with a method for manufacturing an inversely-staggered thin film transistor not utilizing dry etching. The dry etching is conducted in a state that a semiconductor layer is exposed in an etched portion. The etched portion is obtained by etching an impurity region in a portion serving as a channel-forming region or a portion overlapping the channel-forming region.

Figure 40A:
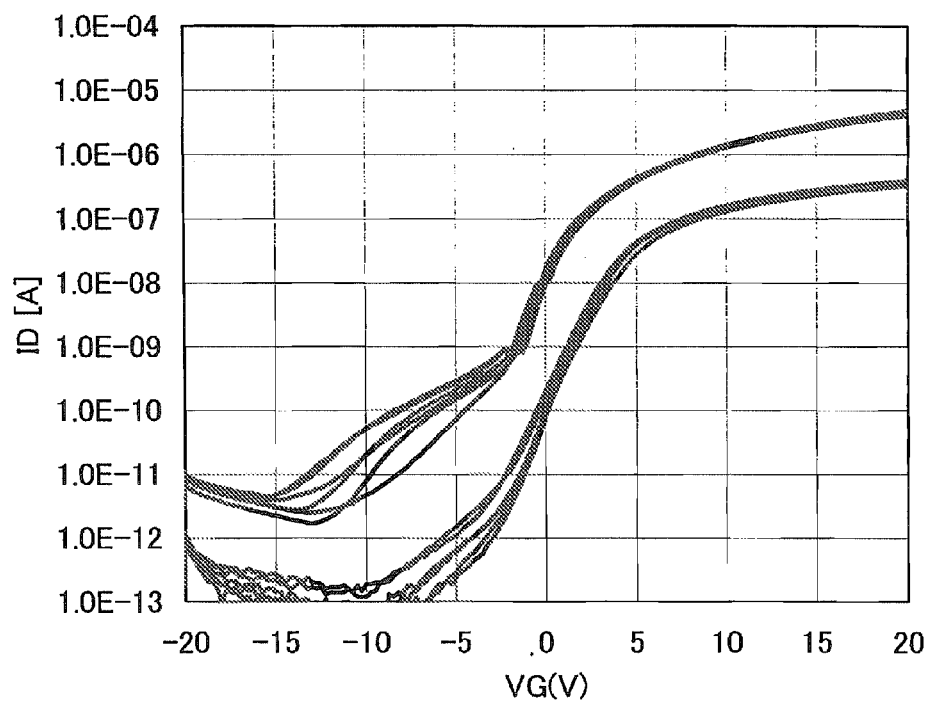
FIGS. 40A and 40B are graph showing electric characteristics of thin film transistors formed according to an aspect of the present invention.
Figure 40B:
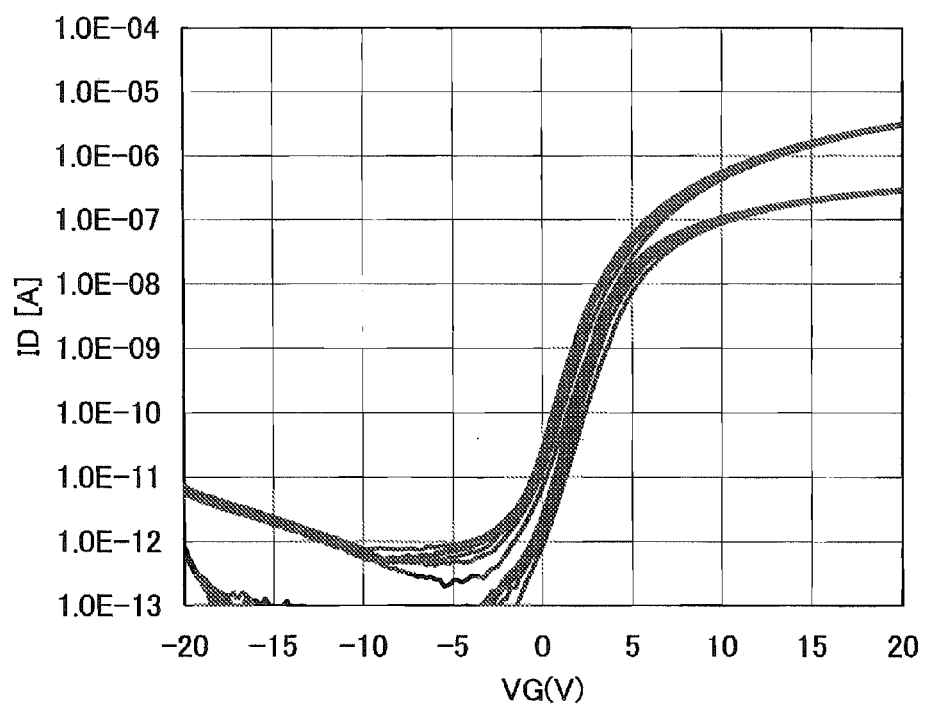

FIGS. 40A and 40B are graphs showing $V_g$-$I_d$ curves of thin film transistors. FIG. 40A is a graph showing the $V_g$-$I_d$ curves of thin film transistors to which the present invention is not applied. FIG. 40B is a graph showing the $V_g$-$I_d$ curves of thin film transistors to which the present invention is applied, i.e., manufactured by dry etching. Note that drain voltages (a potential of a drain with respect to a potential of a source) were 1 V and 14 V. The graphs indicate that off current of the thin film transistors manufactured according to the present invention is smaller and variation in electric characteristics is smaller.

In FIG. 40B, the $V_g$-$I_d$ curves at drain voltages of 1 V and 14 V do not deviate from each other, and variation in drain currents due to the change in the drain voltages is small. In other words, if the drain voltage is varied, variation in drain current can be made small.

As described above, according to the present invention, a thin film transistor with small off current, excellent electric characteristics and small variation in electric characteristics can be manufactured.

This application is based on Japanese Patent Application serial no. 2007-228325 filed with Japan Patent Office on Sep. 3, 2007, the entire contents of which are hereby incorporated by reference.

What is claimed is:

1. A method for manufacturing a thin film transistor, comprising the steps of:
    forming a gate insulating layer over a gate electrode layer;
    forming a semiconductor layer over the gate insulating layer;
    forming an impurity semiconductor layer over the semiconductor layer;
    forming a conductive layer over the impurity semiconductor layer;
    etching portions of the semiconductor layer, the impurity semiconductor layer, and the conductive layer by using a first resist mask having a depression portion to form a patterned semiconductor layer overlapping at least a part of the gate electrode layer wherein the first resist mask is simultaneously etched so that the depression portion reaches the conductive layer, thereby forming a second resist mask;
    etching the conductive layer to form source and drain electrode layers by using the second resist mask over the conductive layer;
    etching the impurity semiconductor layer of the patterned semiconductor layer, to expose a part of the semiconductor layer so that a back channel portion in the thin film transistor is formed;
    removing the second resist mask after etching the impurity semiconductor layer of the patterned semiconductor layer; and
    performing a plasma treatment on a surface of the back channel portion to remove contamination materials from the surface of the back channel portion, after removing the second resist mask.

2. The method for manufacturing the thin film transistor according to claim 1, wherein the step of performing the plasma treatment is conducted with non-bias applied.

3. The method for manufacturing the thin film transistor according to claim 1, wherein a part of the back channel portion is etched during the step of performing the plasma treatment.

4. The method for manufacturing the thin film transistor according to claim 1,
    wherein the semiconductor layer includes a stacked layer of a microcrystalline semiconductor layer and an amorphous semiconductor layer, and
    wherein the amorphous semiconductor layer is provided on a side of the semiconductor layer which is in contact with the impurity semiconductor layer.

5. The method for manufacturing the thin film transistor according to claim 1, wherein the semiconductor layer comprises silicon.

6. A method for manufacturing a display device, comprising the step of:
    forming a pixel electrode layer that is connected to at least one of the source and drain electrode layers of the thin film transistor according to claim 1,
    wherein the pixel electrode layer is formed using a conductive material having a light-transmitting property.

7. The method for manufacturing the thin film transistor according to claim 1, wherein the step of performing the plasma treatment is conducted using a $Cl_2$ gas.

8. The method for manufacturing the thin film transistor according to claim 1, wherein the step of performing the plasma treatment is conducted using pulsed discharge.

9. The method for manufacturing the thin film transistor according to claim 1, wherein the semiconductor layer is microcrystalline.

10. The method for manufacturing the thin film transistor according to claim 1, wherein the patterned semiconductor layer has a tapered side surface, with a taper angle of from 40° to 80°.

11. A method for manufacturing a thin film transistor, comprising the steps of:
    forming a gate insulating layer over a gate electrode layer;
    forming a semiconductor layer over the gate insulating layer;
    forming a conductive layer over the semiconductor layer;
    etching portions of the semiconductor layer and the conductive layer by using a first resist mask having a depression portion to form a patterned semiconductor layer overlapping at least a part of the gate electrode layer wherein the first resist mask is simultaneously etched so that the depression portion reaches the conductive layer, thereby forming a second resist mask;
    etching the conductive layer to form source and drain electrode layers by using the second resist mask over the conductive layer;
    removing the second resist mask; and
    performing a plasma treatment on a surface of a back channel portion to remove contamination materials from the surface of the back channel portion, after removing the second resist mask.

12. The method for manufacturing the thin film transistor according to claim 11, wherein a part of the back channel portion is etched during the step of performing the plasma treatment.

13. The method for manufacturing the thin film transistor according to claim 11, wherein the semiconductor layer comprises silicon.

14. The method for manufacturing the thin film transistor according to claim 11, wherein the semiconductor layer is microcrystalline.

15. The method for manufacturing the thin film transistor according to claim 11, wherein the patterned semiconductor layer has a tapered side surface, with a taper angle of from 40° to 80°.

16. The method for manufacturing the thin film transistor according to claim 11, wherein the step of performing the plasma treatment is conducted with non-bias applied.

17. The method for manufacturing the thin film transistor according to claim 11, wherein the step of performing the plasma treatment is conducted using a $Cl_2$ gas.

18. The method for manufacturing the thin film transistor according to claim 11, wherein the step of performing the plasma treatment is conducted using pulsed discharge.

19. The method for manufacturing the thin film transistor according to claim 11,
    wherein the semiconductor layer includes a stacked layer of a microcrystalline semiconductor layer and an amorphous semiconductor layer.

20. The method for manufacturing the thin film transistor according to claim 11, wherein in the step of removing the second resist mask, the back channel portion of the patterned semiconductor layer is exposed between the source and drain electrode layers.

* * * * *